United States Patent
Yamazaki

(10) Patent No.: US 9,306,077 B2
(45) Date of Patent: Apr. 5, 2016

(54) METHOD FOR PROCESSING OXIDE SEMICONDUCTOR LAYER

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/728,117

(22) Filed: Jun. 2, 2015

(65) Prior Publication Data

US 2015/0263177 A1 Sep. 17, 2015

Related U.S. Application Data

(63) Continuation of application No. 14/161,882, filed on Jan. 23, 2014, now Pat. No. 9,105,658.

(30) Foreign Application Priority Data

Jan. 30, 2013 (JP) .................................. 2013-016245
Jun. 19, 2013 (JP) .................................. 2013-128584

(51) Int. Cl.
*H01L 29/24* (2006.01)
*H01L 29/786* (2006.01)
(Continued)

(52) U.S. Cl.
CPC ........ *H01L 29/7869* (2013.01); *H01L 21/0259* (2013.01); *H01L 21/02565* (2013.01);
(Continued)

(58) Field of Classification Search
CPC ......... H01L 21/00; H01L 21/84; H01L 27/12; H01L 27/14601; H01L 27/14658; H01L 29/12; H01L 29/417; H01L 29/423; H01L 29/49; H01L 31/032; H01L 31/085; H01L 31/09; H01L 31/118
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Kyoung Lee
(74) *Attorney, Agent, or Firm* — Robinson Intellectual Property Law Office; Eric J. Robinson

(57) ABSTRACT

A method for processing an oxide semiconductor containing indium, gallium, and zinc is provided. In the method, the oxide semiconductor layer comprises a plurality of excess oxygen, a first oxygen vacancy that is close to first indium and captures first hydrogen, and a second oxygen vacancy that is close to second indium and captures second hydrogen, the first hydrogen captured by the first oxygen vacancy is bonded to one of a plurality of excess oxygen to so that a hydroxyl is formed; the hydroxyl is bonded to the second hydrogen captured by the second oxygen vacancy to release as water; and then, the first oxygen vacancy captures one of excess oxygen and the second oxygen vacancy captures one of excess oxygen.

20 Claims, 38 Drawing Sheets

(51) Int. Cl.
*H01L 29/66* (2006.01)
*H01L 21/02* (2006.01)
*H01L 29/10* (2006.01)

(52) U.S. Cl.
CPC ............ *H01L29/1033* (2013.01); *H01L 29/24* (2013.01); *H01L 29/66742* (2013.01); *H01L 29/66969* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 8,237,166 | B2 | 8/2012 | Kumomi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1* | 5/2006 | Yabuta et al. ............... 438/151 |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0020753 | A1 | 1/2009 | Jeong et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0051938 | A1 | 3/2010 | Hayashi et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2012/0231580 | A1 | 9/2012 | Yamazaki et al. |
| 2013/0187150 | A1 | 7/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar

(56) References Cited

OTHER PUBLICATIONS

Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In-Ga-Zn-O TFTS", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3-Ga2ZnO4-ZnO system at 1350° C", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m=3, 4, and 5), InGaO3(ZnO)3, and GaO3(ZnO)m (m=7, 8, 9, and 16) in the In2O3-ZnGa2O4-ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTS", IDW '09 : Proceedings of the 16th International Display Workshops, 2009, pp. 689-692.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZNO TFT", IMID '07 Digest, 2007, pp. 1249-1252.
Godo.H at al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In-Ga-Zn-Oxide TFTS With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YbFe2O4, andYb2Fe3O7 Types of Structures for Compounds in the In2O3 and SC2O3-A2O3-BO Systems [A; Fe, Ga, or Al; B: Mg, Mn, Fe, Ni, Cu, or Zn] at Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

FIG. 23A
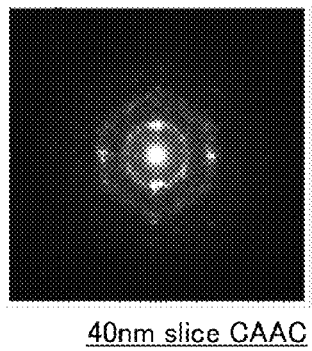
40nm slice CAAC
FIG. 23B
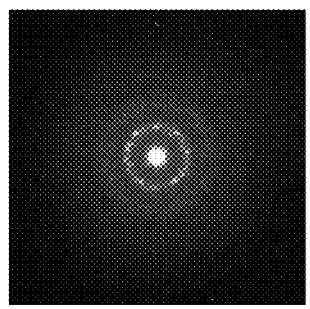
40nm slice nc
FIG. 23C1
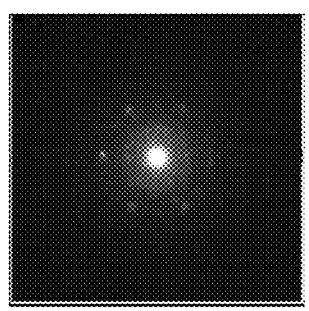
5-10nm slice nc
measurement position 1
FIG. 23C2
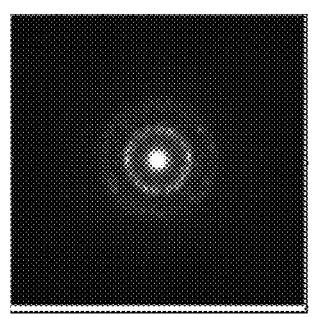
5-10nm slice nc
measurement position 2

FIG. 28A1
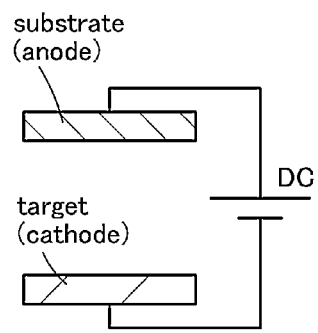
FIG. 28A2
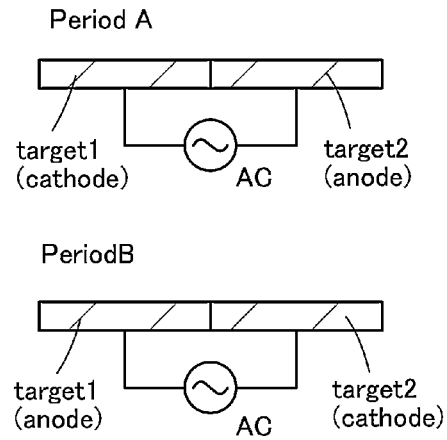
FIG. 28B1
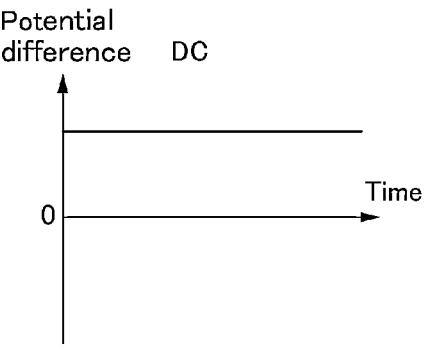
FIG. 28B2
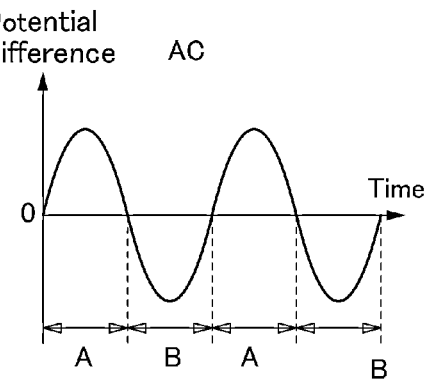
FIG. 28C1
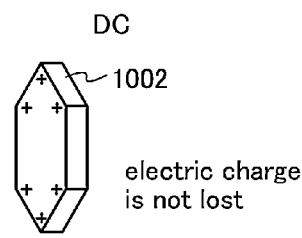
FIG. 28C2
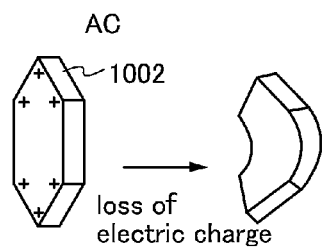

without substrate heating

METHOD FOR PROCESSING OXIDE SEMICONDUCTOR LAYER

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor layer, a semiconductor device, a display device, a liquid crystal display device, or a light-emitting device. In addition, the present invention relates to a method for manufacturing a semiconductor layer, a semiconductor device, a display device, a liquid crystal display device, or a light-emitting device. Alternatively, the present invention relates to a driving method of a semiconductor device, a display device, a liquid crystal display device, or a light-emitting device. In particular, the present invention relates to a semiconductor device, a display device, a light-emitting device each including a transistor, or a driving method thereof, for example. Further, the present invention relates to, for example, an electronic device including the semiconductor device, the display device, or the light-emitting device.

Note that in this specification, a semiconductor device refers to any device that can function by utilizing semiconductor characteristics, and an electro-optical device, a semiconductor circuit, an electronic device, and the like are all included in the category of the semiconductor device.

2. Description of the Related Art

A technique for forming a transistor by using a semiconductor layer formed over a substrate having an insulating surface has attracted attention. The transistor is applied to a wide range of semiconductor devices such as an integrated circuit and a display device. A silicon layer is known as a semiconductor layer applicable to a transistor.

Whether an amorphous silicon layer or a polycrystalline silicon layer is used as a semiconductor layer in a transistor depends on the purpose. For example, in the case of a transistor included in a large display device, an amorphous silicon layer, which can be formed using an established technique for forming a film over a large substrate, is preferably used. On the other hand, in the case of a transistor included in a high-performance display device where driver circuits are formed over the same substrate, a polycrystalline silicon layer, which can form a transistor having a high field-effect mobility, is preferably used. As a method for forming a polycrystalline silicon layer, high-temperature heat treatment or laser light treatment which is performed on an amorphous silicon layer has been known.

In recent years, an oxide semiconductor layer has attracted attention. For example, a transistor which includes an amorphous oxide semiconductor layer containing indium, gallium, and zinc is disclosed (see Patent Document 1).

An oxide semiconductor layer can be formed by a sputtering method or the like, and thus can be used for a channel formation region of a transistor in a large display device. A transistor including an oxide semiconductor layer has a high field-effect mobility; therefore, a high-performance display device where driver circuits are formed over the same substrate can be formed. Moreover, there is an advantage that capital investment can be reduced because part of production equipment for a transistor including an amorphous silicon layer can be improved to be used for a transistor including an oxide semiconductor layer.

Note that homologous compounds represented by $InMO_3(ZnO)_m$ (M is Fe, Ga, or Al and m is a natural number) are known (see Non-Patent Document 1). Among homologous compounds represented by $InMO_3(ZnO)_m$, a crystal where M is gallium (Ga) is sometimes referred to as "Kimizuka crystal" named after Dr. Noboru Kimizuka who succeeded in synthesizing the crystal for the first time in the world.

REFERENCE

Patent Document 1: Japanese Published Patent Application No. 2006-165528

Non-Patent Document 1: N. Kimizuka, M. Isobe, and M. Nakamura, "Syntheses and Single-Crystal Data of Homologous Compounds, $In_2O_3$ $(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178

SUMMARY OF THE INVENTION

An object is to provide an oxide semiconductor layer with a low density of defect states. Another object is to provide a semiconductor device including the oxide semiconductor layer. Another object is to provide a manufacturing method of a semiconductor device having an oxide semiconductor layer with a low density of defect states. An object is to provide a method for processing an oxide semiconductor layer.

Another object of the present invention is to provide a highly reliable semiconductor device or the like. Another object is to provide a transistor or the like having stable electric characteristics. Another object is to provide a transistor or the like having low off-state current. Another object is to provide a transistor or the like having high field-effect mobility. Another object is to provide a transistor or the like with high yield. Another object is to provide a semiconductor device or the like including the transistor or the like. Another object is to provide a novel semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is, for example, a processing method for lowering a defect density of an oxide semiconductor layer by excess oxygen.

One embodiment of the present invention is, for example, an oxide semiconductor layer with a low density of defects.

One embodiment of the present invention is, for example, a method for manufacturing a semiconductor device having an oxide semiconductor layer with a density of defects reduced by excess oxygen.

In addition, one embodiment of the present invention is, for example, a semiconductor device having an oxide semiconductor layer with a low density of defects.

Excess oxygen refers to oxygen in excess of the stoichiometric composition, for example. Alternatively, excess oxygen refers to oxygen released by heating, for example. Excess oxygen can move inside a film or a layer. Excess oxygen moves between atoms in a film or a layer or excess oxygen replaces oxygen that is a constituent of a film or a layer and moves like a billiard ball. An insulating film having excess oxygen means an insulating film from which oxygen is released by heat treatment, for example.

One embodiment of the present invention is a method for processing an oxide semiconductor layer containing indium, gallium, and zinc. The method includes the steps of: wherein the oxide semiconductor layer comprises a first oxygen vacancy that is close to first indium and captures first hydrogen, and a second oxygen vacancy that is close to second indium and captures second hydrogen, and further a plurality of excess oxygen, bonding one of the plurality of excess oxygen to the first hydrogen captured by the first oxygen vacancy so that a hydroxyl is formed; bonding the hydroxyl to the second hydrogen captured by the second oxygen vacancy to release as water; bonding one of the plurality of excess oxygen to the first indium and bonding one of the plurality of excess oxygen to the second indium.

One embodiment of the present invention is a method for processing an oxide semiconductor layer containing indium, gallium, and zinc. The method includes the steps of: wherein an insulating film is formed in the vicinity of the oxide semiconductor layer and the insulating film comprises a plurality of excess oxygen, and wherein the oxide semiconductor layer comprises a first oxygen vacancy that is close to first indium and captures first hydrogen, and a second oxygen vacancy that is close to second indium and captures second hydrogen, moving the plurality of excess oxygen to the oxide semiconductor layer from the insulating film; bonding one of the plurality of excess oxygen to the first hydrogen captured by the first oxygen vacancy so that a hydroxyl is formed; bonding the hydroxyl to the second hydrogen captured by the second oxygen vacancy to release as water; and bonding one of the plurality of excess oxygen to the first indium and bonding one of the plurality of excess oxygen to the second indium.

An oxide semiconductor layer having a low density of defects can be provided. Alternatively, a semiconductor device having the oxide semiconductor layer can be provided. Alternatively, a method for manufacturing the semiconductor device having the oxide semiconductor layer can be provided. Alternatively, a method for processing an oxide semiconductor layer can be provided.

Alternatively, a highly reliable semiconductor device or the like can be provided. Alternatively, a transistor or the like having stable electric characteristics can be provided. Alternatively, a transistor with low off-state current can be provided. Alternatively, a transistor with low off-state current can be provided. Alternatively, a transistor or the like having high field-effect mobility can be provided. Alternatively, a transistor or the like with high yield can be provided. Alternatively, a semiconductor device or the like including the transistor or the like can be provided. Alternatively, a novel semiconductor device or the like can be provided.

BRIEF DESCRIPTION OF THE DRAWINGS

FIGS. 23A, 23B, 23C1, and 23C2 are nanobeam electron diffraction patterns of oxide semiconductors.

FIGS. 28A1, 28A2, 28B1, 28B2, 28C1, and 28C2 are diagrams illustrating plasma discharge in a sputtering method using a DC source and an AC source.

DETAILED DESCRIPTION OF THE INVENTION

Figure 1:
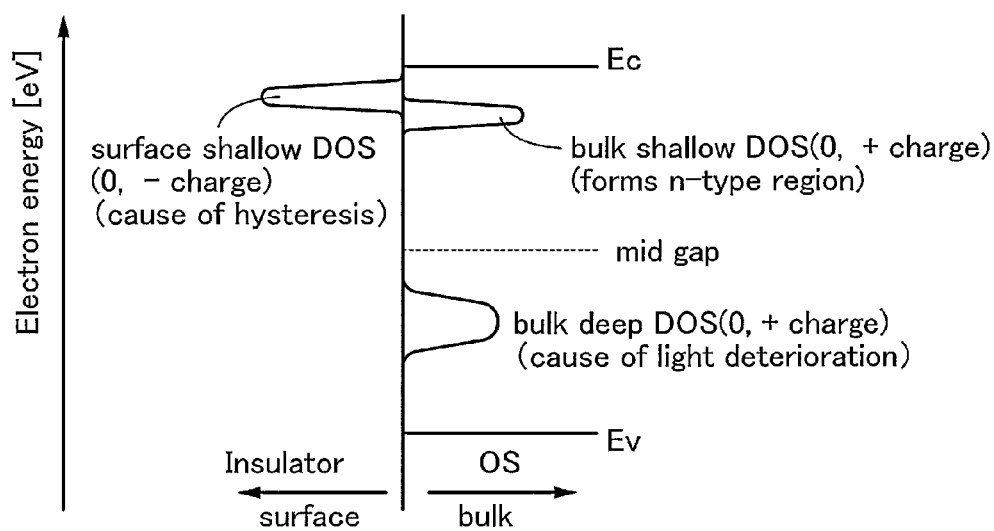
FIG. 1 illustrates a band structure of DOS inside an oxide semiconductor layer and in the vicinity of the interface of the oxide semiconductor layer.

Hereinafter, embodiments of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that what is described (or part thereof) in one embodiment can be applied to, combined with, or exchanged with another content in the same embodiment.

Note that the size, the thickness of layers, or regions in diagrams is sometimes exaggerated for simplicity. Therefore, embodiments of the present invention are not limited to such a scale.

Note that drawings are schematic views of ideal examples, and the embodiments of the present invention are not limited to the shape or the value illustrated in the drawings. For example, the following can be included: variation in shape due to a manufacturing technique; variation in shape due to an error; variation in signal, voltage, or current due to noise; variation in signal, voltage, or current due to a difference in timing; or the like.

A voltage usually refers to a potential difference between a given potential and a reference potential (e.g., a source potential or a ground potential (GND)). A voltage can be referred to as a potential and vice versa.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. In addition, the ordinal numbers in this specification do not denote particular names which specify the present invention.

In this specification, for example, when the shape of an object is described with use of a term such as "diameter", "grain size (diameter)", "dimension", "size", or "width", the term can be regarded as the length of one side of a minimal cube where the object fits, or an equivalent circle diameter of a cross section of the object. The term "equivalent circle diameter of a cross section of the object" refers to the diameter of a perfect circle having the same area as that of the cross section of the object.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

Note that an impurity in a semiconductor layer refers to, for example, elements other than the main components of a semiconductor layer. For example, an element with a concentration of lower than 0.1 atomic % is an impurity. When an impurity is contained, the density of states (DOS) in a semiconductor layer may be increased, the carrier mobility may be decreased, or the crystallinity may be decreased, for example. When the semiconductor layer is an oxide semiconductor layer, examples of an impurity which changes the characteristics of the semiconductor layer include Group 1 elements, Group 2 elements, Group 14 elements, Group 15 elements, and transition metals other than the main components; specifically, there are hydrogen (including water), lithium, sodium, silicon, boron, phosphorus, carbon, and nitrogen, for example. When the semiconductor layer is an oxide semiconductor layer, oxygen vacancies may be formed by entry of impurities. Further, when the semiconductor layer is a silicon layer, examples of an impurity which changes the characteristics of the semiconductor layer include oxygen, Group 1 elements except hydrogen, Group 2 elements, Group 13 elements, and Group 15 elements.

<Model of DOS in Oxide Semiconductor Layer and a DOS-Causing Element>

When a density of states (DOS) is present inside an oxide semiconductor layer and in the vicinity of the interface between the oxide semiconductor layer and the outside, the DOS causes deterioration of a transistor including the oxide semiconductor layer. The DOS inside an oxide semiconductor layer and in the vicinity of the interface between the oxide semiconductor layer and the outside can be explained in terms of positions of and bonding between oxygen (O), oxygen vacancy (Vo), and hydrogen (H). A concept of our model is described for understanding of characteristics.

A conclusion is that it is important to reduce DOS inside an oxide semiconductor layer and in the vicinity of the interface (to highly purify the oxide semiconductor layer so as to be intrinsic) in order that a transistor can have stable electric characteristics. In order to reduce the DOS, oxygen vacancies and hydrogen should be reduced. It is explained below with a model why oxygen vacancies and hydrogen should be reduced, concerning DOS inside an oxide semiconductor layer and in the vicinity of the interface.

FIG. 1 illustrates a band structure of DOS inside an oxide semiconductor layer and in the vicinity of the interface of the oxide semiconductor layer. The case where the oxide semiconductor layer is an oxide semiconductor layer containing indium, gallium, and zinc is described below.

There are two types of DOS, DOS at a shallow level (shallow level DOS) and DOS at a deep level (deep level DOS). Note that in this specification, the shallow level DOS refers to DOS between energy at the bottom of the conduction band (Ec) and the mid gap. Thus, for example, the shallow level DOS is located closer to energy at the bottom of the conduction band. Note that in this specification, the deep level DOS refers to DOS between energy at the top of the valence band (Ev) and the mid gap. Thus, for example, the deep level DOS is located closer to the mid gap than to energy at the top of the valence band.

There are two types of shallow level DOS. One is DOS in the vicinity of a surface of an oxide semiconductor layer (at the interface with an insulating film (insulator) or in the vicinity of the interface with the insulating film), that is, surface shallow DOS. The other is DOS inside the oxide semiconductor layer, that is, bulk shallow DOS. Furthermore, as a type of the deep level DOS, there is DOS inside the oxide semiconductor layer, that is, bulk deep DOS.

These types of DOS are likely to act as described below. The surface shallow DOS in the vicinity of the surface of an oxide semiconductor layer is located at a shallow level from the bottom of the conduction band, and thus capture and loss of an electric charge are likely to occur easily. The bulk shallow DOS inside the oxide semiconductor layer is located at a deep level from the bottom of the conduction band as compared to the surface shallow DOS in the vicinity of the surface of the oxide semiconductor layer, and thus loss of an electric charge does not easily occur.

An element causing a DOS in an oxide semiconductor layer is described below.

For example, when a silicon oxide film is formed over an oxide semiconductor layer, indium contained in the oxide semiconductor layer is taken into the silicon oxide film and replaces silicon to form a shallow level DOS.

For example, in the interface between the oxide semiconductor layer and the silicon oxide film, a bond between oxygen and indium contained in the oxide semiconductor layer is broken and a bond between the oxygen and silicon is generated. This is because the bonding energy between silicon and oxygen is higher than the bonding energy between indium and oxygen, and the valence of silicon (tetravalence) is larger than the valence of indium (trivalence). Oxygen contained in the oxide semiconductor layer is captured by silicon, so that a site of oxygen that has been bonded to indium becomes an oxygen vacancy. In addition, this phenomenon occurs similarly when silicon is contained inside the oxide semiconductor layer, as well as in the surface. Such an oxygen vacancy forms a deep level DOS.

Another cause as well as silicon can break the bonding between indium and oxygen. For example, in an oxide semiconductor layer containing indium, gallium, and zinc, the bonding between indium and oxygen is weaker and cut more easily than the bonding between oxygen and gallium or zinc. For this reason, the bonding between indium and oxygen is broken by plasma damages or damages due to sputtered particles, so that an oxygen vacancy can be produced. The oxygen vacancy forms a deep level DOS. The deep level DOS can capture a hole and thus serve as a hole trap (hole trapping center). This means that the oxygen vacancy forms a bulk deep DOS inside the oxide semiconductor layer.

The deep level DOS formed by such oxygen vacancies is one of causes of formation of the surface shallow DOS in the vicinity of the surface of an oxide semiconductor layer or the bulk shallow DOS inside an oxide semiconductor layer because of hydrogen, as described below.

Such oxygen vacancies form DOS, and thus are an instability factor to the oxide semiconductor layer. In addition, an oxygen vacancy inside the oxide semiconductor layer captures hydrogen to be metastable. In other words, when an oxygen vacancy that is in the deep level DOS and serves as a hole trap capable of capturing a hole captures hydrogen, a shallow level DOS is formed. As a result, the shallow level DOS can serve as an electron trap that can capture an electron or serve as a generator of an electron. In this manner, an oxygen vacancy captures hydrogen. However, an oxygen vacancy can be positively (neutrally or positively) charged or negatively (neutrally or negatively) charged, depending on a location of hydrogen in the oxide semiconductor layer. Thus, hydrogen might give an adverse effect on a transistor including the oxide semiconductor layer.

Figure 2:
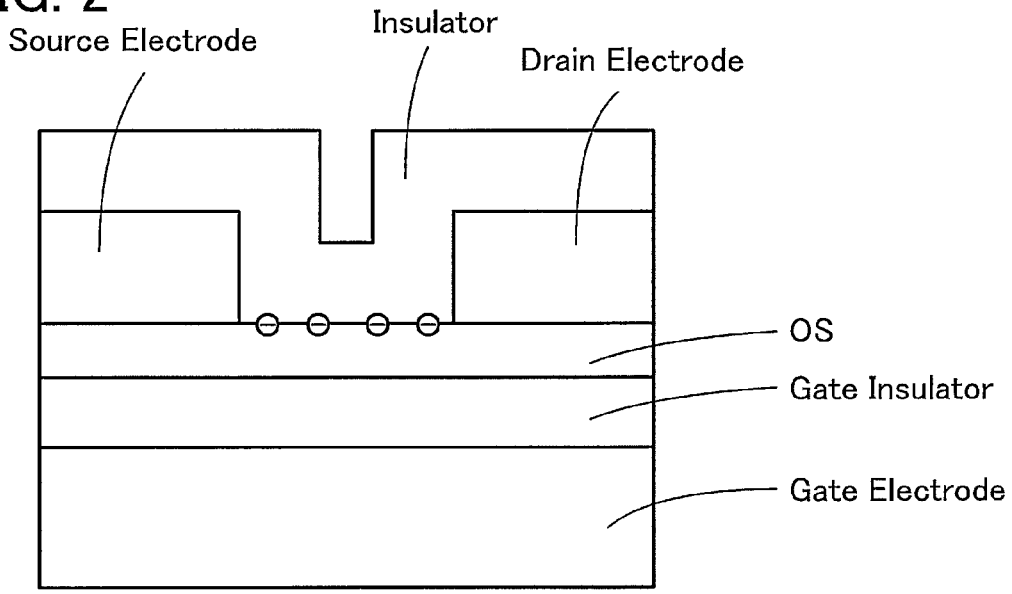
FIG. 2 is a schematic cross-sectional view of a transistor including an oxide semiconductor layer.

FIG. 2 is a schematic cross-sectional view of an example of a bottom-gate and top-contact transistor. An oxide semiconductor layer (OS) has a surface shallow DOS in the vicinity of the interface with an insulating film. An electron is captured in the surface shallow DOS and the DOS is negatively charged. Thus, the surface shallow DOS varies the threshold voltage of the transistor.

Therefore, it is important to reduce the density of oxygen vacancies so that such defects do not give an adverse effect on the transistor. The density of oxygen vacancies in the oxide semiconductor layer can be reduced in such a manner that excess oxygen is supplied to the oxide semiconductor layer, that is, oxygen vacancies are filled with excess oxygen. In other words, the oxygen vacancies become stable by receiving excess oxygen. For example, when excess oxygen is included in the oxide semiconductor layer or an insulating film provided near the interface with the oxide semiconductor layer, the excess oxygen fills oxygen vacancies in the oxide semiconductor layer, thereby effectively eliminating or reducing oxygen vacancies in the oxide semiconductor layer.

Excess oxygen refers to oxygen in excess of the stoichiometric composition, for example. Alternatively, excess oxygen refers to oxygen released by heating, for example. Excess oxygen can move inside a film or a layer. The movement of excess oxygen occurs when excess oxygen moves between atoms in a film or a layer or when excess oxygen replaces oxygen that is a constituent of a film or a layer and moves like a billiard ball. In the oxide semiconductor layer, an oxygen vacancy may move by capturing adjacent oxygen atom.

As described above, the oxygen vacancy may become a metastable state or a stable state by hydrogen or oxygen. As the concentration of hydrogen in the oxide semiconductor layer is higher, more oxygen vacancies capture hydrogen. In addition, when hydrogen exists in an oxygen vacancy and excess oxygen is supplied, the excess oxygen works to remove hydrogen from the oxygen vacancy first. Thus, excess oxygen fills the oxygen vacancy after removing hydrogen. Accordingly, when the concentration of hydrogen contained in the oxide semiconductor layer is high, the number of the oxygen vacancies reduced by excess oxygen is small. On the other hand, when the concentration of hydrogen contained in the oxide semiconductor layer is low, less hydrogen is captured by oxygen vacancies. Therefore, by supplying excess oxygen, the density of oxygen vacancies can be greatly reduced.

As described above, an oxygen vacancy captures hydrogen and can be positively (neutrally or positively) charged or negatively (neutrally or negatively) charged, depending on the way how hydrogen is captured. Here, the bulk shallow DOS inside an oxide semiconductor layer and the surface shallow DOS in the vicinity of the surface are considered. The fact that these types of shallow level DOS are charged neutrally or negatively, or neutrally or positively can be understood in consideration of only relative positions of hydrogen (a hydrogen bond), an oxygen vacancy, and oxygen. For example, inside the oxide semiconductor layer, hydrogen is trapped by an oxygen vacancy to form VoH, and it is charged neutrally or positively. In other words, $H^+ + e^-$ form a bulk shallow DOS inside the oxide semiconductor layer to form an n-type region in the oxide semiconductor layer.

Hydrogen can be charged neutrally or negatively, as well as being charged neutrally or positively. In light of that, models of formation of the bulk shallow DOS inside the oxide semiconductor layer and the surface shallow DOS in the vicinity of the surface of the oxide semiconductor layer are provided as described below. Note that the symbol [. . . ] in the models does not denote a bond or bonding and is used to be distinguished from the symbol [-] indicating an ionic bond.

Models where the bonding between oxygen and indium contained in the oxide semiconductor layer is broken, the bonding between the oxygen and silicon is formed, and hydrogen exists are shown in Table 1.

TABLE 1

| Model | Type of defect | |
|---|---|---|
| Model A | In•••Vo | $H^{\delta-}$•$O^{\delta+}$—Si |
| Model B | In•••VoH$^{\delta-}$ | $O^{\delta-}$—Si |
| Model C | In•••Vo | $H^{\delta+}$—$O^{\delta-}$—In |
| Model D | In•••VoH$^{\delta-}$ | $O^{\delta-}$—In |

For example, Model A is a model where hydrogen and oxygen are bonded.

For example, Model B is a model where hydrogen is trapped by an oxygen vacancy.

The same applies to a model where silicon is replaced with indium. For example, Model C is a model where hydrogen and oxygen are bonded.

For example, Model D is a model where hydrogen is trapped by an oxygen vacancy.

Such four models A to D can be considered. These models can explain charging neutrally or positively or charging neutrally or negatively. Note that because the bonding with silicon is stronger than the bonding with indium, the probability of Model B is lower than that of Model D.

Accordingly, hydrogen is likely to be charged either positively or negatively depending on relative positions of hydrogen, an oxygen vacancy, and oxygen. In other words, an oxygen vacancy and hydrogen can form a positively-charged DOS or a negatively-charged DOS. The DOS can be charged positively or negatively depending on surroundings (electronegativity of an element existing peripherally).

<Model of Hysteresis Deterioration in Dark State of Transistor Including Oxide Semiconductor Layer>

A mechanism in deterioration of a transistor including an oxide semiconductor layer is described next. The transistor including an oxide semiconductor layer deteriorates differently depending on whether or not the transistor is irradiated with light. When the transistor is irradiated with light, deterioration is likely to result from the bulk deep DOS at the deep level inside the oxide semiconductor layer. When the transistor is not irradiated with light, deterioration is likely to result from the surface shallow DOS at the shallow level in the vicinity of the surface of the oxide semiconductor layer (at the interface with an insulating film or in the vicinity thereof).

Thus, a state where the transistor including an oxide semiconductor layer is not irradiated with light (dark state) is described. As for this state, the deterioration mechanism of the transistor can be explained on the basis of trapping and releasing of a charge by the surface shallow DOS at the shallow level in the vicinity of the surface of the oxide semiconductor layer (at the interface with an insulating film or in the vicinity of the interface).

Figure 3:
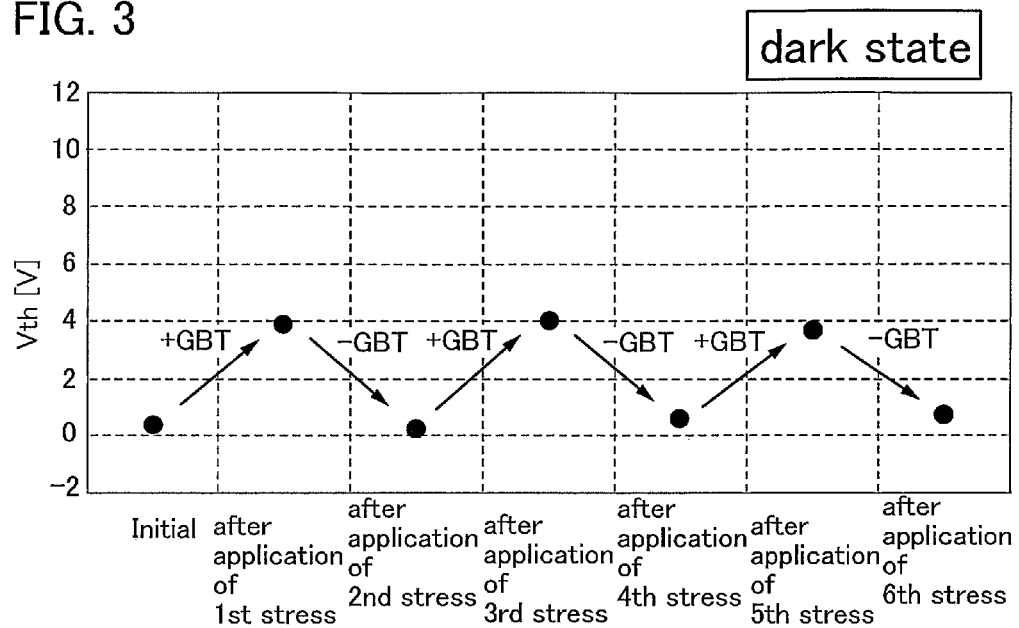
FIG. 3 is a graph showing deterioration of a transistor including an oxide semiconductor layer in a dark state.

FIG. 3 shows variation in a threshold voltage (Vth) when the transistor including an oxide semiconductor layer is subjected to a gate bias temperature (BT) stress test repeatedly in a dark state. As apparent from FIG. 3, the threshold voltage is shifted to a positive side by the positive gate BT (+GBT) stress test. Then, the transistor is subjected to a negative gate BT (−GBT) stress test, so that the threshold voltage is shifted to a negative side and is substantially equal to the initial value (Initial). In this manner, by repeating the positive gate BT stress test and the negative gate BT stress test alternately, the threshold voltage is shifted positively and negatively (i.e., a hysteresis occurs). In other words, it is found that when the positive gate BT stress test and the negative gate BT stress test are repeated without light irradiation, the threshold voltage is shifted alternately to a positive side and then a negative side, but the shift fits in certain range as a whole.

Figure 4:
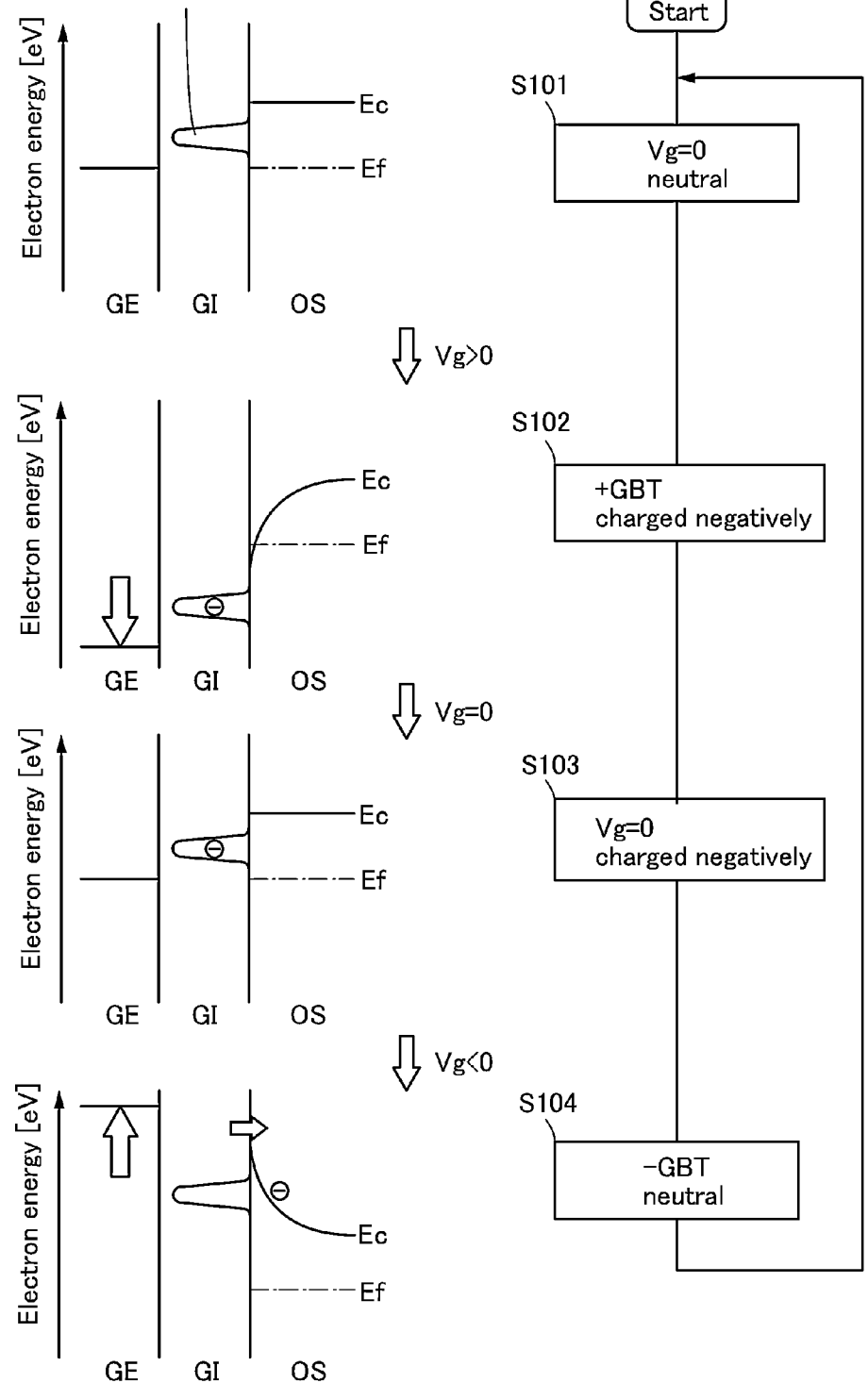
FIG. 4 illustrates deterioration of a transistor including an oxide semiconductor layer in a dark state.

The variation in the threshold voltage of the transistor due to the gate BT stress test in the dark state can be explained with the surface shallow DOS in the vicinity of the surface of an oxide semiconductor layer. FIG. 4 illustrates a band structure of an oxide semiconductor layer and flow charts corresponding to the band structure. Here, because the mechanism of deterioration when the transistor is not irradiated with light is considered, light irradiation is not performed before, during, and after the gate BT stress test.

Before application of the gate BT stress (at the gate voltage (Vg) of 0), the surface shallow DOS in the vicinity of the surface of an oxide semiconductor layer has energy higher than the Fermi level (Ef) and is electrically neutral since an electron is not trapped (Step S101). The threshold voltage measured at this time is set as an initial value before the gate BT stress is applied.

Next, a positive gate voltage is applied as the positive gate BT stress test (dark state). When the positive gate voltage is applied, the conduction band is curved and the energy of the surface shallow DOS in the vicinity of the surface of the oxide semiconductor layer becomes lower than the Fermi level. Thus, an electron is trapped in the surface shallow DOS in the vicinity of the surface of the oxide semiconductor layer, so that the DOS is charged negatively (Step S102).

Next, the application of stress is stopped such that the gate voltage is 0. By the gate voltage at 0, the surface shallow DOS in the vicinity of the surface of an oxide semiconductor layer has energy higher than the Fermi level. However, it takes a long time for the electron trapped in the surface shallow DOS in the vicinity of the surface of the oxide semiconductor layer to be released. Thus, the surface shallow DOS in the vicinity of the surface of the oxide semiconductor layer remains charged negatively (Step S103). At this time, a channel formation region of the transistor is being subjected to application of a negative voltage as well as the gate voltage. Accordingly, a gate voltage that is higher than the initial value should be applied so as to turn on the transistor, so that the threshold voltage is shifted to a positive side. In other words, the transistor tends to be normally off.

Next, a negative gate voltage is applied as the negative gate BT stress test (dark state). When the negative gate voltage is applied, the conduction band is curved and the energy of the surface shallow DOS in the vicinity of the surface of the oxide semiconductor layer becomes much higher. Thus, the electron trapped in the surface shallow DOS in the vicinity of the surface of the oxide semiconductor layer is released, so that the DOS becomes electrically neutral (Step S104). Because of the release of the electron, the threshold voltage is likely to be substantially equal to the initial value before the gate BT stress tests.

Next, the application of stress is stopped such that the gate voltage is 0. The surface shallow DOS in the vicinity of the surface of an oxide semiconductor layer at this time has released the electron and is electrically neutral (Step S101). Thus, the threshold voltage is shifted to a positive side, so that it returns to the initial value before the gate BT stress tests. The negative gate BT test and the positive gate BT stress test are repeated without irradiation with light, so that the threshold voltage is shifted repeatedly to the positive side and to the negative side. However, an electron trapped in the surface shallow DOS in the vicinity of the surface of an oxide semiconductor layer at the time of the positive gate BT stress test is released at the time of the negative gate BT stress test; therefore, it is found that the threshold voltage is shifted within a certain range as a whole.

As described above, the shift in the threshold voltage of a transistor due to the gate BT stress test in a dark state can be explained on the basis of the understanding of the surface shallow DOS in the vicinity of the surface of the oxide semiconductor layer.

<Model of Deterioration of Transistor Including Oxide Semiconductor Layer Under Light Irradiation>

As described above, deterioration of a transistor including an oxide semiconductor layer occurs differently depending on whether or not the transistor is irradiated with light. Deterioration without light irradiation has been described above. Thus, a deterioration mechanism under light irradiation is described here. The deterioration with light irradiation is related to the bulk deep DOS at the deep level in the oxide semiconductor layer. The deterioration mechanism of the transistor with light irradiation (in a bright state) is explained on the basis of the capture and release of an electron in the bulk deep DOS at the deep level in the oxide semiconductor layer.

Figure 5:
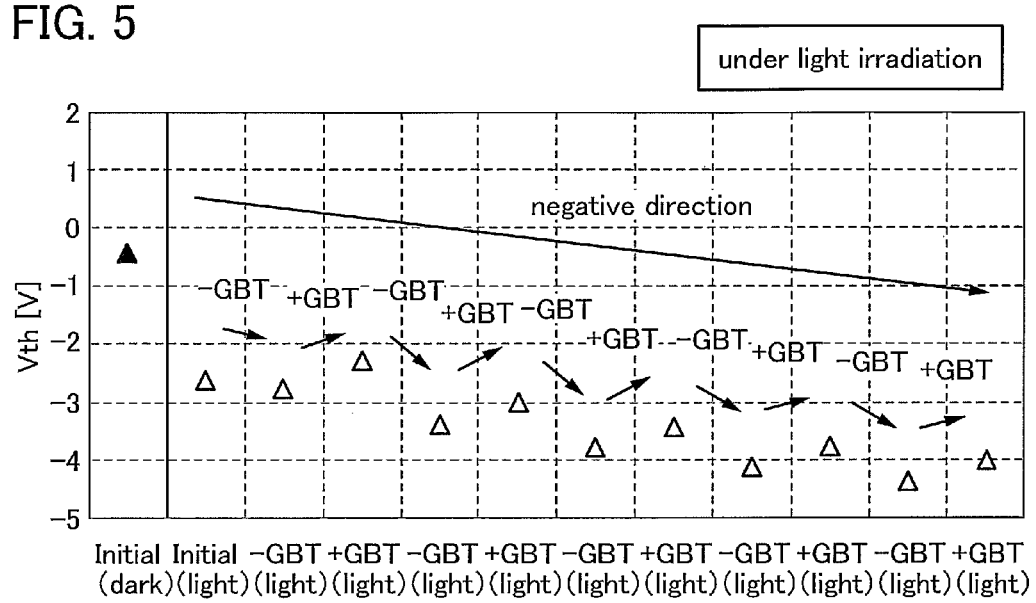
FIG. 5 is a graph showing deterioration of a transistor including an oxide semiconductor layer under light irradiation.

FIG. 5 shows the shift in the threshold voltage (Vth) when the gate BT stress test is conducted repeatedly on the transistor including an oxide semiconductor layer under light irradiation. As shown in FIG. 5, the threshold voltage (Vth) is shifted from the initial value (Initial).

In FIG. 5, a value measured when the gate BT stress is not applied and light is shielded (dark state) is plotted as the initial value of the threshold voltage. Then, the threshold voltage is measured under light irradiation (bright state) without application of the gate BT stress. As a result, the threshold voltage under light irradiation (bright state) is shifted to a negative side greatly from the threshold voltage under light-shielding state (dark state). This is likely to occur because an electron and a hole are generated by light irradiation and the generated electron is excited to the conduction band. In other words, even when the gate BT stress is not applied, the threshold voltage of the transistor including an oxide semiconductor layer is shifted to a negative side by light irradiation, so that the transistor is easily normally on. In this case, as the energy gap of the oxide semiconductor layer is larger, or as fewer DOS exist in the gap, fewer electrons are excited. For that reason, the shift in the threshold voltage due to light irradiation is small in that case.

Then when the negative gate BT stress is applied under light irradiation (−GBT), the threshold voltage is further shifted to a negative side. This probably occurs because a hole trapped in the bulk deep DOS in the oxide semiconductor layer is injected to a non bridging oxygen hole center (NBOHC) in a gate insulating film (GI) by an electric field and is charged positively.

After that, the positive gate BT (+GBT) stress test is conducted under light irradiation, so that the threshold voltage is shifted to a positive side. This is likely to occur because the number of holes in the non bridging oxygen hole center (NBOHC) in the gate insulating film is reduced by the electric field. However, because the threshold voltage does not return completely to the initial value, it is found that not all of the holes trapped in the gate insulating film are released.

Further, when the negative gate BT stress test and the positive gate BT stress test are repeated under light irradiation, the threshold voltage is shifted to a positive side and a negative side (up and down) repeatedly; as a result, it is found that the threshold voltage is shifted gradually to a negative side as a whole. This can be considered to result from the hole trapped in the non bridging oxygen hole center (NBOHC) in the gate insulating film. In other words, the number of holes in the non bridging oxygen hole center (NBOHC) is reduced by the positive gate BT stress test. Note that not all of the holes are released and some of the holes are left in the non bridging oxygen hole center (NBOHC) in the gate insulating film. Furthermore, when the negative gate BT stress test is conducted with some of the holes left, holes are added to the bridging oxygen hole center (NBOHC) in the gate insulating film so as to be accumulated on the holes left in bridging oxygen hole center (NBOHC). When the positive gate BT stress test is conducted again, the holes in the non bridging oxygen hole center (NBOHC) in the gate insulating film is slightly reduced, and then by the next negative gate BT stress test, holes are added again. In other words, by the positive gate BT stress test, the holes in the non bridging oxygen hole center (NBOHC) in the gate insulating film are reduced, but some of the holes are left, and by the next negative gate BT stress test, holes are added to the non bridging oxygen hole center (NBOHC) in the gate insulating film. As a result, the threshold voltage is shifted repeatedly to the positive side and the negative side, and as a whole, the threshold voltage is shifted to a negative side gradually.

Figure 6:
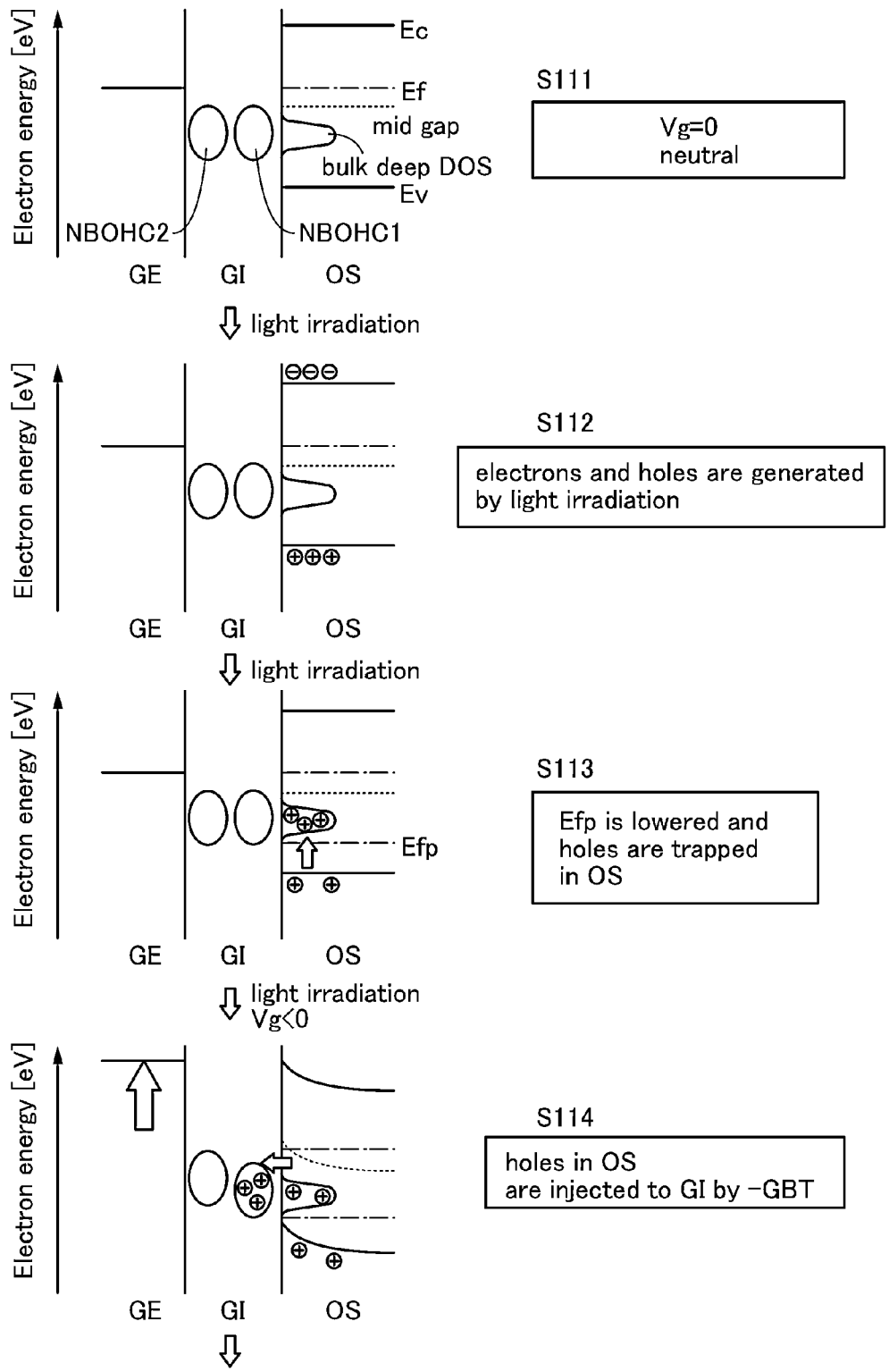
FIG. 6 illustrates deterioration of a transistor including an oxide semiconductor layer under light irradiation.
Figure 7:
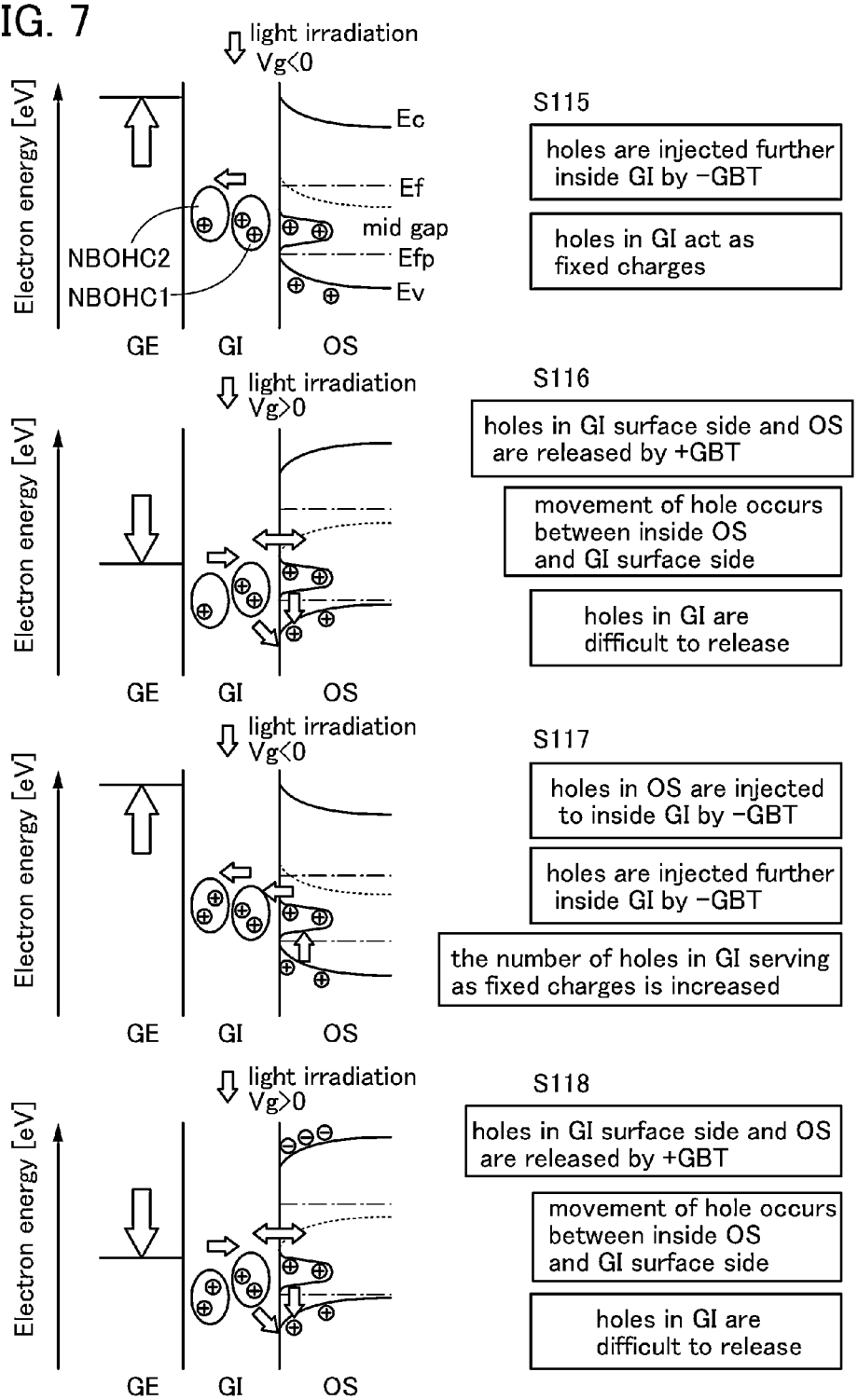
FIG. 7 illustrates showing deterioration of a transistor including an oxide semiconductor layer under light irradiation.

In the gate BT stress tests (where the positive gate BT stress test and the negative gate BT stress test are repeated) under light irradiation, a mechanism of the shift in the threshold voltage of the transistor is explained with reference to the band structures in FIG. 6 and FIG. 7. With reference to FIG. 6 and FIG. 7, the bulk deep DOS in the oxide semiconductor layer and the non bridging oxygen hole centers (NBOHC1 and NBOHC2) in the gate insulating film are described. Note that the non bridging oxygen hole center (NBOHC1) is NBOHC that is located closer to the interface with the oxide semiconductor layer (on the surface side) than the non bridging oxygen hole center (NBOHC2) is.

Before the gate BT stress test and light irradiation (when the gate voltage (Vg) is 0), the bulk deep DOS in the oxide semiconductor layer has energy lower than the Fermi level (Ef), and is electrically neutral since holes are not trapped (Step S111). At this time, the threshold voltage measured in the dark state is regarded as the initial value in the dark state.

Next, the oxide semiconductor layer is irradiated with light without being subjected to the gate BT stress, so that electrons and holes are generated (Step S112). The generated electrons are excited to the conduction band, so that the threshold voltage is shifted to a negative side (electrons are not described in the subsequent steps). In addition, the generated holes lower the quasi-Fermi level (Efp) of holes. Because the quasi-Fermi level (Efp) of holes is lowered, holes are trapped in the bulk deep DOS inside the oxide semiconductor layer (Step S113). Accordingly, under light irradiation without the gate BT stress test, the threshold voltage is shifted to the negative side, so that the transistor easily becomes normally on, unlike the transistor in the dark state.

Next, the negative gate BT stress test is conducted under light irradiation, so that an electric field gradient is generated and holes trapped in the bulk deep DOS inside the oxide semiconductor layer are injected to the non bridging oxygen hole center (NBOHC1) in the gate insulating film (Step S114). In addition, as illustrated in FIG. 7, some holes move into the non bridging oxygen hole centers (NBOHC2) further inside the gate insulating film by the electric field (Step S115). The movement of holes from the non bridging oxygen hole centers (NBOHC1) to the non bridging oxygen hole centers (NBOHC2) in the gate insulating film progresses with time of the electric field application. The holes in the non bridging oxygen hole centers (NBOHC1 and NBOHC2) in the gate insulating film act as positively-charged fixed charges, and shift the threshold voltage to the negative side, so that the transistor easily becomes normally on.

Light irradiation and the negative gate BT stress test are described as different steps for easy understanding, but the present invention is not construed as being limited to description in this embodiment. For example, Step S112 to Step S115 can occur in parallel.

Next, the positive gate BT stress test is conducted under light irradiation, and holes trapped in the bulk deep DOS inside the oxide semiconductor layer and holes in the non bridging oxygen hole centers (NBOHC1) in the gate insulating film are released by the application of the positive gate voltage (Step S116). Thus, the threshold voltage is shifted to the positive side. Note that because the non bridging oxygen hole center (NBOHC2) in the gate insulating film is at the deep level in the gate insulating film, almost no holes in the non bridging oxygen hole centers (NBOHC2) are directly released even when the positive gate BT stress test is conducted under light irradiation. In order that the holes in the non bridging oxygen hole center (NBOHC2) in the gate insulating film can be released, the holes should move to the non bridging oxygen hole centers (NBOHC1) on the surface side. The movement of a hole from the non bridging oxygen hole center (NBOHC2) to the non bridging oxygen hole center (NBOHC1) in the gate insulating film progresses little by little with the time of electric field application. Therefore, the shift amount to the positive side of the threshold voltage is small, and the threshold voltage does not return completely to the initial value.

In addition, the movement of a hole occurs between the non bridging oxygen hole center (NBOHC1) in the gate insulating film and the bulk deep DOS inside the oxide semiconductor layer. However, because many holes have been trapped in the bulk deep DOS inside the oxide semiconductor layer, the whole electric charge amount of the oxide semiconductor layer and the gate insulating film can be hardly reduced.

Next, the negative gate BT stress test is conducted again under light irradiation, so that an electric field gradient occurs and holes trapped in the bulk deep DOS inside the oxide semiconductor layer are injected into the non bridging oxygen hole center (NBOHC1) in the gate insulating film. In addition, some of the holes are injected into the non bridging oxygen hole center (NBOHC2) that is deeper inside the gate insulating film by an electric field (Step S117). Note that the holes in the non bridging oxygen hole centers (NBOHC2) in the gate insulating film, which have been injected thereinto in Step S115, are left without being released. Thus, holes are further injected, so that the number of holes serving as fixed charges is further increased. The threshold voltage is further shifted to the negative side, so that the transistor further easily becomes normally on.

Next, the positive gate BT stress test is conducted under light irradiation, so that holes trapped in the bulk deep DOS in the oxide semiconductor layer and holes in the non bridging oxygen hole center (NBOHC1) in the gate insulating film are released by application of the positive gate voltage (Step S118). As a result, the threshold voltage is shifted to the positive side. However, the holes in the non bridging oxygen hole center (NBOHC2) in the gate insulating film are hardly released. Accordingly, the shift amount to the positive side of the threshold voltage is small, and the threshold voltage does not return completely to the initial value.

By repeating the negative gate BT stress test and the positive gate BT stress test under light irradiation as described above, the threshold voltage is gradually shifted to the negative side as a whole, while the threshold voltage is shifted to the positive side and the negative side repeatedly.

The shift of the threshold voltage of the transistor in the gate BT stress test under light irradiation can be explained on the basis of the bulk deep DOS inside the oxide semiconductor layer and the non bridging oxygen hole centers (NBOHC1 and NBOHC2) in the gate insulating film.

<Process Model of Dehydration, Dehydrogenation, and Oxygen Addition of Oxide Semiconductor Layer>

In order to fabricate a transistor with stable electric characteristics, it is important to reduce the DOS inside the oxide semiconductor layer and in the vicinity of the interface of the oxide semiconductor layer (to make a highly purified intrinsic state). A process model where the oxide semiconductor layer is highly purified to be intrinsic is described below. Dehydration or dehydrogenation of the oxide semiconductor layer are described first and then oxygen addition where an oxygen vacancy (Vo) is filled with oxygen is described.

A model where the bonding between indium and oxygen is broken to form an oxygen vacancy is described.

When the bonding between indium and oxygen is broken, oxygen is released and a site of the oxygen that has been bonded to indium serves as an oxygen vacancy. The oxygen vacancy forms the deep level DOS at the deep level of the oxide semiconductor layer. Because the oxygen vacancy in the oxide semiconductor layer is instable, it captures oxygen or hydrogen to be stable. For this reason, when hydrogen exists near an oxygen vacancy, the oxygen vacancy traps hydrogen to become VoH. The VoH forms the shallow DOS at the shallow level in the oxide semiconductor layer.

Figure 8A:
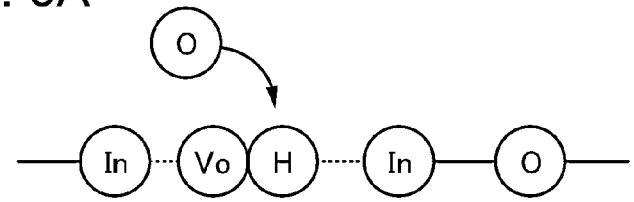
FIGS. 8A to 8F illustrate a model where an oxide semiconductor layer is highly purified to be intrinsic.
Figure 8B:
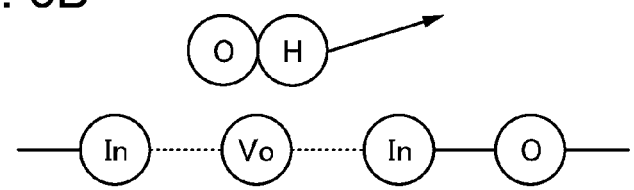

Next, when oxygen comes close to the VoH in the oxide semiconductor layer, oxygen extracts hydrogen from VoH to become a hydroxyl group (OH), so that hydrogen is released from the VoH (see FIGS. 8A and 8B). The oxygen can move in the oxide semiconductor layer so as to come closer to hydrogen by heat treatment and the like.

Figure 8C:
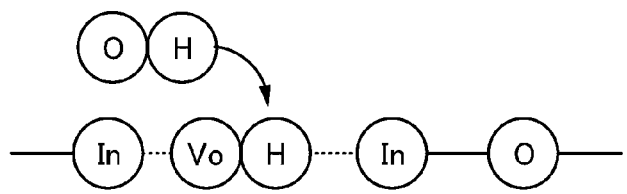
Figure 8D:
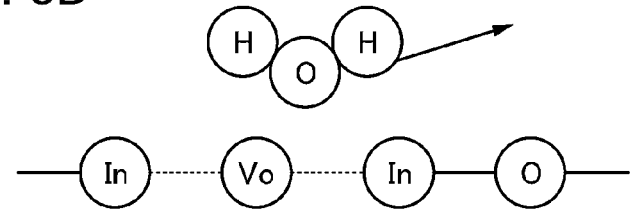

Further, when the hydroxyl group comes closer to another VoH in the oxide semiconductor layer, the hydroxyl group extracts hydrogen from VoH to become a water molecule ($H_2O$), so that hydrogen is released from VoH (see FIGS. 8C and 8D). In this manner, one oxygen releases two hydrogen from the oxide semiconductor layer. This is referred to as dehydration or dehydrogenation of the oxide semiconductor layer. By the dehydration or dehydrogenation, the shallow level DOS at the shallow level in the oxide semiconductor layer is reduced, and the deep level DOS is formed.

Figure 8E:
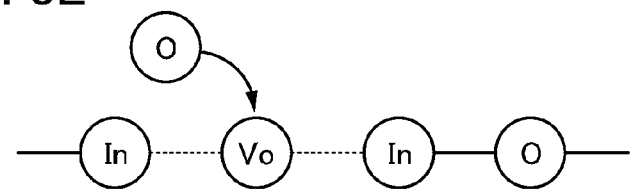
Figure 8F:
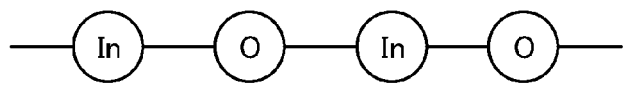

Next, when oxygen comes close to an oxygen vacancy in the oxide semiconductor layer, oxygen is trapped by the oxygen vacancy, so that the oxygen vacancy disappears (see FIGS. 8E and 8F). This is referred to as oxygen addition in the oxide semiconductor layer. By the oxygen addition, the deep level DOS at the deep level in the oxide semiconductor layer is reduced.

As described above, when dehydration or dehydrogenation and oxygen addition of the oxide semiconductor layer are performed, the shallow level DOS and the deep level DOS in the oxide semiconductor layer can be reduced. This process is referred to as a highly purification process for making an intrinsic oxide semiconductor.

The origins of DOS in the oxide semiconductor layer have been described above. Subsequently, deterioration of the transistor due to DOS has been described. In the above description, the oxide semiconductor layer is highly purified to be intrinsic, which results in a reduction in the DOS in the oxide semiconductor layer. However, a method for inhibiting deterioration of the transistor is described below, which is a different approach from that of the method in which the oxide semiconductor layer is highly purified to be intrinsic.

<Structural Approach to Inhibit Deterioration of Transistor>

In the transistor including an oxide semiconductor layer, DOS is likely to be formed at the interface between the oxide semiconductor layer and an insulating film. In addition, when the formed DOS traps a charge, it causes the threshold voltage of the transistor to be shifted.

Accordingly, a structure in which the oxide semiconductor layer is not in a direct contact with the insulating film is preferred for giving the transistor stable electric characteristics.

For example, an oxide layer can be provided between the oxide semiconductor layer and the insulating film. Note that the oxide layer is an oxide layer containing the same type of element that the oxide semiconductor layer contains. When the same type of element is contained in the oxide layer and the oxide semiconductor layer, the DOS at the interface between the both can be reduced. In addition, the oxide layer has higher energy at the bottom of the conduction band than that of the oxide semiconductor layer. In this manner, a channel of the transistor is formed in the oxide semiconductor layer, not in the oxide layer.

When the oxide layer is provided between the insulating film and the oxide semiconductor layer, DOS might be formed at the interface between the oxide layer and the insulating film. A model of deterioration where the DOS formed at the interface between the oxide layer and the insulating film shifts the threshold voltage of the transistor is considered. Further, a structure in which the shift in the threshold voltage is reduced is also considered.

Figure 9A:
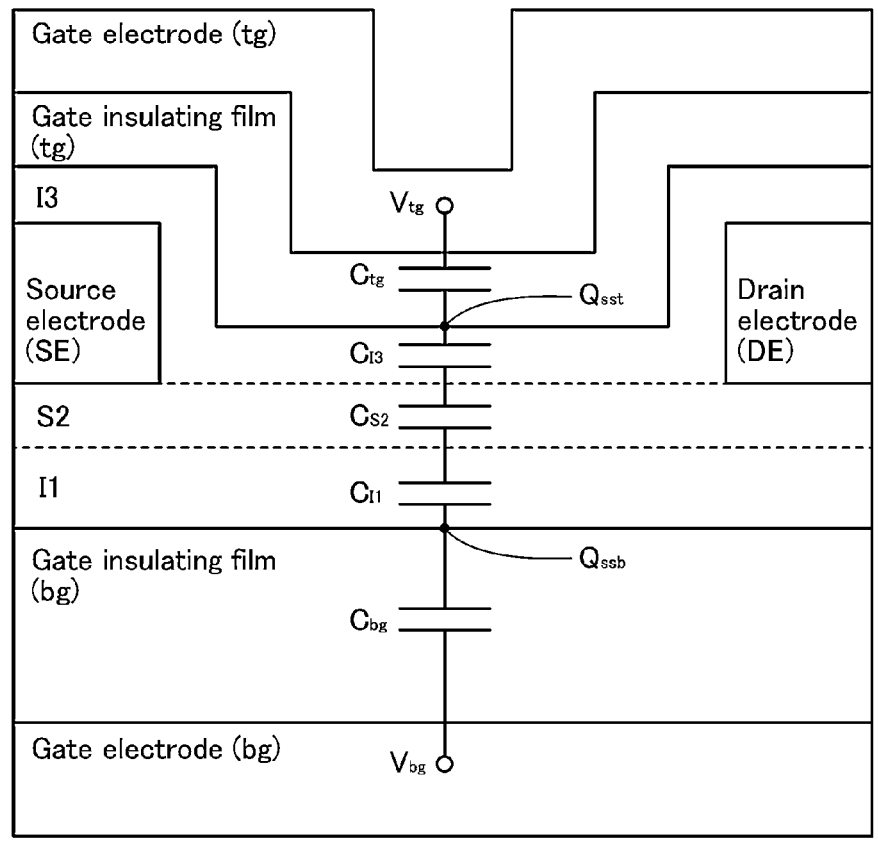
FIG. 9A is a cross-sectional view of a transistor and FIG. 9B is an equivalent circuit diagram.

FIG. 9A is a cross-sectional view of an example of the transistor including an oxide semiconductor layer. The transistor illustrated in FIG. 9A includes a gate electrode (bg); a gate insulating film (bg) over the gate electrode (bg); an oxide layer (I1) over the gate insulating film (bg); an oxide semiconductor layer (S2) over the oxide layer (I1); a source electrode and a drain electrode over the oxide semiconductor layer (S2); an oxide layer (I3) over the oxide semiconductor layer (S2), the source electrode, and the drain electrode; a gate insulating film (tg) over the oxide layer (I3); and a gate electrode (tg) over the gate insulating film (tg). Note that the transistor illustrated in FIG. 9A includes the gate electrode (bg) for easy understanding, but the deterioration model described below can be applied to a transistor without the gate electrode (bg). In addition, when the transistor does not include the gate electrode (bg), the gate insulating film (bg) serves as a base insulating film.

Here, the oxide layer (I1) and the oxide layer (I3) include, for example, at least one metal element, preferably at least two metal elements, further preferably at least three metal elements of metal elements constituting the oxide semiconductor layer (S2). In addition, the gate insulating film (bg) does not include any of the metal elements constituting the oxide layer (I1), for example. In addition, the gate insulating film (tg) does not include any of the metal elements constituting the oxide layer (I3), for example.

The interface between the gate insulating film (bg) and the oxide layer (I1) is a bonding interface between different substances, so that the DOS is increased. In addition, the interface between the gate insulating film (tg) and the oxide layer (I3) is a bonding interface between different substances, so that the DOS is increased. On the other hand, the interface between the oxide layer (I1) and the oxide semiconductor layer (S2) is a bonding interface between the same types of substances, so that the DOS is decreased. In addition, the interface between the oxide layer (I3) and the oxide semiconductor layer (S2) is a bonding interface between the same types of substances, so that the DOS is decreased.

The DOS at the interface between the gate insulating film (bg) and the oxide layer (I1) is assumed to be a charge trap. Further, the DOS at the interface between the gate insulating film (tg) and the oxide layer (I3) is assumed to be a charge trap. In addition, when it is assumed that a charge trapped in the DOS has an extremely long relaxation time, the charge might shift the threshold voltage of the transistor. A charge can be trapped in the DOS, resulting from an operation stress of the transistor.

Here, the charge trapped in the DOS at the interface between the gate insulating film (bg) and the oxide layer (I1) is referred to as $Q_{ssb}$. The charge trapped in the DOS at the interface between the gate insulating film (tg) and the oxide layer (I3) is referred to as $Q_{sst}$. It is verified below that $Q_{ssb}$ and $Q_{sst}$ shift the threshold voltage of the transistor.

Figure 9B:
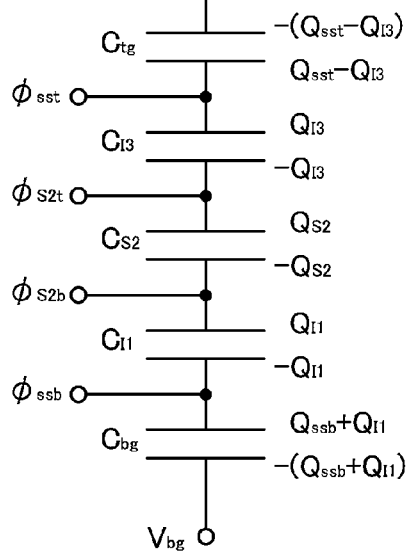

Note that the potential of the gate electrode (bg) is fixed, for example. Accordingly, the transistor is controlled to be turned on or off, for example, by the gate electrode (tg). FIGS. 9A and 9B illustrate the state where the gate electrode (bg) and the gate insulating film (bg) are provided, as an non-limiting example. As the gate electrode (bg), a conductive layer, a semiconductor layer, or a semiconductor layer (for example, a p-type semiconductor or an n-type semiconductor) supplied with an impurity may be provided. In addition, the gate electrode (bg) does not necessarily act as a gate electrode. The gate insulating film (bg) does not necessarily acts as a gate insulating film.

FIG. 9B is an equivalent circuit of a stacked structure up to the gate electrode (tg) from the gate electrode (bg) in the transistor in FIG. 9A. The capacitance of the gate insulating film (bg) is referred to as $C_{bg}$, the capacitance of the oxide layer (I1) is referred to as $C_{I1}$, the capacitance of the oxide semiconductor layer (S2) is referred to as $C_{S2}$, the capacitance of the oxide layer (I3) is referred to as $C_{I3}$, and the capacitance of the gate insulating film (tg) is referred to as $C_{tg}$. As illustrated in FIG. 9B, the stacked structure up to the gate electrode (tg) from the gate electrode (bg) in the transistor in FIG. 9A can be illustrated as an equivalent circuit having a capacitor where components between the gate electrode (bg) and the gate electrode (tg), i.e., the gate insulating film (bg), the oxide layer (I1), the oxide semiconductor layer (S2), the oxide layer (I3), and the gate insulating film (tg) are connected in series.

The potential of the gate electrode (bg) is $V_{bg}$ and the potential of the gate electrode (tg) is $V_{tg}$. The potential of the interface between the gate insulating film (bg) and the oxide layer (I1) is $\phi_{ssb}$, the potential of the interface between the oxide layer (I1) and the oxide semiconductor layer (S2) is $\phi_{S2b}$, the potential of the interface between the oxide semiconductor layer (S2) and the oxide layer (I3) is $\phi_{S2t}$, and the potential of the interface between the oxide layer (I3) and the gate insulating film (tg) is $\phi_{sst}$.

The gate insulating film (bg) has a charge $-(Q_{ssb}+Q_{I1})$ on the gate electrode (bg) side, and a charge $Q_{ssb}+Q_{I1}$ on the oxide layer (I1) side. The oxide layer (I1) has a charge $-Q_{I1}$ on the gate insulating film (bg) side, and a charge $Q_{I1}$ on the oxide semiconductor layer (S2) side. The oxide semiconductor layer (S2) has a charge $-Q_{S2}$ on the oxide layer (I1) side, and a charge $Q_{S2}$ on the oxide layer (I3) side. The oxide layer (I3) has a charge $-Q_{I3}$ on the oxide semiconductor layer (S2) side, and has a charge $Q_{I3}$ on the gate insulating film (tg) side. The gate insulating film (tg) has a charge $Q_{sst}-Q_{I3}$ on the oxide layer (I3) side, and has a charge $-(Q_{sst}-Q_{I3})$ on the gate electrode (tg) side.

The relations between capacitances and charges are expressed below. Note that the oxide layer (I1) and the oxide layer (I3) are assumed to be insulators.

In the gate insulating film (tg), the relation between a capacitance and a charge is expressed by an equation (1).

[Equation 1]

$$C_{tg}[(V_{tg}-V_{fbt})-\phi_{sst}]=-(Q_{sst}-Q_{I3}) \quad (1)$$

In the oxide layer (I3), the relation between a capacitance and a charge is expressed by an equation (2).

[Equation 2]

$$C_{I3}(\phi_{sst}-\phi_{S2t})=Q_{I3} \quad (2)$$

In the oxide semiconductor layer (S2), the relation between a capacitance and a charge is expressed by an equation (3).

[Equation 3]

$$C_{S2}(\phi_{S2t}-\phi_{S2b})=Q_{S2} \quad (3)$$

In the oxide layer (I1), the relation between a capacitance and a charge is expressed by an equation (4).

[Equation 4]

$$C_{I1}(\phi_{S2b}-\phi_{ssb})=Q_{I1} \quad (4)$$

In the gate insulating film (bg), the relation between a capacitance and a charge is expressed by an equation (5).

[Equation 5]

$$C_{bg}[(\phi_{ssb}-(V_{bg}-V_{fbb})]=Q_{ssb}+Q_{I1} \quad (5)$$

Next, an equation (6) is obtained by eliminating $\phi_{sst}$ from the equation (1) and the equation (2). Note that $V_{fbt}$ is a flat band voltage.

[Equation 6]

$$(V_{tg}-V_{fbt})-\phi_{S2t}+\frac{Q_{sst}}{C_{tg}}=\left(\frac{1}{C_{tg}}+\frac{1}{C_{I3}}\right)Q_{I3} \quad (6)$$

In addition, an equation (7) is obtained by eliminating $\phi_{ssb}$ from the equation (4) and the equation (5). Note that $V_{fbb}$ is a flat band voltage.

[Equation 7]

$$\phi_{S2b}-(V_{bg}-V_{fbb})-\frac{Q_{ssb}}{C_{bg}}=\left(\frac{1}{C_{bg}}+\frac{1}{C_{I1}}\right)Q_{I1} \quad (7)$$

The whole oxide semiconductor layer (S2) is assumed to be depleted. In other words, $\phi(x)<0$ is satisfied when $0<x<t_{S2}$ where $t_{S2}$ is a thickness of the oxide semiconductor layer (S2). At this time, Poisson's equation in the oxide semiconductor layer (S2) is expressed by an equation (8).

[Equation 8]

$$\frac{d^2\phi}{dx^2}=-\frac{e(N_D-n)}{\varepsilon_{S2}} \quad (8)$$

In the equation 8, e is an elementary charge, $N_D$ is a donor density of the oxide semiconductor layer (S2), n is an electron density of the oxide semiconductor layer (S2), and $\varepsilon_{S2}$ is a dielectric constant of the oxide semiconductor layer (S2).

When the whole the oxide semiconductor layer (S2) is depleted, the equation 8 can be approximated to an equation (9) because of $N_D \gg n$.

[Equation 9]

$$\frac{d^2\phi}{dx^2}=-\frac{eN_D}{\varepsilon_{S2}} \quad (9)$$

Next, the equation (9) is modified into an equation (10) and an equation (11) where E(x) is an electric field in a film-thickness direction and $k_1$ and $k_2$ are undetermined coefficients.

[Equation 10]

$$\phi(x)=-\frac{eN_D}{2\varepsilon_{S2}}x^2+k_1 x+k_2 \quad (10)$$

[Equation 11]

$$E(x)=-\frac{d\phi}{dx}=\frac{eN_D}{\varepsilon_{S2}}x-k_1 \quad (11)$$

Under boundary conditions $\phi(0)=\phi_{S2t}$ and $\phi(t_{S2})=\phi_{S2b}$, $k_1$ and $k_2$ are obtained as expressed in an equation (12) and an equation (13) from the equation (10) and the equation (11).

[Equation 12]

$$k_1=\frac{\phi_{S2b}-\phi_{S2t}}{t_{S2}}+\frac{eN_D t_{S2}}{2\varepsilon_{S2}} \quad (12)$$

[Equation 13]

$$k_2=\phi_{S2t} \quad (13)$$

In addition, based on Gauss's law, a surface charge density is expressed by an equation (14) and an equation (15).

[Equation 14]

$$Q_{I3}=\varepsilon_{S2}E(0) \quad (14)$$

[Equation 15]

$$Q_{I1}=\varepsilon_{S2}E(t_{S2}) \quad (15)$$

Accordingly, $Q_{I3}$ and $Q_{I1}$ are obtained as expressed by an equation (16) and an equation (17).

[Equation 16]

$$Q_{I3}=C_{S2}(\phi_{S2t}-\phi_{S2b})-\frac{eN_D t_{S2}}{2} \quad (16)$$

-continued

[Equation 17]

$$Q_{I1} = C_{S2}(\phi_{S2t} - \phi_{S2b}) + \frac{eN_D t_{S2}}{2} \quad (17)$$

An equation (18) and an equation (19) are obtained by substituting the equation (16) and the equation (17) into the equation (6) and the equation (7).

[Equation 18]

$$(V_{tg} - V_{fbt}) + \frac{Q_{sst}}{C_{tg}} = \left[\left(\frac{1}{C_{tg}} + \frac{1}{C_{I3}}\right)C_{S2} + 1\right]\phi_{S2t} - \quad (18)$$
$$\left(\frac{1}{C_{tg}} + \frac{1}{C_{I3}}\right)\left(C_{S2}\phi_{S2b} + \frac{eN_D t_{S2}}{2}\right)$$

[Equation 19]

$$(V_{bg} - V_{fbb}) + \frac{Q_{ssb}}{C_{bg}} = \quad (19)$$
$$-\left(\frac{1}{C_{bg}} + \frac{1}{C_{I1}}\right)\left(C_{S2}\phi_{S2t} + \frac{eN_D t_{S2}}{2}\right) + \left[\left(\frac{1}{C_{bg}} + \frac{1}{C_{I1}}\right)C_{S2} + 1\right]\phi_{S2b}$$

Here, when a channel of a transistor is assumed to be formed at the side of the interface between the oxide layer (I1) and the oxide semiconductor layer (S2), the threshold voltage $V_{th}$ is $V_{tg}$ when $\phi_{S2b}=0$. Therefore, the equation (18) and the equation (19) are calculated as simultaneous equations and $\phi_{S2t}$ is eliminated, so that the threshold voltage $V_{th}$ is obtained as expressed in an equation (20).

[Equation 20]

$$V_{th} = V_{fbt} - \frac{Q_{sst}}{C_{tg}} - \quad (20)$$
$$\left(\frac{1}{C_{tg}} + \frac{1}{C_{I1}} + \frac{1}{C_{S2}}\right)\frac{C_{I1}}{C_{bg} + C_{I1}}[Q_{ssb} + C_{bg}(V_{bg} - V_{fbb})] -$$
$$\left(\frac{1}{C_{tg}} + \frac{1}{C_{I3}} + \frac{1}{2C_{I3}}\right)eN_D t_{S2}$$

Accordingly, the shift amount $\Delta V_{th}$ in the threshold voltage $V_{th}$ due to the charge $Q_{sst}$ and the charge $Q_{ssb}$ is expressed in an equation (21).

[Equation 21]

$$\Delta V_{th} = -\frac{Q_{sst}}{C_{tg}} - \left(\frac{1}{C_{tg}} + \frac{1}{C_{I3}} + \frac{1}{C_{S2}}\right)\frac{C_{I1}}{C_{bg} + C_{I1}}Q_{ssb} \quad (21)$$

According to the above equation, $Q_{ssb}$ contributes less to $\Delta V_{th}$ by increasing $C_{I3}$ (for example, the thickness of the oxide layer (I3) is reduced). $Q_{ssb}$ contributes less to $\Delta V_{th}$ by increasing $C_{S2}$ (for example, the thickness of the oxide semiconductor layer (S2) is reduced). $Q_{ssb}$ contributes less to $\Delta V_{th}$ by decreasing $C_{I1}$ (for example, the thickness of the oxide layer (I1) is increased).

In addition, by increasing $C_{tg}$ (the thickness of the gate insulating film (tg) is reduced), $Q_{ssb}$ contributes less to $\Delta V_{th}$. By increasing $C_{bg}$ (the thickness of the gate insulating film (bg) is reduced), $Q_{ssb}$ contributes less to $\Delta V_{th}$.

On the other hand, $C_{I3}$, $C_{S2}$, and $C_{I1}$ do not contribute to $Q_{sst}$. In addition, by increasing $C_{tg}$ (reducing the thickness of the gate insulating film (tg)), $Q_{sst}$ contributes less to $\Delta V_{th}$.

Therefore, the oxide layer (I3) should be thinned so that the shift amount due to DOS in the threshold voltage can be reduced in the transistor illustrated in FIG. 9A. Alternatively, the oxide semiconductor layer (S2) should be thinned. Alternatively, the oxide layer (I1) should be thickened. Alternatively, the gate insulating film (tg) should be thinned. Alternatively, the gate insulating film (bg) should be thinned.

Figure 10A:
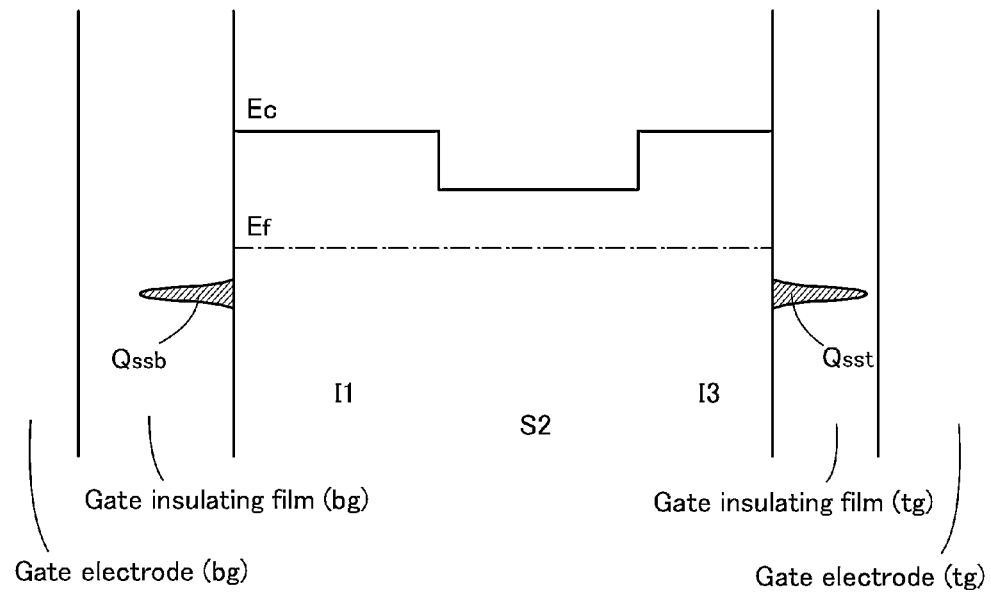
FIGS. 10A and 10B are band structure diagrams.

Further, the channel of the transistor is formed in the oxide semiconductor layer (S2). In other words, the oxide layer (I1) and the oxide layer (I3) have higher energy (Ec) at the bottom of the conduction band than that of oxide semiconductor layer (S2). The band structure at this time of the transistor is illustrated in FIGS. 10A and 10B.

In the above-described model of deterioration, the potential of DOS at the interface between the gate insulating film (bg) and the oxide layer (I1) and the potential of DOS at the interface between the gate insulating film (tg) and the oxide layer (I3) are lower than the Fermi level. In this case, when the gate electrode (bg) and the gate electrode (tg) are 0V, electrons are trapped in the DOS at the interface with the gate electrode (bg) and in the DOS at the interface with the gate electrode (tg), and a charge $Q_{ssb}$ and a charge $Q_{sst}$ are accumulated (see FIG. 10A).

On the other hand, when the transistor includes the oxide layer (I1) and the oxide layer (I3), the potentials of DOS at the interfaces are higher than Fermi level (are closer to energy at the bottom of the conduction band) as compared to the transistor not including the oxide layer (I1) and the oxide layer (I3) in some cases. When the potentials of DOS at the interfaces are higher than the Fermi level, electrons are not trapped in DOS at the interfaces and thus the charge $Q_{ssb}$ and the charge $Q_{sst}$ are not accumulated (see FIG. 10B). In addition, by application of voltage to the gate electrode (tg) or the like, charges are trapped in the DOS at the interfaces in some cases. The trapped charge is eliminated in a short relaxation time, since the potentials of DOS at the interfaces are close to energy at the bottom of the conduction band. Accordingly, the DOS at each interface hardly causes the shift in the threshold voltage of the transistor.

Figure 10B:
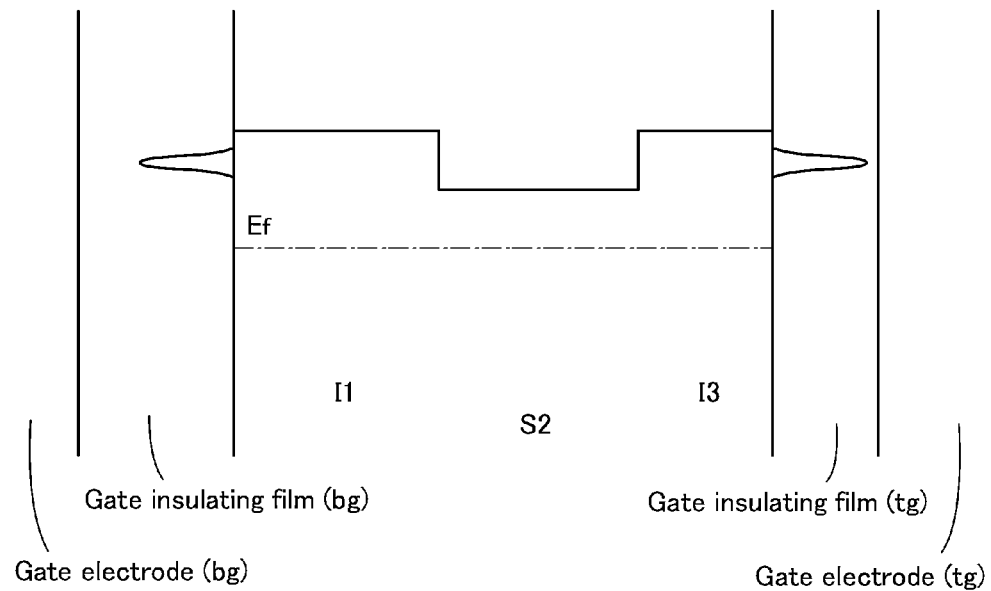

As illustrated in FIG. 10B, because of the magnitude relation between the potential of DOS at each interface and the Fermi level, the charge $Q_{sst}$ is not accumulated by formation of the oxide layer (I3) in some cases. When the charge $Q_{sst}$ is not accumulated, the reliability of the transistor is high because the cause of deterioration does not exist.

Based on the model of deterioration is described the structure in which the shift amount in the threshold voltage is reduced for the transistor having the oxide layer between the oxide semiconductor layer and the insulating film. In order to reduce the shift amount in the threshold voltage due to DOS, the thickness of the oxide layer near the gate electrode controlling On/Off of the transistor should be reduced. In addition, the thickness of the oxide layer far from the gate electrode controlling On/Off of the transistor should be increased.

<Description of Transistor Including Oxide Semiconductor Layer>

A transistor including an oxide semiconductor layer is described below.

<Transistor Structure 1>

Figure 11A:
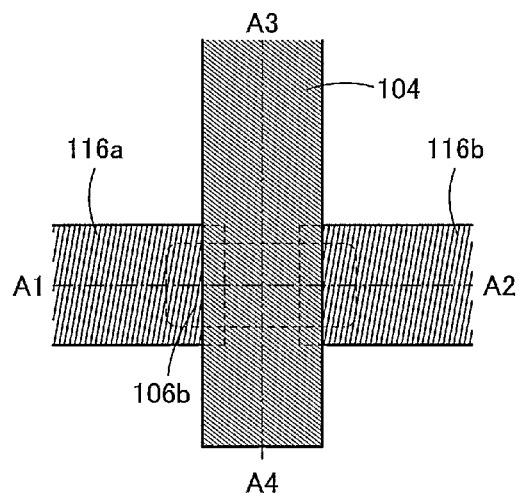
FIGS. 11A to 11C are a top view and cross-sectional views illustrating an example of a transistor in accordance with one embodiment of the present invention.
Figure 11C:
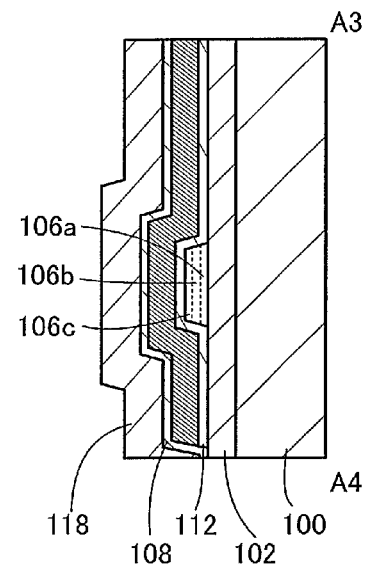
Figure 11B:
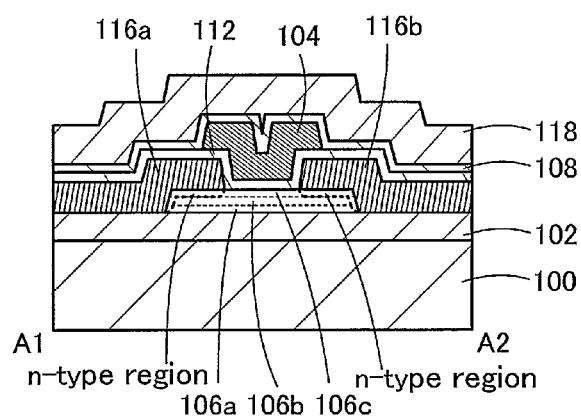

An example of a top-gate and top-contact transistor is described first. FIGS. 11A to 11C are a top view and cross-sectional views of the transistor. FIG. 11A is the top view of the transistor. FIG. 11B is the cross-sectional view taken along dashed-dotted line A1-A2 in FIG. 11A. FIG. 11C is the cross-sectional view taken along dashed-dotted line A3-A4 in FIG. 11A.

The transistor illustrated in FIG. 11B includes a base insulating film 102 over a substrate 100; an oxide layer 106a over the base insulating film 102; an oxide semiconductor layer 106b over the oxide layer 106a; an oxide layer 106c over the oxide semiconductor layer 106b; a source electrode 116a and a drain electrode 116b in contact with the oxide layer 106c; a gate insulating film 112 over the oxide layer 106c, the source electrode 116a, and the drain electrode 116b; and a gate electrode 104 over the gate insulating film 112. Preferably, a protective insulating film 108 is provided over the gate insulating film 112 and the gate electrode 104, and a protective insulating film 118 is provided over the protective insulating film 108. The transistor does not necessarily include the base insulating film 102.

The base insulating film 102 in the transistor illustrated in FIGS. 11A to 11C corresponds to, for example, the gate insulating film (bg) in the transistor illustrated in FIG. 9A. In addition, the transistor illustrated in FIGS. 11A to 11C may include, for example, the gate electrode (bg) in the transistor illustrated in FIG. 9A. The transistor illustrated in FIGS. 11A to 11C may include, for example, a back gate electrode that is opposite to the gate electrode 104 and is in contact with the bottom surface of the base insulating film 102. In addition, in the transistor illustrated in FIGS. 11A to 11C, if the substrate 100 has a conductivity, the substrate 100 can correspond to the gate insulating film (bg) of the transistor illustrated in FIG. 9A, for example. In the transistor illustrated in FIGS. 11A to 11C, if a conductive film serving as a wiring or the like is provided below the base insulating film 102, the conductive film can correspond to the gate insulating film (bg) of the transistor illustrated in FIG. 9A.

Some of materials used for the conductive film serving as the source electrode 116a and the drain electrode 116b deprives parts of the oxide semiconductor layer 106b and the oxide layer 106c of oxygen or form a mixed layer, so that an n-type region (low-resistant region) might be formed in the oxide semiconductor layer 106b and the oxide layer 106c.

In FIG. 11A, the distance between the source electrode 116a and the drain electrode 116b in a region overlapping with the gate electrode 104 is called a channel length. Note that when the transistor includes an n-type region, the distance between the source region and the drain region in a region overlapping the gate electrode 104 may be called a channel length.

Note that a channel formation region refers to a region, which overlaps with the gate electrode 104 and is interposed between the source electrode 116a and the drain electrode 116b, in the oxide layer 106a, the oxide semiconductor layer 106b, and the oxide layer 106c (see FIG. 11B). Further, a channel refers to a main current path in the channel formation region.

Note that as illustrated in the top view of FIG. 11A, a part of the oxide semiconductor layer 106b is provided outside the gate electrode 104. However, the whole oxide semiconductor layer 106b may be provided inside the gate electrode 104. This can suppress generation of carriers in the oxide semiconductor layer 106b due to incident light from the gate electrode 104 side. In other words, the gate electrode 104 functions as a light-blocking film.

The positions of the protective insulating film 118 and the protective insulating film 108 may be reversed. For example, the protective insulating film 108 may be provided over the protective insulating film 118.

The oxide layer 106a, the oxide semiconductor layer 106b, and the oxide layer 106c are described below.

The oxide semiconductor layer 106b is an oxide containing indium. An oxide can have a high carrier mobility (electron mobility) by containing indium, for example. In addition, the oxide semiconductor layer 106b preferably includes an element M. The element M is aluminum, gallium, yttrium, or tin, for example. The element M is an element having a high bonding energy with oxygen, for example. The element M is an element that can increase the energy gap of the oxide, for example. In addition, the oxide semiconductor layer 106b preferably contains zinc. When the oxide contains zinc, the oxide is easily to be crystallized, for example. The energy at the top of the valence band of the oxide can be controlled with the atomic ratio of zinc, for example.

Note that the oxide semiconductor layer 106b is not limited to the oxide containing indium. The oxide semiconductor layer 106b may be, for example, a Zn—Sn oxide or a Ga—Sn oxide.

The oxide layer 106a is an oxide layer which includes one or more kinds of elements other than oxygen constituting the oxide semiconductor layer 106b. Further, since the oxide layer 106a includes one or more kinds of elements other than oxygen constituting the oxide semiconductor layer 106b, DOS is unlikely to be formed at the interface between the oxide semiconductor layer 106b and the oxide layer 106a.

The oxide layer 106c is an oxide layer which includes one or more kinds of elements constituting the oxide semiconductor layer 106b other than oxygen. Further, since the oxide layer 106c includes one or more kinds of elements other than oxygen constituting the oxide semiconductor layer 106b, DOS is unlikely to be formed at the interface between the oxide semiconductor layer 106b and the oxide layer 106c.

When an In—M—Zn oxide is used for the oxide layer 106a, the proportions of In and M when summation of In and M is assumed to be 100 atomic % is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %. In the case of using an In—M—Zn oxide as the oxide semiconductor layer 106b, when summation of In and M is assumed to be 100 atomic %, the proportions of In and M are preferably greater than or equal to 25 atomic % and less than 75 atomic %, respectively, and more preferably greater than or equal to 34 atomic % and less than 66 atomic %, respectively. When an In—M—Zn oxide is used for the oxide layer 106c, the proportions of In and M when summation of In and M is assumed to be 100 atomic % is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %. Note that the oxide layer 106c may be an oxide that is the same type as that of the oxide layer 106a.

Figure 22:
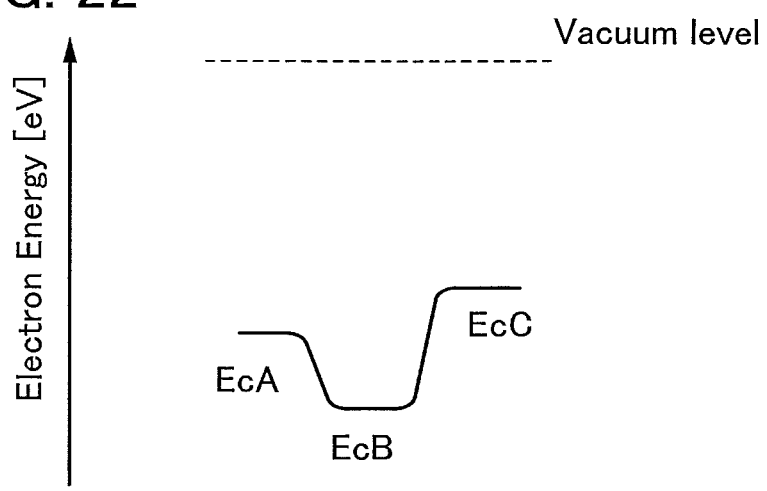
FIG. 22 illustrates a band structure of an oxide semiconductor layer in accordance with one embodiment of the present invention.

Here, in some cases, there is a mixed region of the oxide layer 106a and the oxide semiconductor layer 106b between the oxide layer 106a and the oxide semiconductor layer 106b. Here, in some cases, there is a mixed region of the oxide semiconductor layer 106b and the oxide layer 106c between the oxide semiconductor layer 106b and the oxide layer 106c. The mixed region has low DOS. For that reason, the stack where the oxide layer 106a, the oxide semiconductor layer 106b, and the oxide layer 106c are stacked has a band structure where energy at each interface is changed continuously (continuous junction) (see FIG. 22). Note that the energy at the bottom of the conduction band of the oxide layer 106a is EcA, the energy at the bottom of the conduction band of the oxide semiconductor layer 106b is EcB, and the energy at the bottom of the conduction band of the oxide layer 106c is EcC.

An oxide with a wide energy gap is used for the oxide semiconductor layer 106b. For example, the energy gap of the oxide semiconductor layer 106b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV. Further, for example, the energy gap of the oxide layer 106c is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

An oxide with a wide energy gap is used for the oxide layer 106a. Further, for example, the energy gap of the oxide layer 106a is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

An oxide with a wide energy gap is used for the oxide layer 106c. Further, for example, the energy gap of the oxide layer 106c is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV. Note that the oxide layer 106a and the oxide layer 106c are oxides having energy gaps wider than that of the oxide semiconductor layer 106b.

An oxide having a higher electron affinity than that of the oxide layer 106a is used as the oxide semiconductor layer 106b. For example, as the oxide semiconductor layer 106b, an oxide having higher electron affinity than the oxide layer 106a by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

The oxide semiconductor layer 106b is an oxide having a higher electron affinity than that of the oxide semiconductor layer 106c. For example, as the oxide semiconductor layer 106b, an oxide having a higher electron affinity than the oxide layer 106c by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used.

At this time, when an electric field is applied to the gate electrode 104, a channel is formed in the oxide semiconductor layer 106b that has the highest electron affinity of the oxide layer 106a, the oxide semiconductor layer 106b, and the oxide layer 106c.

As described above in the model of deterioration of the transistor, preferably, the thickness of the oxide layer 106a is large, the thickness of the oxide semiconductor layer 106b is small, and the thickness of the oxide layer 106c is small. Specifically, the thickness of the oxide layer 106a is 20 nm or larger, preferably 30 nm or larger, further preferably 40 nm or larger, still further 60 nm or more. With the oxide layer 106a having the thickness of 20 nm or larger, preferably 30 nm or larger, further preferably 40 nm or larger, still further preferably 60 nm or more, the distance from the interface between the base insulating film 102 and the oxide layer 106a to the oxide semiconductor layer 106b where a channel is formed can be 20 nm or larger, preferably 30 nm or larger, further preferably 40 nm or larger, still further preferably 60 nm or more. Note that since the productivity of a semiconductor device might be reduced, the thickness of the oxide layer 106a is 200 nm or smaller, preferably 120 nm or smaller, further preferably 80 nm or smaller. The thickness of the oxide semiconductor layer 106b is greater than or equal to 3 nm and less than or equal to 100 nm, preferably greater than or equal to 3 nm and less than or equal to 80 nm, more preferably greater than or equal to 3 nm and less than or equal to 50 nm. Further, the oxide layer 106c has a thickness of greater than or equal to 3 nm and less than or equal to 50 nm, preferably greater than or equal to 3 nm and less than or equal to 20 nm. For example, the oxide layer 106a is thicker than the oxide semiconductor layer 106b, and the oxide semiconductor layer 106b is thicker than the oxide layer 106c.

The oxide stack including three layers, the oxide layer 106a, the oxide semiconductor layer 106b, and the oxide layer 106c has been described above, but one embodiment of the present invention is not limited to the oxide stack including three layers. For example, the oxide semiconductor layer 106b alone may be used. Alternatively, an oxide stack including two layers, the oxide layer 106a and the oxide semiconductor layer 106b or an oxide stack including two layers, the oxide semiconductor layer 106b and the oxide layer 106c may be employed for example. Alternatively, an oxide stack having four or more layers including an oxide layer between the oxide layer 106a and the oxide semiconductor layer 106b may be provided. In this case, the oxide layer provided between the oxide layer 106a and the oxide semiconductor layer 106b is, for example, an oxide having an electron affinity that is equal to or higher than the electron affinity of the oxide layer 106a and is equal to or lower than the electron affinity of the oxide semiconductor layer 106b. Alternatively, an oxide stack having four or more layers including an oxide layer between the oxide layer 106c and the oxide semiconductor layer 106b may be provided for example. In this case, the oxide layer provided between the oxide layer 106c and the oxide semiconductor layer 106b is, for example, an oxide having an electron affinity that is equal to or higher than the electron affinity of the oxide layer 106c and is equal to or lower than the electron affinity of the oxide semiconductor layer 106b.

When the oxide layer 106a, the oxide semiconductor layer 106b, and the oxide layer 106c are formed by a sputtering method, targets containing indium are preferably used in order to prevent an increase in the number of particles. In addition, if an oxide target having a high atomic ratio of the element M is used, the conductivity of the target may be decreased. Examples of the element M include aluminum, gallium, yttrium, and tin. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

When the oxide layer 106a is formed by a sputtering method, the atomic ratio of In to M and Zn contained in the target is preferably 1:1:0.5, 1:1:1, 1:1:2, 1:3:1, 1:3:2, 1:3:4, 1:3:6, 1:6:2, 1:6:4, 1:6:6, 1:6:8, 1:6:10, 1:9:2, 1:9:4, 1:9:6, 1:9:8, or 1:9:10 for example.

When the oxide semiconductor layer 106b is formed by a sputtering method, the atomic ratio of In to M and Zn contained in the target is preferably 3:1:1, 3:1:2, 3:1:4, 1:1:0.5, 1:1:1, or 1:1:2, for example.

When the oxide layer 106c is formed by a sputtering method, the atomic ratio of In to M and Zn contained in the target is preferably 1:1:0.5, 1:1:1, 1:1:2, 1:3:1, 1:3:2, 1:3:4, 1:3:6, 1:6:2, 1:6:4, 1:6:6, 1:6:8, 1:6:10, 1:9:2, 1:9:4, 1:9:6, 1:9:8, or 1:9:10, for example.

In the cases where the oxide layer 106a, the oxide semiconductor layer 106b and the oxide layer 106c are formed by a sputtering method, films having atomic ratios different from the atomic ratios of the targets used may be formed. Especially for zinc, the atomic ratio of zinc in a deposited film is smaller than the atomic ratio of the target in some cases. Specifically, the film has an atomic ratio of zinc of 40 atomic % to 90 atomic % of the atomic ratio of zinc in the target.

An influence of silicon on an oxide is described below. In order to give stable electrical characteristics to a transistor, it is effective to reduce the concentration of impurities in the oxide semiconductor layer 106b so that the oxide semiconductor layer 106b is highly purified to be intrinsic. The carrier density of the oxide semiconductor layer 106b is set to lower than $1 \times 10^{17}/cm^3$, lower than $1 \times 10^{15}/cm^3$, or lower than $1 \times 10^{13}/cm^3$. In the oxide, a light element, a semimetal element, a metal element, and the like (lower than 1 atomic %) other than main components serve as impurities. For example, hydrogen, lithium, carbon, nitrogen, fluorine, sodium, silicon, chlorine, potassium, calcium, titanium, iron, nickel, copper, germanium, strontium, zirconium, and hafnium might be impurities to the oxide. Accordingly, the concentration of impurities in an adjacent layer is preferably reduced.

For example, as described above, DOS might be formed by silicon contained in the oxide. In addition, when silicon exists in the surface layer of the oxide semiconductor layer 106b, DOS might be formed. For this reason, the concentration of silicon in a region between the oxide semiconductor layer 106b and the oxide layer 106a is set to lower than $1 \times 10^{19}$ atoms/cm$^3$, preferably lower than $5 \times 10^{18}$ atoms/cm$^3$, more preferably lower than $2 \times 10^{18}$ atoms/cm$^3$. Further, the concentration of silicon in a region between the oxide semiconductor layer 106b and the oxide layer 106c is set to lower than $1 \times 10^{19}$ atoms/cm$^3$, preferably lower than $5 \times 10^{18}$ atoms/cm$^3$, more preferably lower than $2 \times 10^{18}$ atoms/cm$^3$.

In addition, as described above, hydrogen in the oxide may form DOS, so that the carrier density is increased. The concentration of hydrogen in the oxide semiconductor layer 106b, which is measured by secondary ion mass spectrometry (SIMS), is set to lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$. Further, nitrogen in the oxide semiconductor layer 106b may form DOS, so that the carrier density is increased. The concentration of nitrogen in the oxide semiconductor layer 106b, which is measured by SIMS, can be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

It is preferable to reduce the concentrations of hydrogen in the oxide layer 106a in order to reduce the concentrations of hydrogen and nitrogen in the oxide semiconductor layer 106b. Specifically, the concentration of hydrogen in the oxide layer 106a, which is measured by SIMS, can be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$. It is preferable to reduce the concentration of nitrogen in the oxide layer 106a in order to reduce the concentration of nitrogen in the oxide semiconductor layer 106b. The concentration of nitrogen in the oxide layer 106a, which is measured by SIMS, can be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

It is preferable to reduce the concentration of hydrogen in the oxide layer 106c in order to reduce the concentration of hydrogen in the oxide semiconductor layer 106b. The concentration of hydrogen in the oxide layer 106c, which is measured by SIMS, is set to lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$. It is preferable to reduce the concentration of nitrogen in the oxide layer 106c in order to reduce the concentration of nitrogen in the oxide semiconductor layer 106b. The concentration of nitrogen in the oxide layer 106c, which is measured by SIMS, is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

A structure of an oxide semiconductor film which can be used as the oxide semiconductor layer 106b and the like is described below.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

In this specification, trigonal and rhombohedral crystal systems are included in a hexagonal crystal system.

An oxide semiconductor layer is classified roughly into a non-single-crystal oxide semiconductor layer and a single crystal oxide semiconductor layer. The non-single-crystal oxide semiconductor layer includes a c-axis aligned crystalline oxide semiconductor (CAAC-OS) layer, a polycrystalline oxide semiconductor layer, a microcrystalline oxide semiconductor layer, an amorphous oxide semiconductor layer, and the like.

First, a CAAC-OS layer is described.

The CAAC-OS layer is one of oxide semiconductor layers including a plurality of c-axis aligned crystal parts.

In a transmission electron microscope (TEM) image of the CAAC-OS layer, a boundary between crystal parts, that is, a grain boundary is not clearly observed. Thus, in the CAAC-OS layer, a reduction in electron mobility due to the grain boundary is less likely to occur.

According to the TEM image of the CAAC-OS layer observed in a direction substantially parallel to a sample surface (cross-sectional TEM image), metal atoms are arranged in a layered manner in the crystal parts. Each metal atom layer has a morphology reflected by a surface over which the CAAC-OS layer is formed (hereinafter, a surface over which the CAAC-OS layer is formed is referred to as a deposition surface) or a top surface of the CAAC-OS layer, and is arranged in parallel to the deposition surface or the top surface of the CAAC-OS layer.

On the other hand, according to the TEM image of the CAAC-OS layer observed in a direction substantially perpendicular to the sample surface (plan TEM image), metal atoms are arranged in a triangular or hexagonal configuration in the crystal parts. However, there is no regularity of arrangement of metal atoms between different crystal parts.

FIG. 23A is an example of a nanobeam electron diffraction pattern of a sample including CAAC-OS layer. Here, the sample is cut in the direction perpendicular to a surface where the CAAC-OS layer is formed and the thickness thereof is reduced to about 40 nm. Further, an electron beam with a diameter of 1 nmφ enters in the direction perpendicular to the cut surface of the sample. FIG. 23A shows that spots are observed in the nanobeam electron diffraction pattern of the CAAC-OS layer. An ion milling method using argon ions is employed for thinning the sample.

From the results of the cross-sectional TEM image and the plan TEM image, alignment is found in the crystal parts in the CAAC-OS layer.

Most of the crystal parts included in the CAAC-OS layer each fit inside a cube whose one side is less than 100 nm. Thus, there is a case where a crystal part included in the CAAC-OS layer fits inside a cube whose one side is less than 10 nm, less than 5 nm, or less than 3 nm. Note that when a plurality of crystal parts included in the CAAC-OS layer are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS layer is subjected to structural analysis with an X-ray diffraction (XRD) apparatus. For example, when the CAAC-OS layer including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS layer have c-axis alignment, and that the c-axes are aligned in a direction substantially perpendicular to the deposition surface or the top surface of the CAAC-OS layer.

On the other hand, when the CAAC-OS layer is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor layer of $InGaZnO_4$, six peaks appear. The six peaks are derived from crystal planes equivalent to the (110) plane. On the other hand, in the case of a CAAC-OS layer, a peak is not clearly observed even when $\phi$ scan is performed with $2\theta$ fixed at around 56°.

According to the above results, in the CAAC-OS layer having c-axis alignment, while the directions of a-axes and b-axes are different between crystal parts, the c-axes are aligned in a direction parallel to a normal vector of a deposition surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS layer or is formed through crystallization treatment such as heat treatment. As described above, the c-axis of the crystal part is aligned with and in parallel to a normal vector of a deposition surface or a normal vector of a top surface. Thus, for example, in the case where a shape of the CAAC-OS layer is changed by etching or the like, the c-axis might not be necessarily parallel to a normal vector of a deposition surface or a normal vector of a top surface of the CAAC-OS layer.

Further, distribution of c-axis aligned crystal parts in the CAAC-OS layer is not necessarily uniform. For example, in the case where crystal growth leading to the CAAC-OS layer occurs from the vicinity of the top surface of the layer, the proportion of the c-axis aligned crystal parts in the vicinity of the top surface is higher than that in the vicinity of the deposition surface in some cases. Further, when an impurity is added to the CAAC-OS layer, a region to which the impurity is added is altered, and the proportion of the c-axis aligned crystal parts in the CAAC-OS layer varies depending on regions, in some cases.

Note that when the CAAC-OS layer with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS layer. It is preferable that in the CAAC-OS layer, a peak of $2\theta$ appear at around 31° and a peak of $2\theta$ do not appear at around 36°.

The CAAC-OS layer is an oxide semiconductor layer having a low impurity concentration. The impurity is any of elements including hydrogen, carbon, silicon, a transition metal element, and the like, not the main components of the oxide semiconductor layer. In particular, an element (e.g., silicon) which has higher bonding strength with oxygen than a metal element included in the oxide semiconductor layer causes disorder of atomic arrangement in the oxide semiconductor layer because the element deprives the oxide semiconductor layer of oxygen, thereby reducing crystallinity. Further, a heavy metal such as iron or nickel, argon, carbon dioxide, and the like have a large atomic radius (or molecular radius); therefore, when any of such elements is contained in the oxide semiconductor layer, the element causes disorder of the atomic arrangement of the oxide semiconductor layer, thereby reducing crystallinity.

Note that the impurity contained in the oxide semiconductor layer might become a carrier trap or a source of carriers.

The CAAC-OS layer is an oxide semiconductor layer having low DOS. For example, oxygen vacancies in the oxide semiconductor layer serve as carrier traps or serve as carrier generation sources when hydrogen is captured therein.

The state in which impurity concentration is low and DOS is low (the number of oxygen vacancies is small) is referred to as "highly purified intrinsic" or "substantially highly purified intrinsic". A highly purified intrinsic or substantially highly purified intrinsic oxide semiconductor layer has few carrier generation sources, and thus has a low carrier density. Thus, a transistor including the oxide semiconductor layer rarely has a negative threshold voltage (rarely has normally-on characteristics). A highly purified intrinsic or substantially highly purified intrinsic oxide semiconductor layer has few carrier traps. Accordingly, the transistor using the oxide semiconductor layer has little variation in electrical characteristics and high reliability. Note that charges trapped by the carrier traps in the oxide semiconductor layer take a long time to be released and may behave like fixed charges. Thus, the transistor using the oxide semiconductor layer with a high impurity concentration and the high DOS has unstable electrical characteristics in some cases.

In a transistor using the CAAC-OS layer, change in electrical characteristics due to irradiation with visible light or ultraviolet light is small.

Next, a polycrystalline oxide semiconductor layer is described.

In an image obtained with a TEM, for example, crystal grains can be found in the polycrystalline oxide semiconductor layer. In most cases, the size of a crystal grain in the polycrystalline oxide semiconductor layer is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor layer in some cases.

The polycrystalline oxide semiconductor layer may include a plurality of crystal grains, and alignment of crystals may be different in the plurality of crystal grains. A polycrystalline oxide semiconductor layer is subjected to structural analysis with an XRD apparatus. For example, when the polycrystalline oxide semiconductor layer including an InGaZnO$_4$ crystal is analyzed by an out-of-plane method, peaks of 2θ appear at around 31°, 36°, and the like in some cases.

The polycrystalline oxide semiconductor layer has high crystallinity and thus has high electron mobility in some cases. Accordingly, a transistor including the polycrystalline oxide semiconductor layer has high field-effect mobility. Note that there are cases in which an impurity is segregated at the grain boundary between the crystals in the polycrystalline oxide semiconductor layer. Moreover, the grain boundary of the polycrystalline oxide semiconductor layer becomes a defect state. Since the grain boundary of the polycrystalline oxide semiconductor layer may serve as a carrier trap or a carrier generation source, a transistor including the polycrystalline oxide semiconductor layer has larger variation in electric characteristics and lower reliability than a transistor including a CAAC-OS layer in some cases.

Next, a microcrystalline oxide semiconductor layer will be described.

In an image obtained with a TEM, for example, crystal parts cannot be found clearly in the microcrystalline oxide semiconductor layer in some cases. In most cases, the size of a crystal part included in the microcrystalline oxide semiconductor layer is greater than or equal to 1 nm and less than or equal to 100 nm, or greater than or equal to 1 nm and less than or equal to 10 nm, for example. An oxide semiconductor layer having a microcrystal with a size greater than or equal to 1 nm and less than or equal to 10 nm, or a size greater than or equal to 1 nm and less than or equal to 3 nm is specifically referred to as nanocrystal (nc). An oxide semiconductor layer including nanocrystal is referred to as an nc-OS (nanocrystalline oxide semiconductor) layer. In an image of the nc-OS layer obtained with a TEM, for example, a boundary between crystal parts is not clearly detected in some cases.

In the nc-OS layer, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation is not observed in the whole film. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film which is obtained by using an electron beam having a probe diameter (e.g., larger than or equal to 1 nm and smaller than or equal to 30 nm) close to or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

FIG. 23B is an example of a nanobeam electron diffraction pattern of a sample including nc-OS layer. Here, the sample is cut in the direction perpendicular to a surface where the nc-OS layer is formed and the thickness thereof is reduced to about 40 nm. Further, an electron beam with a diameter of 1 nmφ enters in the direction perpendicular to the cut surface of the sample. FIG. 23B shows that a circular region with high luminance is observed and spots are observed in the region with the nanobeam electron diffraction pattern of the nc-OS layer. An ion milling method using argon ions is employed for thinning the sample.

FIGS. 23C1 and 23C2 are examples of nanobeam electron diffraction patterns of a sample including nc-OS layer. Here, the sample is cut in the direction perpendicular to a surface where the nc-OS layer is formed and the thickness thereof is reduced to about 5 nm to 10 nm. Further, an electron beam with a diameter of 1 nmφ enters in the direction perpendicular to the cut surface of the sample, and thereby spots are observed in a measurement position 1 (see FIG. 23C1) and a circular region with high luminance is observed in a measurement position 2 (see FIG. 23C2) depending on the measurement positions. In the position where the circular region with high luminance is observed, there is a possibility that an electron beam passes through a pellet-like crystal and thus a spot of another pellet-like crystal in the depth direction is also observed. Note that the sample is thinned by an ion milling method in which the sample is irradiated with argon ions at a low angle (about 3°).

Since the microscopic region in the nc-OS layer has a periodic atomic order occasionally, the nc-OS layer has lower DOS than that of the amorphous oxide semiconductor. Note that since crystal parts in the nc-OS layer are not regularly-arranged, the nc-OS layer has higher DOS than the CAAC-OS layer.

Accordingly, the nc-OS layer has higher carrier density than the CAAC-OS layer in some cases. An oxide semiconductor with a high carrier density tends to have a high electron mobility. Therefore, a transistor using the nc-OS layer for a channel formation region has a high field-effect mobility in some cases. On the contrary, the nc-OS layer has higher density of defect states than the CAAC-OS layer and thus has higher density of trap states in some cases. Therefore, a transistor using the nc-OS layer for a channel formation region has larger variation in electrical characteristics and lower reliability than a transistor using the CAAC-OS layer for a channel formation region. Note that the nc-OS layer can be formed even when the amount of impurity contained therein is relatively large; thus, the nc-OS layer is sometimes preferably used depending on the application. For example, the nc-OS layer may be formed by a deposition method such as a sputtering method using an AC power supply. The sputtering method using an AC power supply allows a film to be formed with high uniformity over a large substrate, so that a semiconductor device including a transistor using the nc-OS layer for a channel formation region can be manufactured with high productivity.

Thus, the nc-OS layer has a higher carrier density than the CAAC-OS layer in some cases. The oxide semiconductor layer having a high carrier density has high electron mobility in some cases. Thus, a transistor including the nc-OS layer has high field-effect mobility in some cases. The nc-OS layer has higher DOS than that the CAAC-OS layer, and thus has a lot of carrier traps in some cases. Consequently, a transistor including the nc-OS layer has larger variation in electric characteristics and lower reliability than a transistor including the CAAC-OS layer. The nc-OS layer can be formed easily as compared to the CAAC-OS layer because the nc-OS layer can be formed even when a relatively large amount of impurities are included; thus, depending on the purpose, the nc-OS layer can be favorably used in some cases.

Next, an amorphous oxide semiconductor layer is described.

The amorphous oxide semiconductor layer has disordered atomic arrangement and no crystal part. For example, the amorphous oxide semiconductor layer does not have a specific state as in quartz.

In an image obtained with TEM, crystal parts cannot be found in the amorphous oxide semiconductor layer.

When the amorphous oxide semiconductor layer is subjected to structural analysis by an out-of-plane method with an XRD apparatus, a peak which shows a crystal plane does not appear. A halo pattern is observed in an electron diffraction pattern of the amorphous oxide semiconductor layer. Further, a halo pattern is observed but a spot is not shown in a nanobeam electron diffraction pattern of the amorphous oxide semiconductor layer.

The amorphous oxide semiconductor layer contains impurities such as hydrogen at a high concentration. In addition, the amorphous oxide semiconductor layer has high DOS.

The oxide semiconductor layer having a high impurity concentration and high DOS has many carrier traps or many carrier generation sources.

Accordingly, the amorphous oxide semiconductor layer has much higher carrier density than that of the nc-OS layer. Therefore, a transistor including the amorphous oxide semiconductor layer tends to be normally on. Thus, in some cases, such an amorphous oxide semiconductor layer can be applied to a transistor which needs to be normally on. Since the amorphous oxide semiconductor layer has high DOS, carrier traps might be increased. Consequently, a transistor including the amorphous oxide semiconductor layer has larger variation in electric characteristics and lower reliability than those of a transistor including the CAAC-OS layer or the nc-OS layer.

Next, a single crystal oxide semiconductor layer is described.

The single crystal oxide semiconductor layer has a lower impurity concentration and lower DOS (few oxygen vacancies). Thus, the carrier density can be decreased. Accordingly, a transistor including the single-crystal oxide semiconductor layer is unlikely to be normally on. Moreover, since the single crystal oxide semiconductor layer has a lower impurity concentration and lower DOS, carrier traps might be reduced. Thus, the transistor including the single-crystal oxide semiconductor layer has small variation in electric characteristics and accordingly has high reliability.

Note that when the oxide semiconductor layer has few defects, the density thereof is increased. When the oxide semiconductor layer has high crystallinity, the density thereof is increased. When the oxide semiconductor layer has a lower concentration of impurities such as hydrogen, the density thereof is increased. The single crystal oxide semiconductor layer has higher density than that of the CAAC-OS layer. The CAAC-OS layer has higher density than that of the microcrystalline oxide semiconductor layer. The polycrystalline oxide semiconductor layer has higher density than that of the microcrystalline oxide semiconductor layer. The microcrystalline oxide semiconductor layer has higher density than that of the amorphous oxide semiconductor layer.

Note that an oxide semiconductor layer may be a stacked film including two or more layers of an amorphous oxide semiconductor layer, a microcrystalline oxide semiconductor layer, and a CAAC-OS layer, for example.

The DOS in the oxide semiconductor layer 106b is described below. When the DOS in the oxide semiconductor layer 106b is reduced, stable electrical characteristics can be imparted to a transistor including the oxide semiconductor layer 106b. The DOS in the oxide semiconductor layer 106b can be measured by a constant photocurrent method (CPM).

In order that the transistor can have stable electrical characteristics, the absorption coefficient due to the DOS in the oxide semiconductor layer 106b measured by CPM is preferably lower than $1 \times 10^{-3}$ cm$^{-1}$, further preferably lower than $3 \times 10^{-4}$ cm$^{-1}$. Further, when the absorption coefficient due to the DOS in the oxide semiconductor layer 106b measured by CPM is lower than $1 \times 10^{-3}$ cm$^{-1}$, preferably lower than $3 \times 10^{-4}$ cm$^{-1}$, the field-effect mobility of the transistor can be increased. In order that the absorption coefficient due to the DOS in the oxide semiconductor layer 106b measured by CPM can be lower than $1 \times 10^{-3}$ cm$^{-1}$, preferably lower than $3 \times 10^{-4}$ cm$^{-1}$, the concentrations of elements forming DOS such as hydrogen, lithium, carbon, nitrogen, fluorine, sodium, silicon, chlorine, potassium, calcium, titanium, iron, nickel, copper, germanium, strontium, zirconium, and hafnium in the oxide are preferably lower than $2 \times 10^{19}$ atoms/cm$^3$, preferably lower than $2 \times 10^{18}$ atoms/cm$^3$, further preferably lower than $2 \times 10^{17}$ atoms/cm$^3$.

The DOS of a sample where the oxide layer 106a, the oxide semiconductor layer 106b and the oxide layer 106c are stacked over a substrate is evaluated by CPM.

The oxide layer 106a is an oxide layer formed by a sputtering method using an In—Ga—Zn oxide (having an atomic ratio of In:Ga:Zn=1:3:2) target. Note that the oxide layer 106a is formed in such a manner that an argon gas of 30 sccm and an oxygen gas of 15 sccm are used as a film formation gas, the pressure is set to be 0.4 Pa, the substrate temperature is set to be 200° C., and a DC power of 0.5 kW is applied.

The oxide semiconductor layer 106b is an oxide semiconductor layer formed by a sputtering method using an In—Ga—Zn oxide (having an atomic ratio of In:Ga:Zn=1:1:1) target. Note that the oxide semiconductor layer 106b is formed in such a manner that an argon gas of 30 sccm and an oxygen gas of 15 sccm are used as a film formation gas, the pressure is set to be 0.4 Pa, the substrate temperature is set to be 200° C., and a DC power of 0.5 kW is applied.

The oxide layer 106c is formed by a sputtering method using an In—Ga—Zn oxide (the atomic ratio of In to Ga and Zn is 1:3:2) target. Note that the oxide layer 106c is formed in such a manner that an argon gas of 30 sccm and an oxygen gas of 15 sccm are used as a film formation gas, the pressure is set to be 0.4 Pa, the substrate temperature is set to be 200° C., and a DC power of 0.5 kW is applied.

Here, the thicknesses of the oxide layer 106a, the oxide semiconductor layer 106b, and the oxide layer 106c are set to 30 nm, 100 nm, and 30 nm, respectively for increasing the accuracy in the CPM measurement.

In the CPM measurement, the amount of light with which a surface of the sample between terminals is irradiated is adjusted so that a photocurrent value is kept constant in the state where voltage is applied between a first electrode and a second electrode provided in contact with the oxide semiconductor layer 106b that is the sample, and then an absorption coefficient is derived from the amount of the irradiation light at each wavelength. In the CPM measurement, the absorption coefficient of energy which corresponds to the DOS (calculated from a wavelength) is increased. The increase in the absorption coefficient is multiplied by a constant, whereby the DOS of the sample can be obtained.

Figure 24:
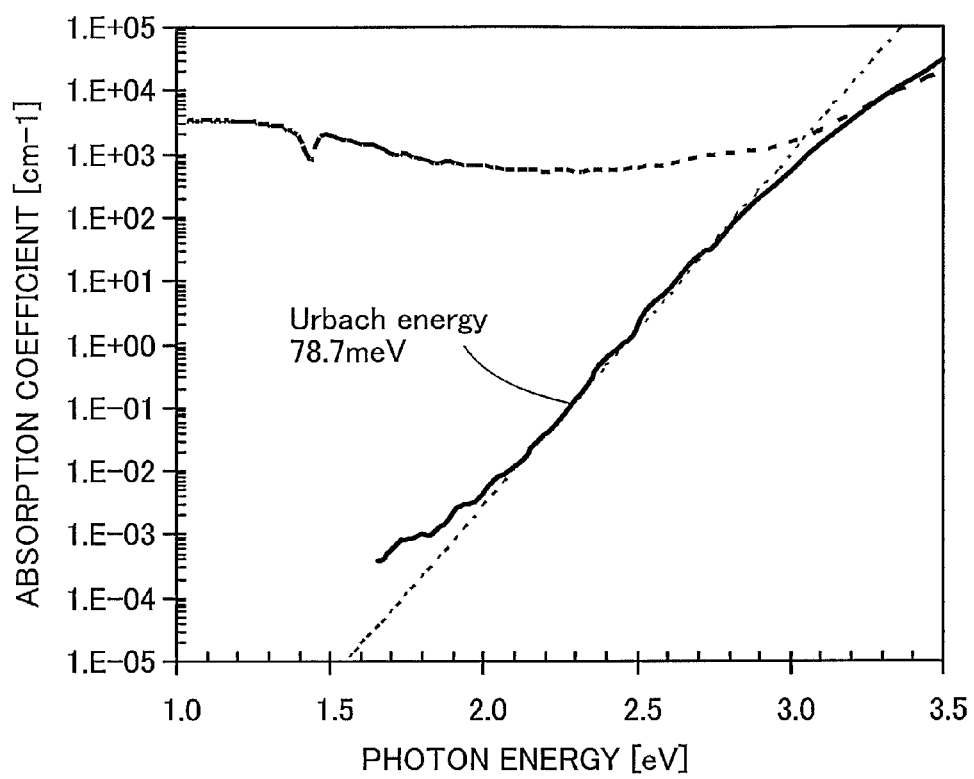
FIG. 24 is a graph showing an absorption coefficient measured by CPM.

FIG. 24 shows results of fitting the absorption coefficient (dotted line) measured using a spectrophotometer and the absorption coefficient (solid line) measured by CPM in the range of energy higher than or equal to the energy gap of the oxide semiconductor layer 106b. Note that the Urbach energy obtained based on the absorption coefficient measured by CPM was 78.7 meV. A background (thin dotted line) is subtracted from the absorption coefficient measured by CPM in FIG. 24, and the integral value of the absorption coefficient is calculated. As a result, the absorption coefficient due to DOS of this sample is found to be $2.02 \times 10^{-4}$ cm$^{-1}$.

The base insulating film 102 illustrated in FIGS. 11A to 11C may be formed of a single layer or a stacked layer using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The base insulating film 102 is, for example, a multilayer film including a silicon nitride layer as a first layer and a silicon oxide layer as a second layer. In this case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose density of spin originating from a signal with a g factor of 2.001 in electron spin resonance (ESR) is lower than or equal to $3 \times 10^{17}$ spins/cm$^3$, preferably lower than or equal to $5 \times 10^{16}$ spins/cm$^3$ is used. As the silicon nitride layer, a silicon nitride layer from which a hydrogen gas and an ammonia gas are less likely to be released is used. The amount of discharge of the hydrogen gas or the ammonia gas may be measured by thermal desorption spectroscopy (TDS). Further, as the silicon nitride layer, a silicon nitride layer which does not transmit or hardly transmits hydrogen, water, and oxygen is used.

The base insulating film 102 may be, for example, a multilayer film including a silicon nitride layer as a first layer, a first silicon oxide layer as a second layer, and a second silicon oxide layer as a third layer. In that case, the first silicon oxide layer and/or the second silicon oxide layer may be a silicon oxynitride layer. In addition, the silicon nitride layer may be a silicon nitride oxide layer. As the first silicon oxide layer, a silicon oxide layer whose defect density is low is preferably used. Specifically, a silicon oxide layer whose density of spin originating from a signal with a g factor of 2.001 in ESR is lower than or equal to $3 \times 10^{17}$ spins/cm$^3$, preferably lower than or equal to $5 \times 10^{16}$ spins/cm$^3$ is used. As the second silicon oxide layer, a silicon oxide layer having excess oxygen is used. As the silicon nitride layer, a silicon nitride layer from which a hydrogen gas and an ammonia gas are less likely to be released is used. Further, as the silicon nitride layer, a silicon nitride layer which does not transmit or hardly transmits hydrogen, water, and oxygen is used.

The silicon oxide layer having excess oxygen means a silicon oxide layer from which oxygen can be released by heat treatment or the like. An insulating film having excess oxygen means an insulating film from which oxygen is released by heat treatment.

The insulating film containing excess oxygen is capable of reducing oxygen vacancies in the oxide semiconductor layer 106b. Such an oxygen vacancy forms DOS in the oxide semiconductor layer 106b and serves as a hole trap or the like. In addition, hydrogen comes into the site of such an oxygen vacancy and forms an electron serving as a carrier. Thus, by a reduction in the number of oxygen vacancies in the oxide semiconductor layer 106b, the transistor can have stable electric characteristics.

Here, a film from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ in TDS analysis (converted into the number of oxygen atoms) in the range of a film surface temperature of from 100° C. to 700° C. or from 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from the measurement sample can be calculated based on Equation (22) using the TDS results of a silicon wafer containing hydrogen at a predetermined density, which is a reference sample, and the TDS results of the measurement sample. Here, all gases having a mass number of 32 which are obtained in the TDS analysis are assumed to originate from an oxygen molecule. A CH$_3$OH gas, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

[Equation 22]

$$N_{O2} = \frac{N_{H2}}{S_{H2}} \times S_{O2} \times \alpha \quad (22)$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of Equation 22. The amount of released oxygen is measured with a thermal desorption spectroscopy apparatus produced by ESCO Ltd., EMD-WA1000S/W using a silicon wafer containing hydrogen atoms at $1 \times 10^{16}$ atoms/cm$^2$ as the reference sample.

Further, in the TDS analysis, oxygen is partly detected as an oxygen atom. The ratio between oxygen molecules and oxygen atoms can be calculated from the ionization rate of the oxygen molecules. Note that since the above a includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Further, the film from which oxygen is released by heat treatment may contain a peroxide radical. Specifically, the spin density attributed to the peroxide radical is greater than or equal to $5 \times 10^{17}$ spins/cm$^3$. Note that the film containing a peroxide radical may have an asymmetric signal with a g factor of approximately 2.01 in ESR.

The insulating film containing excess oxygen may be oxygen-excess silicon oxide (SiO$_X$(X>2)). In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry (RBS).

The source electrode 116a and the drain electrode 116b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten, for example. The source electrode 116a and the drain electrode 116b are each preferably a multilayer film including a layer containing copper. The source electrode 116a and the drain electrode 116b are each a multilayer film including a layer containing copper, whereby wiring resistance can be reduced in the case where a wiring is formed in the same layer as the source electrode 116a and the drain electrode 116b. Note that the compositions of the source electrode 116a and the drain electrode 116b are either the same as or different from each other.

In the case where a multilayer film including a layer containing copper is used for the source electrode 116a and the drain electrode 116b, copper comes into the oxide semiconductor layer 106b and thereby the carrier density of the oxide semiconductor layer 106b may be increased. Alternatively, copper forms DOS in the oxide semiconductor layer 106b and the DOS serves as a charge trap in some cases. In this case, when the oxide layer 106c can block copper, the increase in off-state current and the variation of the threshold voltage of the transistor due to copper can be inhibited.

Figure 12A:
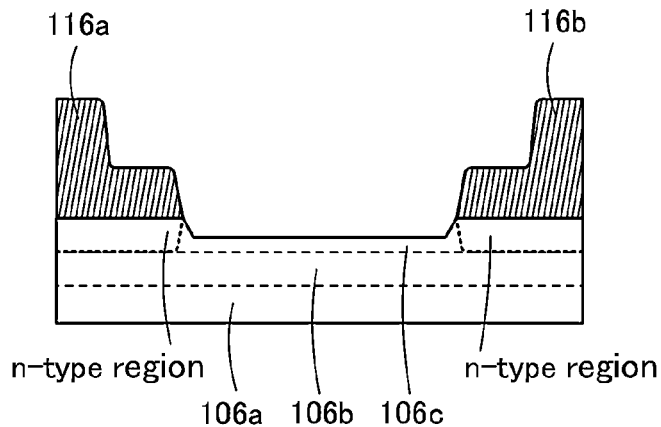
FIGS. 12A to 12C are each a cross-sectional view of a region near a source electrode and a drain electrode of a transistor in accordance with one embodiment of the present invention as an example.
Figure 12B:
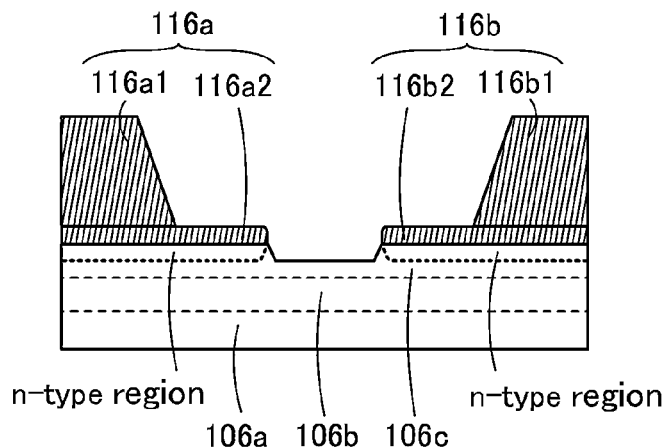
Figure 12C:
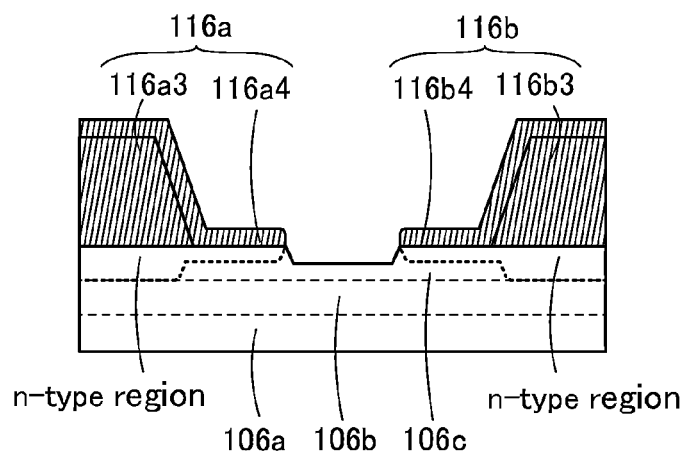

FIGS. 12A to 12C are cross-sectional views of the vicinities of the source electrode 116a and the drain electrode 116b of the transistor. The source electrode 116a and the drain electrode 116b may have any structure illustrated in FIGS. 12A to 12C. In FIGS. 12A to 12C, the top surface of the oxide layer 106c is hollowed at the time of the formation of the source electrode 116a and the drain electrode 116b.

FIG. 12A illustrates a structure where steps are formed in the source electrode 116a and the drain electrode 116b. N-type regions are formed in regions represented by dotted line in the oxide layer 106c. The n-type regions are formed resulting from generation of oxygen vacancies in the oxide layer 106c due to damages when the source electrode 116a and the drain electrode 116b are formed over the oxide layer 106c or action of the conductive film serving as the source electrode 116a and the drain electrode 116b. Due to entry of hydrogen into the site of oxygen vacancies, an electron serving as a carrier may be generated. Note that the n-type regions are formed up to the vicinity of the boundary between the oxide layer 106c and the oxide semiconductor layer 106b as a non-limiting example illustrated in FIG. 12A. For example, the n-type regions may be formed in the oxide layer 106c and the oxide semiconductor layer 106b, or only in the oxide layer 106c.

In the structure illustrated in FIG. 12B, a conductive layer 116a2 which is not easily oxidized and a conductive layer 116a1 provided over the conductive layer 116a2 are used as the source electrode 116a, and a conductive layer 116b2 which is not easily oxidized and a conductive layer 116b1 provided over the conductive layer 116b2 are used as the drain electrode 116b. Note that the conductive layer which is not easily oxidized is unlikely to reduce the oxide layer 106c. When the source electrode 116a and the drain electrode 116b have a structure illustrated in FIG. 12B, the n-type regions f are formed only in the oxide layer 106c. In that case, diffusion of oxygen vacancies in the channel length direction is small, so that the channel formation region is less likely to have n-type conductivity. Further, owing to the conductive layer 116a1 and the conductive layer 116b1, it is acceptable that the conductive layer 116a2 and the conductive layer 116b2 can have low conductivity. Thus, the thicknesses of the conductive layer 116a2 and the conductive layer 116b2 can be small, which leads to easy microfabrication. In other words, the structure illustrated in FIG. 12B is favorable for a miniaturized transistor having a small channel length.

Note that the conductive layer 116a1 and the conductive layer 116a2 may be the same conductive layer. In addition, the conductive layer 116b1 and the conductive layer 116b2 may be the same conductive layer.

In the structure illustrated in FIG. 12C, a conductive layer 116a3 and a conductive layer 116a4 which is not easily oxidized and is provided over the conductive layer 116a3 are used as the source electrode 116a, and a conductive layer 116b3 and a conductive layer 116b4 which is not easily oxidized and is provided over the conductive layer 116b3 are used as the drain electrode 116b. When the source electrode 116a and the drain electrode 116b have a structure illustrated in FIG. 12C, a part of the n-type regions formed in the oxide layer 106c is formed up to the vicinity of the boundary between the oxide semiconductor layer 106b and the oxide layer 106c and a part of the n-type regions is formed in only the oxide layer 106c. In that case, diffusion of oxygen vacancies in the channel length direction is small, so that the channel formation region is less likely to have n-type conductivity. Since the n-type regions are formed so as to reach the oxide semiconductor layer 106b below the conductive layer 116a3 and the conductive layer 116b3, the resistance between the source electrode 116a and the drain electrode 116b is small; as a result, the field-effect mobility of the transistor can be increased. Further, owing to the conductive layer 116a3 and the conductive layer 116b3, it is acceptable that the conductive layer 116a4 and the conductive layer 116b4 can have low conductivity. Thus, the thicknesses of the conductive layer 116a4 and the conductive layer 116b4 can be small, which leads to easy microfabrication. In other words, the structure illustrated in FIG. 12C is favorable for a miniaturized transistor having a small channel length.

Note that the conductive layer 116a3 and the conductive layer 116a4 may be the same conductive layer. In addition, the conductive layer 116b3 and the conductive layer 116b4 may be the same conductive layer.

The gate insulating film 112 illustrated in FIGS. 11A to 11C may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The gate insulating film 112 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in electron spin resonance (ESR) is lower than or equal to $3 \times 10^{17}$ spins/cm$^3$, preferably lower than or equal to $5 \times 10^{16}$ spins/cm$^3$ is used. As the silicon oxide layer, a silicon oxide layer having excess oxygen is preferably used. As the silicon nitride layer, a silicon nitride layer from which a hydrogen gas and an ammonia gas are less likely to be released is used. The amount of released hydrogen gas or ammonia gas may be measured by TDS.

When at least one of the gate insulating film 112 and the base insulating film 102 includes an insulating film containing excess oxygen, oxygen vacancies in the oxide semiconductor layer 106b are reduced, so that the transistor can have stable electrical characteristics.

The gate electrode 104 may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten, for example.

The protective insulating film 108 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide, for example.

The protective insulating film 108 includes, for example, a silicon nitride layer. The silicon nitride layer may be a silicon nitride oxide layer. As the silicon nitride layer, a silicon nitride layer from which a hydrogen gas and an ammonia gas are less likely to be released is preferred. The amount of released the hydrogen gas or the ammonia gas may be measured by TDS. Further, as the silicon nitride layer, a silicon nitride layer which does not transmit or hardly transmits hydrogen, water, and oxygen is preferably used.

The protective insulating film 108 includes, for example, an aluminum oxide layer. As the aluminum oxide layer, an aluminum oxide layer from which a hydrogen gas is less likely to be released is preferred. The amount of released hydrogen gas may be measured by TDS. As the aluminum oxide layer, an aluminum oxide layer which does not transmit or hardly transmits hydrogen, water, and oxygen is used.

The protective insulating film 118 may be formed using a single layer or a stacked layer of an insulating film containing one or more kinds of silicon oxide, silicon oxynitride, germanium oxide, yttrium oxide, zirconium oxide, lanthanum oxide, neodymium oxide, hafnium oxide, and tantalum oxide, for example. Owing to the protective insulating film 118, the protective insulating film 108 is not necessarily provided.

There is no particular limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is difficult in some cases due to the shrinkage of the substrate 100, which is caused by heat treatment or the like in a manufacturing process of the semiconductor device. Therefore, in the case where the above-described large glass substrate is used as the substrate 100, a substrate whose shrinkage due to heat treatment is as less as possible is preferably used. For example, as the substrate 100, it is possible to use a large glass substrate in which the amount of shrinkage by heat treatment for one hour at 400° C., preferably 450° C., more preferably 500° C. is less than or equal to 10 ppm, preferably less than or equal to 5 ppm, more preferably less than or equal to 3 ppm.

Still alternatively, a flexible substrate may be used as the substrate 100. As a method of providing a transistor over a flexible substrate, there is a method in which a transistor is formed over a non-flexible substrate, and then the transistor is separated and transferred to the substrate 100 which is a flexible substrate. In that case, a separation layer is preferably provided between the non-flexible substrate and the transistor.

<Fabrication Method of Transistor Structure (1)>

An example of a method for fabricating a transistor structure (1) is described below.

FIGS. 13A to 13D and FIGS. 14A to 14D are cross-sectional views corresponding to FIG. 11B.

First, the substrate 100 is prepared.

Next, the base insulating film 102 is formed. The base insulating film 102 can be deposited by a sputtering method, a chemical vapor deposition (CVD) method, a molecular beam epitaxy (MBE) method, an atomic layer deposition (ALD) method, or a pulsed laser deposition (PLD) method.

Alternatively, when a silicon wafer is used as the substrate 100, the base insulating film 102 can be formed by a thermal oxidation method.

Then, in order to planarize the surface of the base insulating film 102, chemical mechanical polishing (CMP) is preferably performed. By CMP, the average surface roughness ($R_a$) of the base insulating film 102 is preferably 1 nm or less, further preferably 0.3 nm or less, still preferably 0.1 nm or less. When $R_a$ is less than or equal to the above value, the crystallinity of the oxide semiconductor layer 106b can be increased in some cases. Note that the average surface roughness ($R_a$) is obtained by expanding, into three dimensions, arithmetic mean surface roughness that is defined by JIS B 0601:2001 (ISO4287:1997) so as to apply it to a curved surface. $R_a$ can be expressed as an "average value of the absolute values of deviations from a reference surface to a designated surface" and is defined by Equation (23).

[Equation 23]

$$Ra = \frac{1}{S_0} \int_{y_1}^{y_2} \int_{x_1}^{x_2} |f(x, y) - Z_0| dx dy \quad (23)$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

Then, oxygen ions may be added into the base insulating film 102 so that an insulating film containing excess oxygen can be formed. The addition of oxygen ions is preferably performed by an ion-implantation method at acceleration voltage of 2 kV to 100 kV and at a dose of $5×10^{14}$ ions/cm² to $5×10^{16}$ ions/cm² for example.

Figure 13A:
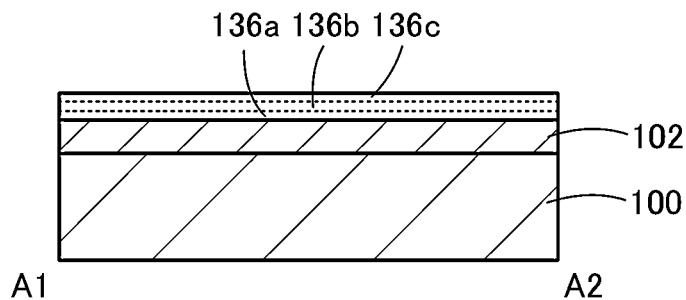
FIGS. 13A to 13D are cross-sectional views illustrating an example of a method for manufacturing a transistor in accordance with an embodiment of the present invention.

Next, the oxide layer 136a, the oxide semiconductor layer 136b, and the oxide layer 136c are formed in this order (see FIG. 13A). The oxide layer 136a, the oxide semiconductor layer 136b, and the oxide layer 136c can be formed using any of oxides listed for the oxide layer 106a, the oxide semiconductor layer 106b, and the oxide layer 106c. The oxide semiconductor layer 136b and the oxide layer 136c can be deposited by a sputtering method, a CVD method, an MBE method, an ALD method, or a PLD method.

A model of sputtering formation of an oxide layer having crystallinity even over an amorphous surface, an amorphous insulating surface, or an amorphous oxide surface is described below. The formation method of the oxide layer described below can be applied to the formation methods of the oxide layer 136a, the oxide semiconductor layer 136b, and the oxide layer 136c.

Figure 25A:
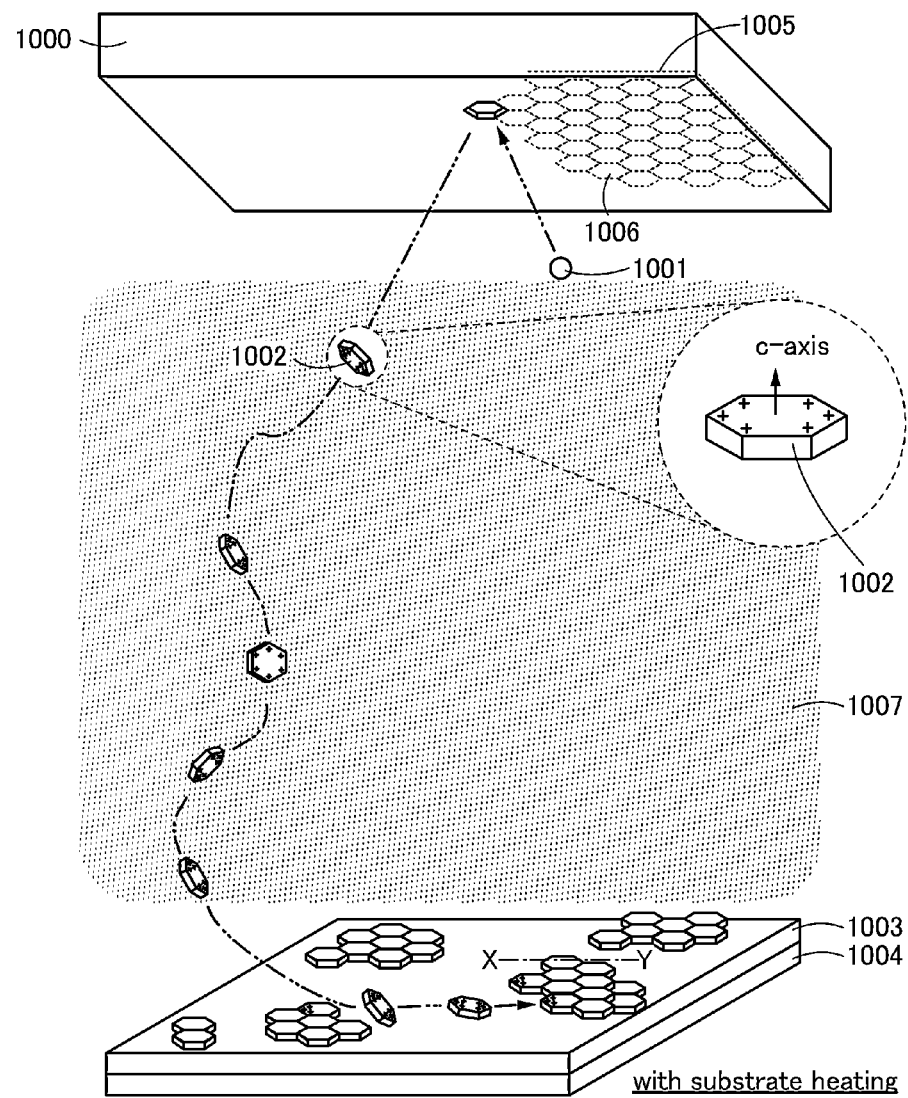
FIGS. 25A and 25B are schematic views illustrating a state in which sputtered particles are separated from a target and the sputtered particles reach a deposition surface.

FIG. 25A is a schematic diagram illustrating a state in which an ion 1001 collides with a target 1000 containing a polycrystalline oxide semiconductor, a sputtered particle 1002 with crystallinity is separated from the target 1000 and deposited on an amorphous film 1004, so that an oxide layer 1003 is formed. A crystal grain contained in the target has a cleavage plane 1005 parallel to the a-b plane of a crystal. The crystal grain contained in the target has a portion 1006 with a weak interatomic bond.

When the ion 1001 collides with the crystal grain contained in the target, the interatomic bonds in the cleavage plane 1005 and the portion 1006 are cut, so that a sputtered particle 1002 blasts off.

Alternatively, when the ion 1001 collides with the crystal grain contained in the target, the interatomic bond is broken in the cleavage plane 1005 and a particle having crystallinity that is cut into a round slice from the crystal grain contained in the target blasts off. Then, the particle blasting off the target is subjected to the plasma 1007 and the interatomic bond in the portion 1006 is broken, so that a plurality of sputtered particles 1002 are generated.

Figure 25B:
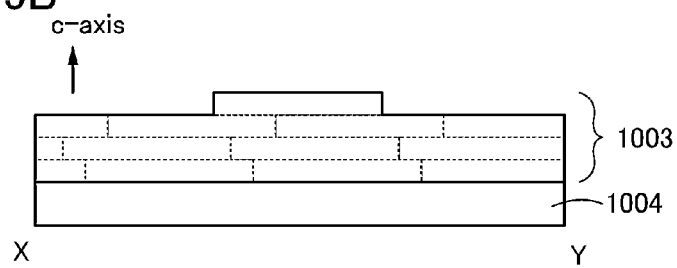

The sputtered particle 1002 has a flat-plate like shape, for example. The term "flat-plate" has two planes that are parallel with each other (each plane can be said to be a flat-plate), for example. In particular, a flat-plate having two parallel planes that are hexagons (regular hexagons) with all the internal angles of 120° is referred to as a pellet. The sputtered particle 1002 that is pellet-like has an a-b plane parallel with the hexagonal plane, for example. In addition, the pellet-like sputtered particle 1002 has a c-axis direction of a crystal that is perpendicular to the plane of the hexagon, for example (see FIG. 25B). In addition, the diameter of the hexagonal plane of the pellet-like sputtered particle 1002 is from 1 nm to 100 nm, from 1 nm to 30 nm, or from 1 nm to 10 nm. Note that the shape of the sputtered particle 1002 is not limited to the flat-plate like shape in which parallel two planes are hexagonal in the model described below. The sputtered particle 1002 appears and disappears in a short time. Therefore, it is extremely difficult to directly observe the sputtered particle 1002 itself. Based on the assumption that the sputtered particle 1002 has a flat-plate like shape having two parallel hexagonal planes, description is made below.

The ion 1001 has, for example, a cation of oxygen. With use of an oxygen cation as the ion 1001, plasma damage at deposition can be alleviated. In addition, the use of the ion 1001 having an oxygen cation can inhibit the crystallinity of the target from being decreased or being made into amorphous at the time of collision of the ion 1001 to the target, for example. Further, in some cases, the use of the ion 1001 having an oxygen cation can increase the crystallinity of the target at the time of collision of the ion 1001 to the target surface, for example. Note that the ion 1001 may have, for example, a cation of a rare gas (such as helium, neon, argon, krypton, or xenon).

Figure 27A:
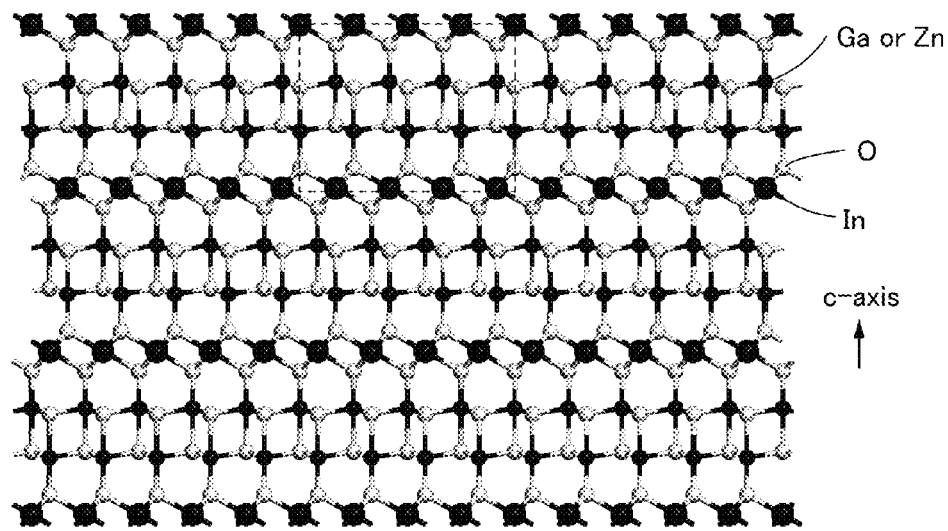
FIGS. 27A and 27B are schematic diagrams illustrating a crystal structure of a homologous compound represented by $InGaO_3(ZnO)_m$ (m is a natural number) where m is 1.

An example of a crystal contained in the target, in a homologous compound represented by $InGaO_3(ZnO)_m$ (m is a natural number), the crystal structure when m is 1 is illustrated as viewed parallel with the a-b plane (see FIG. 27A).

Figure 27B:
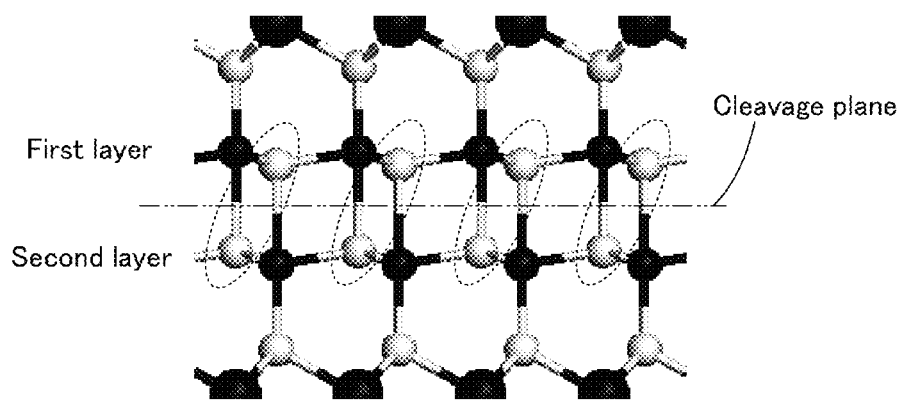

Further, FIG. 27B illustrates an enlarged portion surrounded by a dashed line in FIG. 27A.

Figure 26:
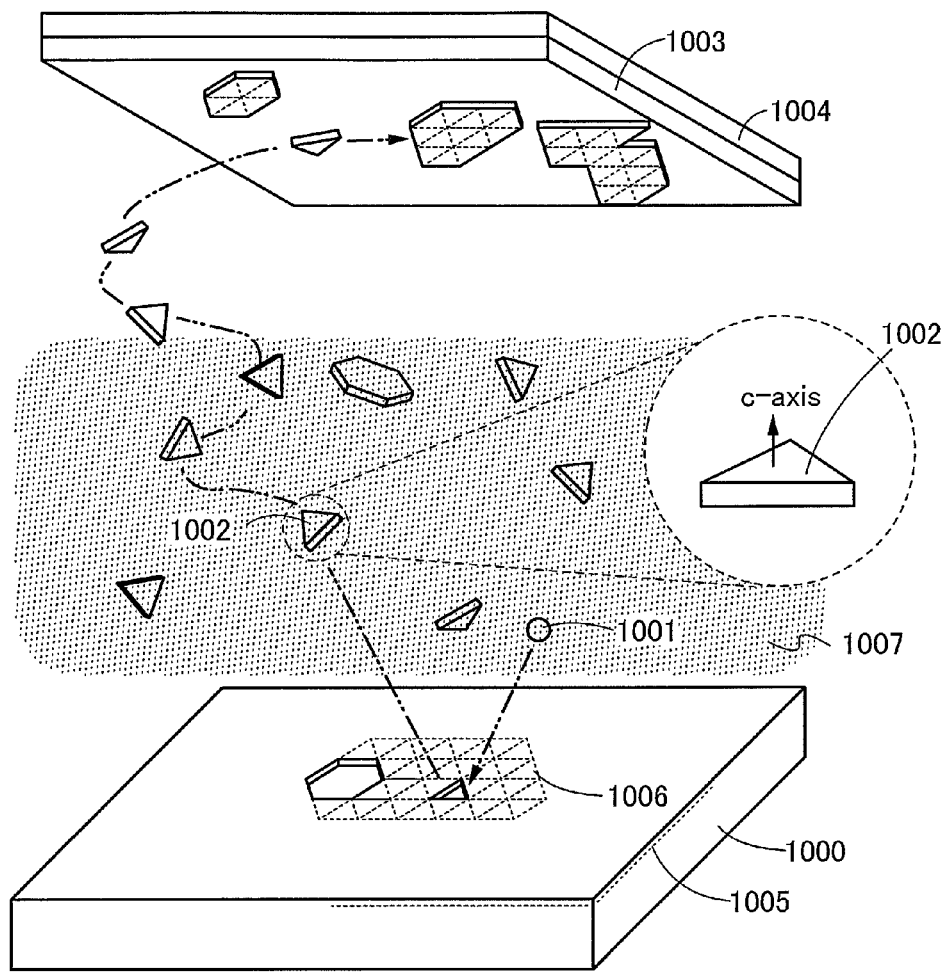
FIG. 26 is a schematic view illustrating a state in which sputtered particles are separated from a target and the sputtered particles reach a deposition surface.

For example, in a crystal grain contained in the target, a cleavage plane is a plane between a first layer and a second layer as illustrated in FIG. 27B. The first layer includes a gallium atom and/or zinc atom and an oxygen atom, and the second layer includes a gallium atom and/or zinc atom and an oxygen atom. This is because oxygen atoms in the first layer and oxygen atoms in the second layer are close to each other (see surrounded portions in FIG. 27B). For example, since the oxygen atoms have negative charge, the bonding between layers can be weakened by the oxygen atoms closer to each other. In this manner, the cleavage plane is a plane parallel to an a-b plane. In addition, the crystal structure illustrated in FIGS. 27A and 27B has a triangular or hexagonal (regular triangular, or regular hexagonal) atomic arrangement of metal atoms in the direction perpendicular to the a-b plane. Therefore, in the case where the target having the crystal structure illustrated in FIGS. 27A and 27B is used, the probability of the sputtered particle 1002 becoming a pellet-shape having hexagonal planes with the internal angles of 120° or triangle planes with the internal angles of 60° is thought to be high. Note that the sputtered particle 1002 illustrated in FIGS. 25A and 25B has hexagonal planes with the internal angles of 120°, but the sputtered particle 1002 can have triangle planes with the internal angles of 60°. For example, as illustrated in FIG. 26, the minimum unit of the sputtered particle 1002 is likely to have a shape having triangle planes with the internal angles of 60°. In this case, the sputtered particle 1002 having a hexagonal shape with the internal angles of 120° is thought to be a shape where six sputtered particles 1002 with triangle planes with the internal angles of 60° are unified. The target 1000 is located in an upper portion in FIG. 25A, and the target 1000 is located in a lower portion in FIG. 26.

It is preferable that the sputtered particle 1002 be charged as illustrated in FIG. 25. When corner portions of the sputtered particle 1002 have charges with the same polarity, interaction occurs such that the shape of the sputtered particle 1002 can maintain, which is preferable. For example, the sputtered particle 1002 may be positively charged. However, there is no particular limitation on the timing at which the sputtered particle 1002 is positively charged. The sputtered particle 1002 can be charged positively by receiving a charge at collision of the ion 1001, for example. In addition, the sputtered particle 1002 can be charged positively by being subjected to the plasma 1007, for example. Further alternatively, the ion 1001 which is an oxygen cation is preferably bonded to a side surface, a top surface, or a bottom surface of the sputtered particle 1002, whereby the sputtered particle 1002 is positively charged.

It is preferable to use a direct-current (DC) power source to positively charge the corner portions of the sputtered particle 1002. Note that a radio frequency (RF) power source or an alternating-current (AC) power source can also be used. Note that it is difficult to discharge plasma uniformly over a wide area by a sputtering method using an RF source. Therefore, the sputtering method using an RF source is difficult to be applied to deposition over the large area of a substrate. In addition, a DC power source is preferred to an AC power source on the basis of aspects described below depending on cases.

In a sputtering method using a DC source, a direct current is applied between a target and a substrate, for example, as illustrated in FIG. 28A1. Accordingly, the potential difference between the target and the substrate while a direct-current voltage is being applied is constant as illustrated in FIG. 28B1. The sputtering method using a DC source can maintain persistent plasma discharge.

In the sputtering method using a DC source, the sputtered particle 1002 is being subjected to an electric field and thus a charge at the corner portion of the sputtered particle 1002 is not lost. The shape of the sputtered particle 1002 can be maintained by a charge held at the corner portion (FIG. 28C1).

On the other hand, in the sputtering method using an AC source, for example, as illustrated in FIG. 28A2, a cathode and an anode of adjacent targets are switched between Period A and Period B. For example, in Period A as illustrated in FIG. 28B2, a target (1) serves as a cathode and a target (2) serves as an anode. In addition, for example, in Period B illustrated in FIG. 28B2, the target (1) serves as an anode and the target (2) serves as a cathode. The sum of Period A and Period B is about 20 microseconds to 50 microseconds, for example. As described above, in the sputtering method using an AC source, Period A and Period B are switched alternately to discharge plasma.

In the sputtering method using an AC source, the sputtered particle 1002 is not subjected to an electric field instantly, and thus the charge at the corner portion may be lost. Thus, the shape of the sputtered particle 1002 may be broken by the loss of the charge at the corner portion (FIG. 28C2). Accordingly, the DC source is preferred to maintain the shape of the sputtered particle 1002, as compared with the AC source.

As illustrated in FIG. 25, the sputtered particle 1002 that has blasted off from the target flies in the plasma 1007 like a kite. Then, the sputtered particle 1002 flutters down on a deposition surface. Then, the sputtered particle 1002 glides over the deposition surface like a hang glider when the deposition surface is at high temperatures (e.g., 150° C. or higher) by substrate heating. At this time, the sputtered particle 1002 has a charge at the corner portion of the sputtered particle 1002, and thus repulsion between the sputtered particle 1002 and another sputtered particle 1002 that have been deposited is generated, for example. In addition, migration of the sputtered particle 1002 occurs over the high-temperature deposition surface, for example. Therefore, the sputtered particle 1002 migrates to an area where no sputtered particle 1002 is deposited on an outer surface and bonds to the side of another sputtered particle 1002, thereby being deposited. In this manner, the sputtered particles 1002 are spread with flat plate planes so as to be parallel with the deposition surface. The oxide layer 1003 formed in this manner has, for example, crystals with c-axes aligned in the direction perpendicular to the deposition surface (c-axis aligned crystal, CAAC). In addition, the oxide layer 1003 is, for example, an oxide layer having a uniform thickness and aligned orientations of crystals. As described above, the sputtered particles are not deposited randomly. The sputtered particles which are charged interact with each other and are deposited orderly so that c-axes are aligned in a direction perpendicular to the deposition surface.

The oxide layer formed in this manner has a high crystallinity even over an amorphous surface, an amorphous insulating surface, an amorphous oxide surface, or the like.

Next, a formation method of an oxide layer when the temperature of a deposition surface is low by no substrate heating or the like is described with reference to FIGS. 29A and 29B (for example, the temperature is lower than 130° C., lower than 100° C., lower than 70° C. or at room temperatures (20° C. to 25° C.)).

Figure 29A:
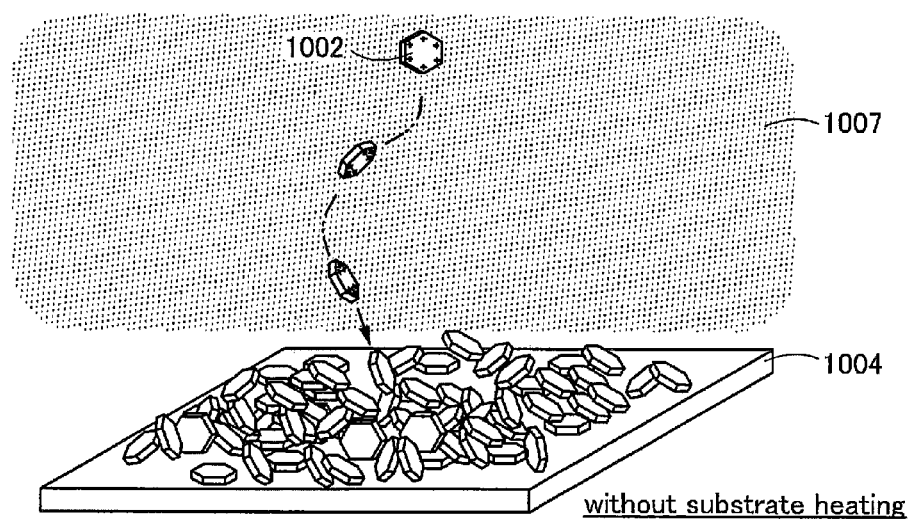
FIGS. 29A and 29B are diagrams illustrating a state in which sputtered particles reach a deposition surface.
Figure 29B:
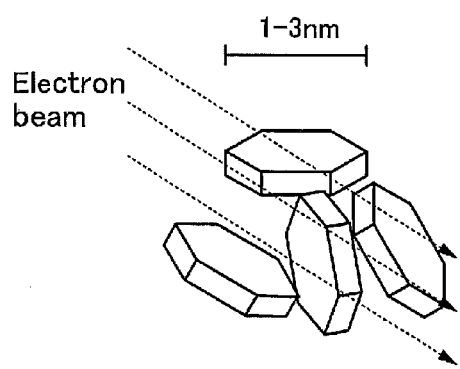

In FIG. 29A, when the deposition surface has a low temperature, the sputtered particle 1002 flutters down on the deposition surface randomly. The sputtered particle 1002 does not migrate and thus is deposited at random in areas including an area where another sputtered particle 1002 is deposited, for example. In other words, the thickness of the deposited oxide layer is not uniform and the orientation of crystals is irregular in some cases. The oxide layer deposited in this manner has a crystal part (nanocrystal) because the crystallinity of the sputtered particle 1002 has been maintained to some degree.

For example, the size of the nanocrystal is assumed to be about 1 nm to 3 nm. When a sample is an extremely thin slice (5 nm to 10 nm), spots or a circular region with high luminance is observed depending on observation positions in a nanobeam electron diffraction pattern. This is likely because in the position of the circular region with high luminance, spots of another pellet-like crystal existing in the depth direction are also observed as a result of the electron beam passing through a pellet-like crystal (see FIG. 29B).

In addition, for example, when the pressure during deposition is high, the sputtered particle 1002 that is flying collides with another particle (such as atom, molecule, ion, radical, or the like) of argon or the like in higher frequency. The crystal structure of the sputtered particle 1002 may be broken when the sputtered particle 1002 that is flying collides with another particle (the sputtered particle 1002 is re-sputtered). For example, when the sputtered particle 1002 collides with another particle, the flat-plate shape of the sputtered particle 1002 cannot be maintained to be broken into pieces (separated into atoms) in some cases. At this time, each atom separated from the sputtered particle 1002 is deposited on the deposition surface so that an amorphous oxide layer is formed in some cases.

In addition, when a process in which a liquid is used or a process in which a solid target is vaporized is employed instead of a sputtering method using a target having a polycrystalline oxide as a starting point, separated atoms fly and are deposited on a deposition surface and thus an amorphous oxide layer is formed in some cases. In addition, for example, in a laser ablation method, atoms, molecules, ions, radicals, clusters, or the like released from a target fly and are deposited on the deposition surface so that an amorphous oxide layer is formed in some cases.

Through the process described above, the oxide layer can be formed. The detail of a sputtering apparatus with which the oxide layer is formed is described below.

After the oxide layer 136c is formed, first heat treatment is preferably formed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more, or under reduced pressure. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor layer 136b can be improved, and in addition, impurities such as hydrogen and water can be removed from the oxide insulating film 136b. In addition, by the first heat treatment, the DOS in the oxide semiconductor layer 106b is reduced, so that the oxide semiconductor layer 106b is highly purified. The description of high purification process can be referred to as for the reduction of DOS.

Figure 13B:
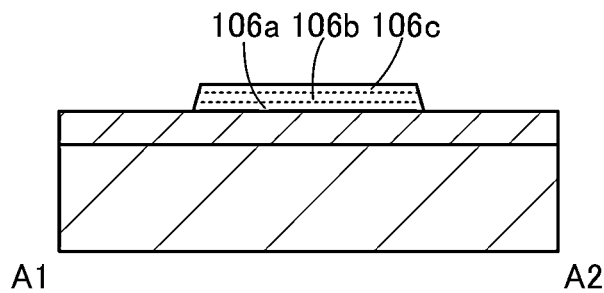
Figure 13C:
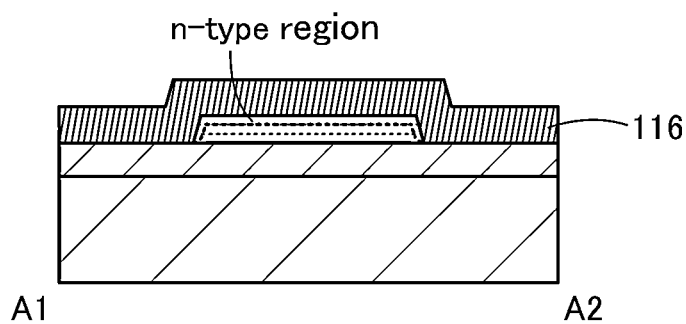

Next, the oxide layer 136a, the oxide semiconductor layer 136b, and the oxide layer 136c are partially etched, so that an island-like oxide layer 106a, an island-like oxide semiconductor layer 106b, and an island-like oxide layer 106c are formed (see FIG. 13B).

Then, a conductive film 116 is formed. The conductive film 116 may be a conductive film selected from the conductive films listed for the source electrode 116a and the drain electrode 116b. The conductive film 116 can be deposited by a sputtering method, a CVD method, an MBE method, an ALD method, or a PLD method. At this time, n-type regions are formed in regions represented by broken lines in the oxide layer 106a, the oxide semiconductor layer 106b, and the oxide layer 106c (see FIG. 13C). The n-type regions are formed resulting from generation of oxygen vacancies in the oxide layer 106c due to damages when the conductive film 116 is formed over the oxide layer 106c or action of the conductive film 116. For example, due to entry of hydrogen into the site of oxygen vacancies, an electron serving as a carrier is generated. Note that the n-type regions are formed up to the vicinity of the boundary between the oxide layer 106c and the oxide semiconductor layer 106b as a non-limiting example illustrated. For example, the n-type regions may be formed in the oxide layer 106c and the oxide semiconductor layer 106b, or only in the oxide layer 106c.

Figure 13D:
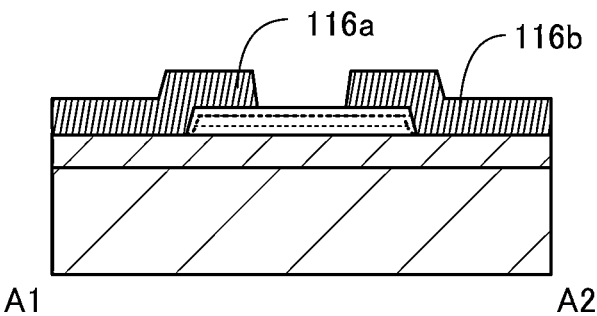

Then, the conductive film 116 is partially etched so that the source electrode 116a and the drain electrode 116b are formed (see FIG. 13D).

Then, second heat treatment is preferably performed. The second heat treatment is preferably performed under conditions selected from the conditions listed for the first heat treatment. By the second heat treatment, the n-type region where the oxide layer 106c is exposed can be turned into an i-type region (see FIG. 14A). Therefore, in the oxide layer 106c, the n-type regions can be formed only just under the source electrode 116a and the drain electrode 116b. Due to the n-type regions, the contact resistance between the oxide layer 106c and the source electrode 116a and the drain electrode 116b can be reduced, so that the amount of on-state current of a transistor can be increased. In addition, the second heat treatment can serve as also the first heat treatment.

Figure 14A:
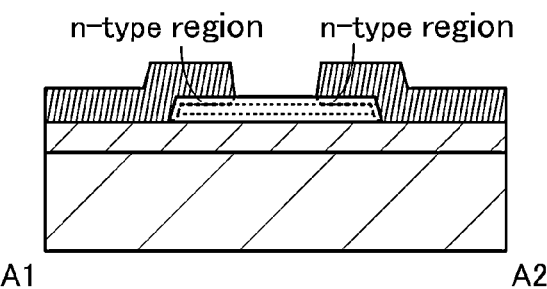
FIGS. 14A to 14D are cross-sectional views illustrating an example of a method for manufacturing a transistor in accordance with an embodiment of the present invention.
Figure 14B:
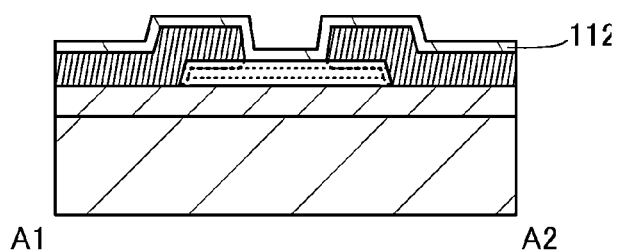

Next, the gate insulating film 112 is formed (see FIG. 14B). The gate insulating film 112 may be formed by a sputtering method, a CVD method, an MBE method, an ALD method, or a PLD method.

Then, a conductive film to serve as the gate electrode 104 is formed. The conductive film to serve as the gate electrode 104 can be selected from the conductive films listed for the gate electrode 104. The conductive film to serve as the gate electrode 104 may be formed by a sputtering method, a CVD method, an MBE method, an ALD method, or a PLD method.

Figure 14C:
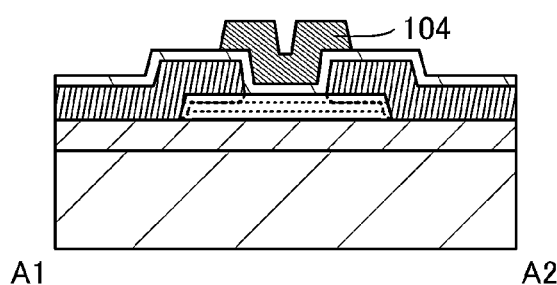

Next, the conductive film to serve as the gate electrode 104 is partly etched to form the gate electrode 104 (see FIG. 14C).

Then, the protective insulating film 108 is formed. The protective insulating film 108 may be formed by a sputtering method, a CVD method, an MBE method, an ALD method, or a PLD method.

Figure 14D:
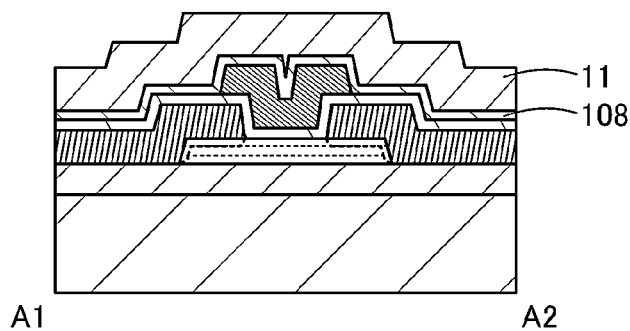

Then, the protective insulating film 118 is formed (see FIG. 14D). The protective insulating film 118 can be deposited by a sputtering method, a CVD method, an MBE method, an ALD method, or a PLD method.

Next, third heat treatment is preferably performed. The third heat treatment may be performed under any of the conditions listed for the first heat treatment or may be performed at temperature lower than the temperatures for the first heat treatment and the second heat treatment.

Through the above steps, the transistor illustrated in FIGS. 11A to 11C can be fabricated.

<Manufacturing Apparatus>

When the concentration of impurities contained in the oxide semiconductor layer 106b is low and the defect density is also low (in other words, the oxide semiconductor layer 106b is a highly purified and intrinsic), the transistor has stable electric characteristics. Moreover, with the oxide semiconductor layer 106b with higher crystallinity than that of the oxide semiconductor layer with an amorphous structure, the electric characteristics of the transistor are stable. A deposition apparatus for depositing the oxide semiconductor layer 106b with a low impurity concentration and high crystallinity is described below. The deposition apparatus described below can be used for formation of other components of transistors. With use of the deposition apparatus, the impurity concentrations of other components can be reduced.

First, a structure of a deposition apparatus which allows the entry of few impurities during deposition is described with reference to FIGS. 30A and 30B.

Figure 30A:
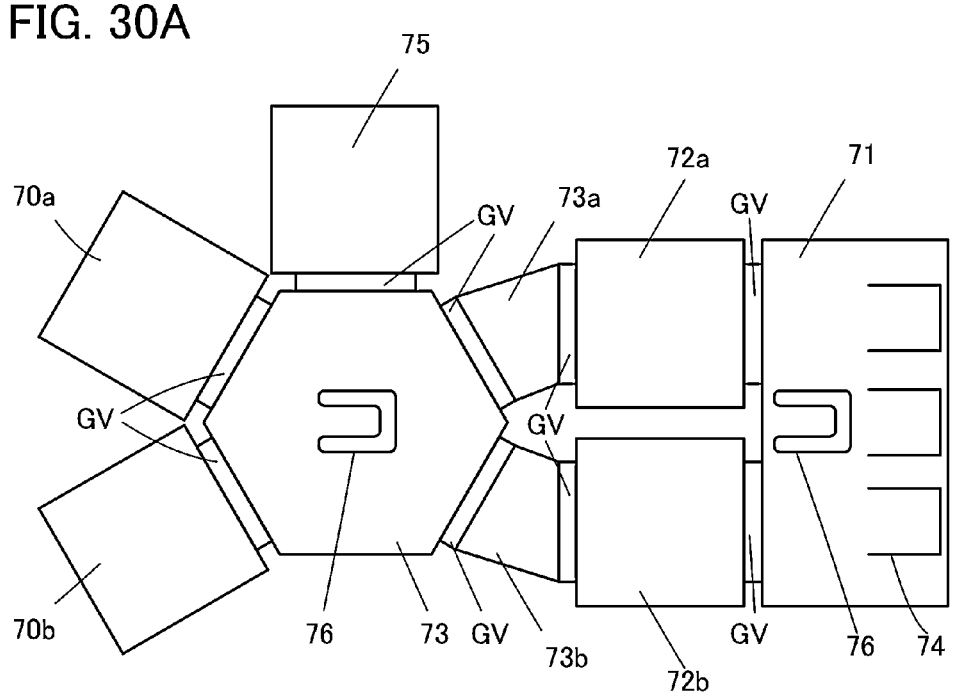
FIGS. 30A and 30B are each a top view illustrating an example of a deposition apparatus.

FIG. 30A is a top view of a multi-chamber deposition apparatus. The deposition apparatus includes an atmosphere-side substrate supply chamber 71 provided with three cassette ports 74 for holding substrates, a load lock chamber 72a, an unload lock chamber 72b, a transfer chamber 73, a transfer chamber 73a, a transfer chamber 73b, a substrate heating chamber 75, a deposition chamber 70a, and a deposition chamber 70b. The atmosphere-side substrate supply chamber 71 is connected to the load lock chamber 72a and the unload lock chamber 72b. The load lock chamber 72a and the unload lock chamber 72b are connected to the transfer chamber 73 through the transfer chamber 73a and the transfer chamber 73b, respectively. The substrate heating chamber 75, the deposition chamber 70a, and the deposition chamber 70b are connected only to the transfer chamber 73. Gate valves (GV) are provided for connecting portions between chambers so that each chamber except the atmosphere-side substrate supply chamber 71 can be independently kept under vacuum. Moreover, the atmosphere-side substrate supply chamber 71 and the transfer chamber 73 each include one or more transfer robots 76, with which a substrate can be transferred. The substrate heating chamber preferably serves as a plasma treatment chamber. Here, the substrate heating chamber 75 preferably also serves as a plasma treatment chamber. With a multi-chamber deposition apparatus, it is possible to transfer a substrate without exposure to the air between treatments, and adsorption of impurities to a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and can be determined as appropriate depending on the space for placement or the process.

Figure 30B:
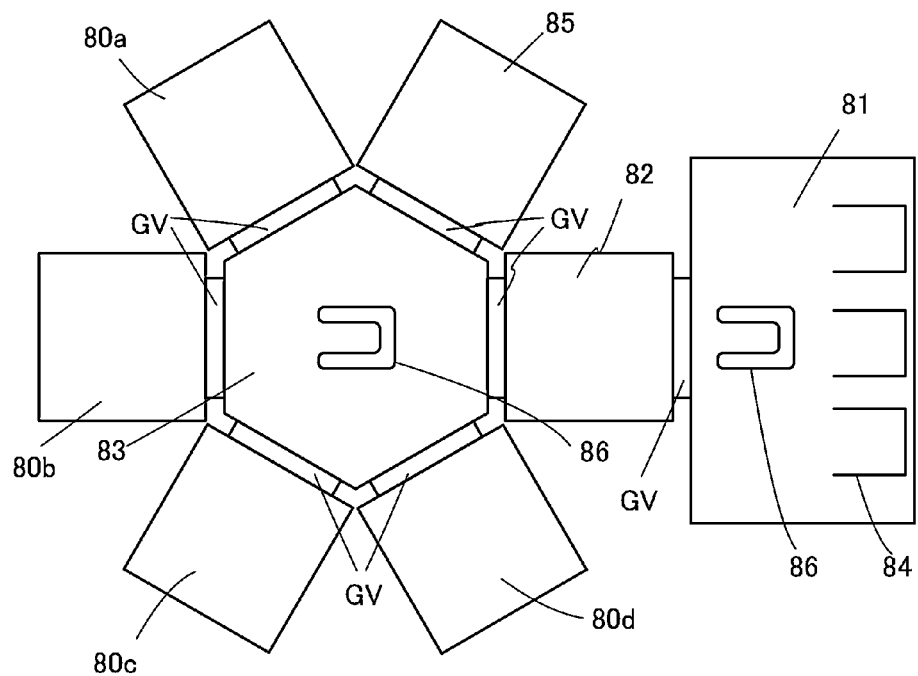

FIG. 30B is a top view of a multi-chamber deposition apparatus whose structure is different from that illustrated in FIG. 30A. The deposition apparatus includes an atmosphere-side substrate supply chamber 81 having a cassette port 84, a load/unload lock chamber 82, a transfer chamber 83, a substrate heating chamber 85, a substrate transfer robot 86, a deposition chamber 80a, a deposition chamber 80b, a deposition chamber 80c, and a deposition chamber 80d. The atmosphere-side substrate supply chamber 81, the substrate heating chamber 85, the deposition chamber 80a, the deposition chamber 80b, the deposition chamber 80c, and the deposition chamber 80d are connected to one another through the transfer chamber 83.

Here, the details of the deposition chamber (sputtering chamber) illustrated in FIG. 30B are described with reference to FIG. 31A. The deposition chamber 80b includes a target 87, an attachment protection plate 88, and a substrate stage 90, for example. Note that here, a glass substrate 89 is placed on the substrate stage 90. Although not illustrated, the substrate stage 90 may include a substrate holding mechanism which holds the glass substrate 89, a rear heater which heats the glass substrate 89 from the back surface, or the like. The attachment protection plate 88 can suppress deposition of a particle which is sputtered from the target 87 on a region where deposition is not needed.

Figure 31A:
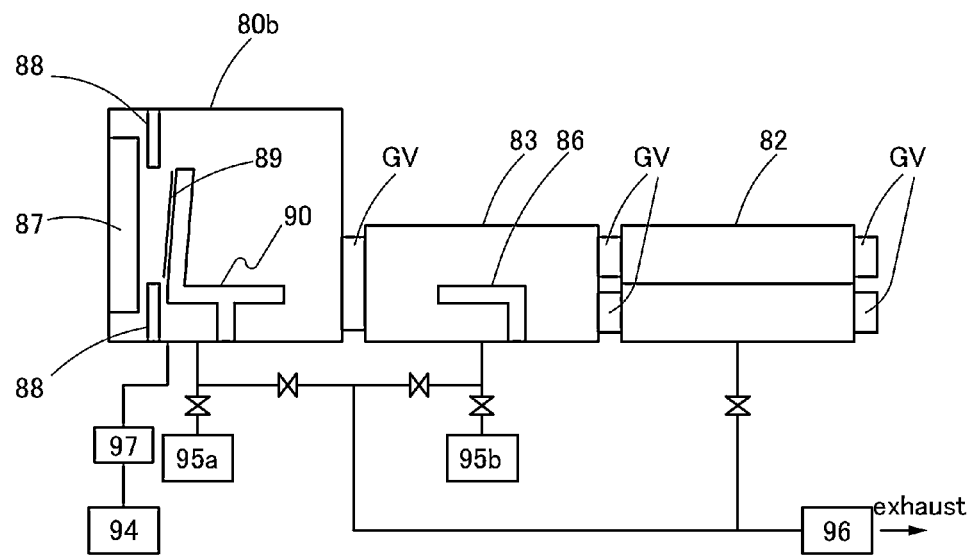
FIGS. 31A and 31B are each a cross-sectional view illustrating an example of a deposition chamber.

The deposition chamber 80b illustrated in FIG. 31A is connected to a refiner 94 through a mass flow controller 97. Note that although the refiner 94 and the mass flow controller 97 are provided in accordance with the number of kinds of gases, only one refiner 94 and one mass flow controller 97 are illustrated for simplicity. As a gas introduced to the deposition chamber 80b or the like, a gas whose dew point is lower than or equal to −80° C., preferably lower than or equal to −100° C., more preferably lower than or equal to −120° C. is used. With the use of an oxygen gas, a rare gas (e.g., an argon gas), or the like whose dew point is low, moisture entering a film at the time of deposition can be reduced.

Note that the vacuum pump 96 may be, for example, a pump in which a dry pump and a mechanical booster pump are connected in series. With such a structure, the deposition chamber 80b and the transfer chamber 83 are evacuated from atmospheric pressure to a low vacuum (about 0.1 Pa to 10 Pa) by the vacuum pump 96, and then evacuated from the low vacuum to a high vacuum ($1\times10^{-7}$ Pa to $1\times10^{-4}$ Pa) by the cryopump 95a or 95b after the valves are switched.

Next, another example of the deposition chamber illustrated in FIG. 30B will be described with reference to FIG. 31B.

Figure 31B:
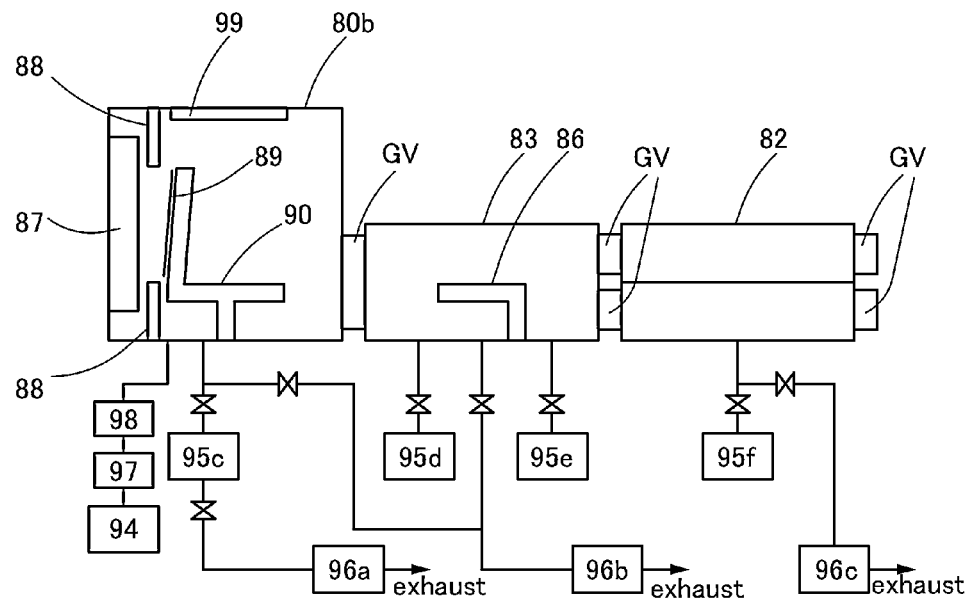

The deposition chamber 80b illustrated in FIG. 31B is connected to the transfer chamber 83 via the gate valve, and the transfer chamber 83 is connected to the load/unload lock chamber 82 via the gate valve.

The deposition chamber 80b in FIG. 31B is connected to the mass flow controller 97 through a gas heating system 98, and the gas heating system 98 is connected to the refiner 94 through the mass flow controller 97. With the gas heating system 98, a gas to be used for the deposition chamber 80b can be heated to a temperature higher than or equal to 40° C. and lower than or equal to 400° C., or higher than or equal to 50° C. and lower than or equal to 200° C. Note that although the gas heating system 98, the refiner 94, and the mass flow controller 97 can be provided in accordance with the number of kinds of gases, only one gas heating system 98, one refiner 94, and one mass flow controller 97 are provided for simplicity.

The deposition chamber 80b in FIG. 31B is connected to each of a turbo molecular pump 95c and a vacuum pump 96b with valves positioned therebetween. Note that as an auxiliary pump, a vacuum pump 96a is provided for the turbo molecular pump 95c through a valve. The vacuum pump 96a and the vacuum pump 96b can have structures similar to the structure of the vacuum pump 96. In addition, the deposition chamber 80b in FIG. 31B is provided with a cryotrap 99.

It is known that the turbo molecular pump 95c is capable of stably evacuating a large-sized molecule (atom), needs low frequency of maintenance, and thus enables high productivity, whereas it has a low capability in evacuating hydrogen and water. Hence, the cryotrap 99 having a high capability in evacuating a molecule (atom) having a relatively high melting point, such as water, is connected to the deposition chamber 80b. The temperature of a refrigerator of the cryotrap 99 is set to be lower than or equal to 100 K, preferably lower than or equal to 80 K. When the cryotrap 99 includes a plurality of refrigerators, the refrigerators preferably have different temperatures, in which case efficient evacuation can be performed. For example, the temperatures of a first-stage refrigerator and a second-stage refrigerator may be set at 100 K or lower and 20 K or lower, respectively.

The transfer chamber 83 in FIG. 31B is connected to the vacuum pump 96b and cryopumps 95d and 95e through respective valves. In the case of one cryopump, evacuation cannot be performed while the cryopump is in regeneration; however, in the case of two or more cryopumps which are connected in parallel, even when one of the cryopumps is in regeneration, evacuation can be performed using any of the other cryopumps. Note that regeneration of a cryopump refers to treatment for discharging molecules (atoms) entrapped in the cryopump. When molecules (or atoms) are entrapped too much in a cryopump, the evacuation capability of the cryopump is lowered; therefore, regeneration is performed regularly.

The load and unload lock chamber 82 in FIG. 31B is connected to a cryopump 95f and a vacuum pump 96c each with a valve positioned therebetween. Note that the vacuum pump 96c may have a structure similar to that of the vacuum pump 96.

In the deposition chamber 80b, a target-facing-type sputtering apparatus may be employed. Note that a parallel-plate-type sputtering device or an ion beam sputtering apparatus may be provided in the deposition chamber 80b.

Next, an evacuation example of the substrate heating chamber illustrated in FIG. 30B is described with reference to FIG. 32.

Figure 32:
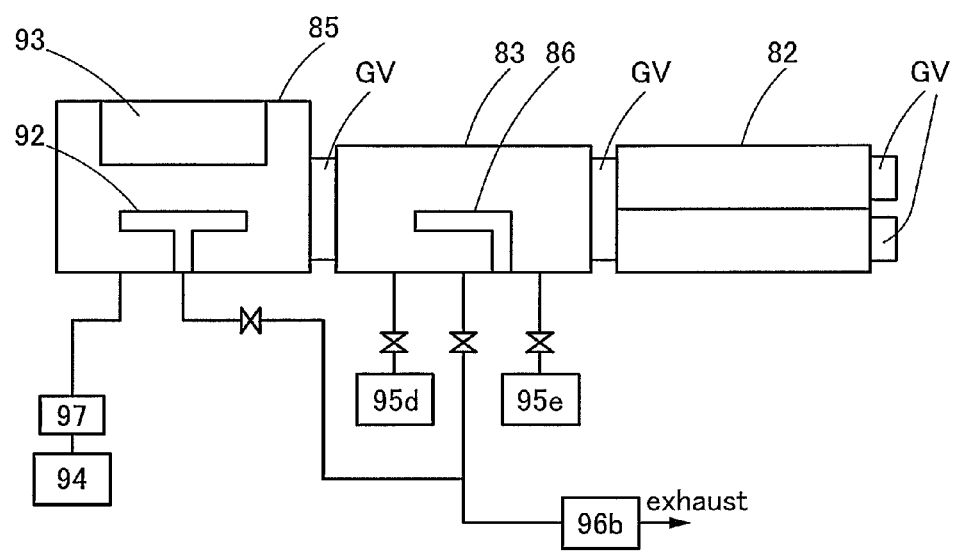
FIG. 32 illustrates an example of a heat treatment chamber.

The substrate heating chamber 85 illustrated in FIG. 32 is connected to the transfer chamber 83 through a gate valve. Note that the transfer chamber 83 is connected to the load/unload lock chamber 82 through a gate valve.

The substrate heating chamber 85 in FIG. 32 is connected to the refiner 94 through the mass flow controller 97. Note that although the refiner 94 and the mass flow controller 97 are provided in accordance with the number of kinds of gases, only one refiner 94 and one mass flow controller 97 are illustrated for simplicity. In addition, the substrate heating chamber 85 is connected to the vacuum pump 96b through a valve.

In addition, the substrate heating chamber 85 includes a substrate stage 92. At least one substrate is set on the substrate stage 92, and a substrate stage on which a plurality of substrates can be set may be used as the substrate stage 92. The substrate heating chamber 85 also includes a heating mechanism 93. The heating mechanism 93 may be the one using a resistance heater for heating, for example. Alternatively, heat conduction or heat radiation from a medium such as a heated gas may be used as the heating mechanism. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas. The RTA apparatus enables heat treatment in a short time; thus, bending of the substrate caused by the heat treatment can be reduced. In particular, in a large glass substrate, bending may cause a reduction in yield of a semiconductor device even at a small amount. Accordingly, the RTA apparatus is preferably used for heat treatment at a high temperature such that a substrate is bent.

Note that the back pressure of each of the deposition chamber 80b and the substrate heating chamber 85 is lower than or equal to $1 \times 10^{-4}$ Pa, preferably lower than or equal to $3 \times 10^{-5}$ Pa, more preferably lower than or equal to $1 \times 10^{-5}$ Pa. In each of the deposition chamber 80b and the substrate heating chamber 85, the partial pressure of a gas molecule (atom) having a mass-to-charge ratio (m/z) of 18 is lower than or equal to $3 \times 10^{-5}$ Pa, preferably lower than or equal to $1 \times 10^{-5}$ Pa, more preferably lower than or equal to $3 \times 10^{-6}$ Pa. Moreover, in each of the deposition chamber 80b and the substrate heating chamber 85, the partial pressure of a gas molecule (atom) having a mass-to-charge ratio (m/z) of 28 is lower than or equal to $3 \times 10^{-5}$ Pa, preferably lower than or equal to $1 \times 10^{-5}$ Pa, more preferably lower than or equal to $3 \times 10^{-6}$ Pa. Moreover in each of the deposition chamber 80b and the substrate heating chamber 85, the partial pressure of a gas molecule (atom) having a mass-to-charge ratio (m/z) of 44 is lower than or equal to $3 \times 10^{-5}$ Pa, preferably lower than or equal to $1 \times 10^{-5}$ Pa, more preferably lower than or equal to $3 \times 10^{-6}$ Pa.

Further, in each of the deposition chamber 80b and the substrate heating chamber 85, the leakage rate is less than or equal to $3 \times 10^{-6}$ Pa·m$^3$/s, preferably less than or equal to $1 \times 10^{-6}$ Pa·m$^3$/s. In each of the deposition chamber 80b and the substrate heating chamber 85, the leakage rate of a gas molecule (atom) having a mass-to-charge ratio (m/z) of 18 is less than or equal to $1 \times 10^{-7}$ Pa·m$^3$/s, preferably less than or equal to $3 \times 10^{-6}$ Pa·m$^3$/s. In each of the deposition chamber 80b and the substrate heating chamber 85, the leakage rate of a gas molecule (atom) having a mass-to-charge ratio (m/z) of 28 is less than or equal to $1 \times 10^{-5}$ Pa·m$^3$/s, preferably less than or equal to $1 \times 10^{-6}$ Pa·m$^3$/s. Moreover, in each of the deposition chamber 80b and the substrate heating chamber 85, the leakage rate of a gas molecule (atom) having a mass-to-charge ratio (m/z) of 44 is less than or equal to $3 \times 10^{-6}$ Pa·m$^3$/s, preferably less than or equal to $1 \times 10^{-6}$ Pa·m$^3$/s.

Note that the total pressure and the partial pressure in the vacuum chambers such as the deposition chamber, the substrate heating chamber, and the transfer chamber can be measured using a mass analyzer. For example, Qulee CGM-051, a quadruple mass analyzer (also referred to as Q-mass) manufactured by ULVAC, Inc. can be used. Note that a leakage rate can be derived from the total pressure and partial pressure measured using the mass analyzer. The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to gas released from an internal member. Measures need to be taken against of external leakage and internal leakage in order that the leakage rate be lower than or equal to the above value.

When an adsorbate is present in the deposition chamber, the adsorbate does not affect the pressure in the deposition chamber because it is adsorbed onto an inner wall or the like; however, the adsorbate causes gas to be released when the inside of the deposition chamber is evacuated. Therefore, it is important that the adsorbate present in the deposition chamber be desorbed as much as possible with use of a pump having high evacuation capability. Note that the deposition chamber may be baked to promote desorption of the adsorbate.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbate in the deposition chamber, and the impurities present in the deposition chamber can be reduced.

The rate of desorption of the adsorbate can be further increased also by dummy deposition. Here, the dummy desorption refers to desorption on a dummy substrate by a sputtering method or the like, in which a film is deposited on the dummy substrate and the inner wall of the deposition chamber so that impurities in the deposition chamber and an adsorbate on the inner wall of the deposition chamber are confined in the film. As the dummy substrate, a substrate which releases a smaller amount of gas is preferably used, and for example, a substrate similar to the substrate 100 described later may be used. By performing dummy desorption, the impurity concentration in a film to be formed later can be reduced. Note that the dummy deposition may be performed at the same time as the baking of the deposition chamber.

The formation of an oxide semiconductor layer 103b with the use of the above deposition apparatus can prevent impurities from entering the oxide semiconductor layer 106b. Further, a film in contact with the oxide semiconductor layer 106b is formed with the use of the above film formation apparatus, so that the entry of impurities into the oxide semiconductor layer 106b from the film in contact therewith can be suppressed.

Next, a method is described in which the oxide layer 106a, the oxide semiconductor layer 106b, and the oxide layer 106c are formed successively with the above-described deposition apparatus.

The oxide layer 106a is formed first. The impurity concentration of the oxide layer 106a becomes lower as the heating temperature at deposition is higher. For example, the substrate temperature at deposition is from 150° C. to 500° C., preferably, 170° C. to 450° C. The substrate is transferred to the deposition chamber, a source gas is introduced, and the substrate is held under the pressure for longer than or equal to 10 seconds and shorter than or equal to 1000 seconds, preferably longer than or equal to 15 seconds and shorter than or equal to 720 seconds in order to stabilize the pressure, so that the oxide layer 106a is formed. The substrate is held for the above period of time in order to stabilize the pressure, whereby the amount of impurities entering the oxide layer 106a during the formation can be reduced.

Then, the substrate is put into another deposition chamber, so that the oxide semiconductor layer 106b is formed. The impurity concentration of the oxide semiconductor layer 106b becomes lower as the heating temperature at deposition is higher. For example, the substrate temperature at deposition is from 150° C. to 500° C., preferably, 170° C. to 450° C. The oxide semiconductor layer 106b is formed after the following steps: a substrate is transferred to the deposition chamber; a deposition gas is supplied; the deposition pressure is kept for 10 seconds to 1000 seconds, preferably from 15 seconds to 720 seconds to be stabilized. Since the deposition pressure is kept for the above period of time to be stabilized, the amount of impurities entering the oxide semiconductor layer 106b during the deposition can be reduced.

Then, the substrate is put into another deposition chamber, so that the oxide layer 106c is formed. The impurity concentration of the oxide layer 106c becomes lower as the heating temperature at deposition is higher. For example, the substrate temperature at deposition is from 150° C. to 500° C., preferably, 170° C. to 450° C. The oxide layer 106c is formed after the following steps: a substrate is transferred to the deposition chamber; a deposition gas is supplied; the deposition pressure is kept for 10 seconds to 1000 seconds, preferably from 15 seconds to 720 seconds to be stabilized. Since the deposition pressure is kept for the above period of time to be stabilized, the amount of impurities entering the oxide layer 106c during the deposition can be reduced.

Note that in the case where the oxide layer 106a, the oxide semiconductor layer 106b, and the oxide layer 106c are formed over a plurality of substrates, it is preferable that a rare gas, an oxygen gas, or the like be continuously supplied at a small amount even in a period during which the deposition is not performed. In that case, the pressure of the deposition chamber can be kept high; thus, counter flow of impurities from the evacuation system can be reduced. Release of impurities from a pipe, another member, or the like can be suppressed. Accordingly, impurities can be prevented from being mixed into the oxide layer 106a, the oxide semiconductor layer 106b, and the oxide layer 106c. For example, the flow rate of argon is greater than or equal to 1 sccm and less than or equal to 500 sccm, preferably greater than or equal to 2 sccm and less than or equal to 200 sccm, more preferably greater than or equal to 5 sccm and less than or equal to 100 sccm.

Next, heat treatment is performed. The heat treatment is performed in an inert atmosphere or an oxidation atmosphere. The heat treatment may be performed under a reduced pressure. The heat treatment can decrease the impurity concentration of the oxide layer 106a, the oxide semiconductor layer 106b, and the oxide layer 106c.

Preferably, the heat treatment is performed in an inert atmosphere first and then further performed after the atmosphere is switched to an oxidizing atmosphere with the temperature maintained. When the heat treatment is performed in an inert atmosphere, the concentration of impurities in the oxide layer 106a, the oxide semiconductor layer 106b, and the oxide layer 106c can be reduced; however, oxygen vacancies are likely to be caused at the same time. By the heat treatment in an oxidation atmosphere, the caused oxygen vacancies can be reduced.

Specifically, the concentration of hydrogen in each of the oxide layer 106a, the oxide semiconductor layer 106b, and the oxide layer 106c, which is measured by SIMS, can be lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

The concentration of carbon in each of the oxide layer 106a, the oxide semiconductor layer 106b, and the oxide layer 106c, which is measured by SIMS, can be lower than $5 \times 10^{19}$ atoms/cm$^3$, preferably lower than or equal to $5 \times 10^{18}$ atoms/cm$^3$, more preferably lower than or equal to $2 \times 10^{18}$ atoms/cm$^3$, still more preferably lower than or equal to $5 \times 10^{17}$ atoms/cm$^3$.

The oxide layer 106a, the oxide semiconductor layer 106b, and the oxide layer 106c are formed as described above, whereby the crystallinity of the oxide semiconductor layer 106a can be increased, and the concentrations of impurities in the oxide layer 106a, the oxide semiconductor layer 106b, and the oxide layer 106c, at the interface between the oxide layer 106a and the oxide semiconductor layer 106b, and at the interface between the oxide layer 106c and the oxide semiconductor layer 106b can be reduced.

<Transistor Structure (2)>

Next, a top-gate and top-contact transistor having a structure different from that of the transistor structure (1) is described as an example.

Figure 15A:
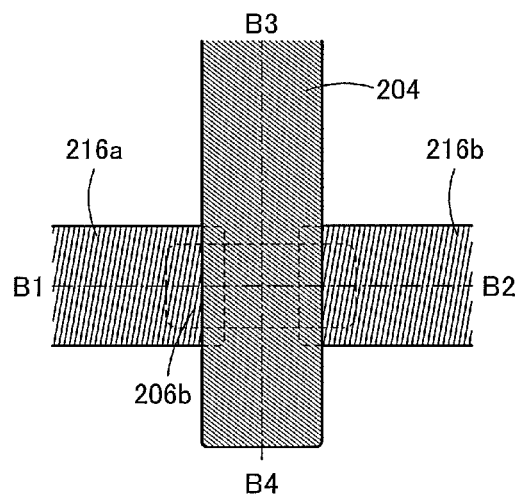
FIGS. 15A to 15C are a top view and cross-sectional views illustrating an example of a transistor in accordance with one embodiment of the present invention.
Figure 15C:
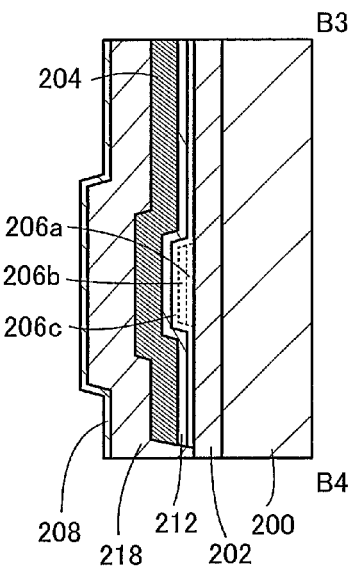
Figure 15B:
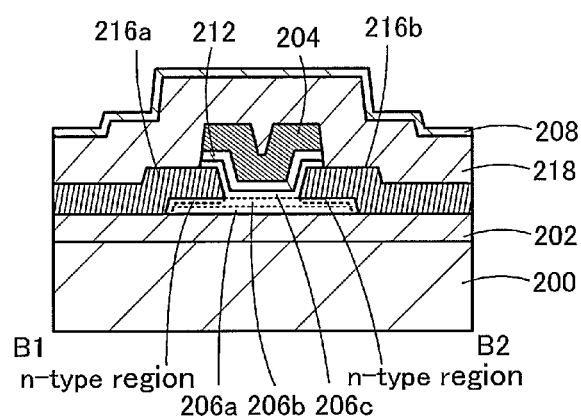

FIGS. 15A and 15B are a top view and cross-sectional views of a transistor. FIG. 15A is a top view of the transistor. FIG. 15B is the cross-sectional view taken along the dashed-dotted line B1-B2 in FIG. 15A. FIG. 15C is the cross-sectional view taken along the dashed-dotted line B3-B4 in FIG. 15A.

The transistor illustrated in FIG. 15B includes a base insulating film 202 over a substrate 200; an oxide layer 206a over the base insulating film 202; an oxide semiconductor layer 206b over the oxide layer 206a; a source electrode 216a and a drain electrode 216b in contact with the oxide semiconductor layer 206b; an oxide layer 206c over the oxide semiconductor layer 206b, the source electrode 216a, and the drain electrode 216b; a gate insulating film 212 over the oxide layer 206c; and a gate electrode 204 over the gate insulating film 212. Preferably, a protective insulating film 218 is formed over the gate insulating film 212 and the gate electrode 204, and a protective insulating film 208 is formed over the protective insulating film 218. Note that the transistor does not necessarily include the base insulating film 202.

The base insulating film 202 of the transistor illustrated in FIGS. 15A to 15C corresponds to the gate insulating film (bg) of the transistor in FIG. 9A. The transistor illustrated in FIGS. 15A to 15C may have, for example, the gate electrode (bg) of the transistor in FIG. 9A. The transistor illustrated in FIGS. 15A to 15C may have, for example, a back gate electrode that is opposite to the gate electrode 204 and in contact with the bottom surface of the base insulating film 202. In addition, in the transistor illustrated in FIGS. 15A to 15C, when the substrate 200 has a conductivity, the substrate 200 can correspond to the gate electrode (bg) of the transistor in FIG. 9A, for example. In addition, in the transistor illustrated in FIGS. 15A to 15C, when a conductive film of a wiring or the like is located below the base insulating film 202, the conductive film can correspond to the gate insulating film (bg) of the transistor in FIG. 9A.

In the example illustrated in FIGS. 15A to 15C, the gate electrode 204, the gate insulating film 212, and the oxide layer 206c have substantially the same top areas (shapes in the top view illustrated), but the present invention is not limited to the example. For example, the oxide layer 206c and/or the gate insulating film 212 may be provided outside the gate electrode 204.

Depending on the kind of conductive film used for the source electrode 216a and the drain electrode 216b, oxygen is taken away from part of the oxide semiconductor layer 206b, or a mixed layer is formed, so that n-type regions are formed in the oxide semiconductor layer 206b.

Note that as illustrated in FIG. 15A, a part of the oxide semiconductor layer 206b is provided outside the gate electrode 204 in the top view. Note that the whole oxide semiconductor layer 206b may be provided inside the gate electrode 204. With such a structure, when light irradiation is performed from the gate electrode 204 side, generation of carriers in the oxide semiconductor layer 206b due to light can be prevented. In other words, the gate electrode 204 functions as a light-blocking film.

The positions of the protective insulating film 218 and the protective insulating film 208 may be reversed. For example, the protective insulating film 218 may be provided over the protective insulating film 208.

The description of the oxide layer 206a, the oxide semiconductor layer 206b, and the oxide layer 206c can be referred to for the description of the oxide layer 106a, the oxide semiconductor layer 106b, and the oxide layer 106c. The description of the base insulating film 102 is referred to for the description of the base insulating film 202. The description of the source electrode 116a and the drain electrode 116b is referred to for the description of the source electrode 216a and the drain electrode 216b. The description of the gate insulating film 112 is referred to for the description of the gate insulating film 212. The description of the gate electrode 104 is referred to for the description of the gate electrode 204. The description of the protective insulating film 118 is referred to for the description of the protective insulating film 218. The description of the protective insulating film 108 is referred to for the description of the protective insulating film 208. The description of the substrate 100 is referred to for the description of the substrate 200.

<Fabrication Method of Transistor Structure (2)>

An example of a method for fabricating a transistor structure (2) is described below.

FIGS. 16A to 16D and FIGS. 17A to 17D are cross-sectional views corresponding to FIG. 15B.

First, the substrate 200 is prepared.

Next, the base insulating film 202 is formed. For the base insulating film 202, refer to the description of the method for forming the base insulating film 102.

Figure 16A:
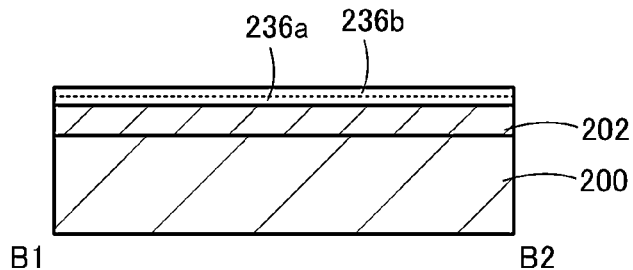
FIGS. 16A to 16D are cross-sectional views illustrating an example of a method for manufacturing a transistor in accordance with an embodiment of the present invention.

Then, an oxide layer 236a and an oxide semiconductor layer 236b are formed in this order (see FIG. 16A). The formation methods of the oxide layer 136a and the oxide semiconductor layer 136b can be referred to for the formation methods of the oxide layer 236a and the oxide semiconductor layer 236b.

Next, first heat treatment is preferably performed. For the first heat treatment, the description of the fabrication method of the transistor structure (1) is referred to.

Figure 16B:
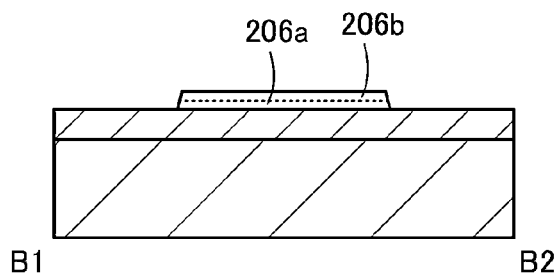

Then, the oxide layer 236a and the oxide semiconductor layer 236b are partially etched to form the oxide layer 206a and the oxide semiconductor layer 206b that have an island-shape (see FIG. 16B).

Figure 16C:
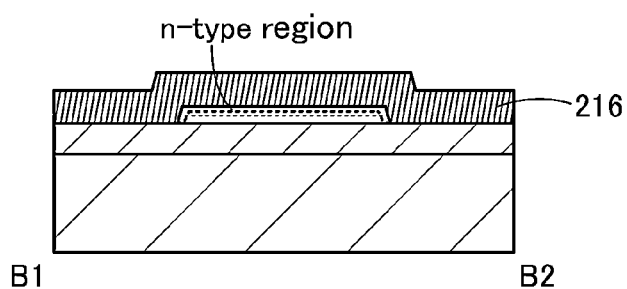
Figure 16D:
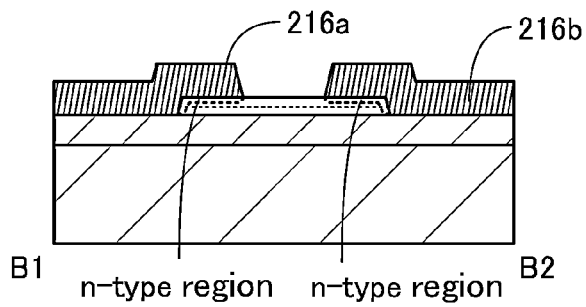

Then, a conductive film 216 is formed (see FIG. 16C). The formation method of the conductive film 116 can be referred to for the formation method of the conductive film 216.

The conductive film 216 is partially etched and thereby the source electrode 216a and the drain electrode 216b are formed.

Then, second heat treatment is preferably performed. Description made on the fabrication method of the transistor structure (1) can be referred to for the second heat treatment. By the second heat treatment, the n-type region in the oxide semiconductor layer 206b that is exposed can be turned into an i-type region in some cases (see FIG. 16D).

Figure 17A:
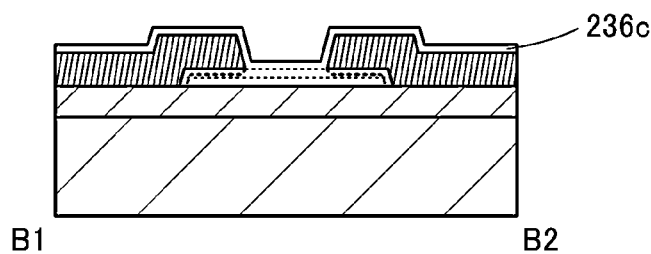
FIGS. 17A to 17D are cross-sectional views illustrating an example of a method for manufacturing a transistor in accordance with an embodiment of the present invention.

An oxide layer 236c is formed next (see FIG. 17A). The formation method of the oxide layer 136c can be referred to for the formation method of the oxide layer 236c.

An insulating film 242 is formed next. The formation method of the gate insulating film 112 can be referred to for the formation method of the insulating film 242.

The insulating film 242 can be formed by a plasma CVD method, for example. By the CVD method, a denser insulating film having a lower density of defects can be provided as a substrate temperature is higher. Because the insulating film 242 after being processed serves as the gate insulating film 212, a transistor can have more stable electric characteristics, as the insulating film 242 is denser and has a lower density of defects. On the other hand, when the base insulating film 202 contains excess oxygen, a transistor can have stable electric characteristics. However, by raising the substrate temperature when the base insulating film 202 is exposed, oxygen is released from the base insulating film 202, so that excess oxygen is reduced. Here, because the base insulating film 202 is covered with the oxide layer 236c at the time of formation of the insulating film 242, oxygen can be prevented from being released from the base insulating film 202. Therefore, the insulating film 242 can be dense and have a low density of defects, without reducing excess oxygen contained in the base insulating film 202. For this reason, the reliability of the transistor can be improved.

Figure 17B:
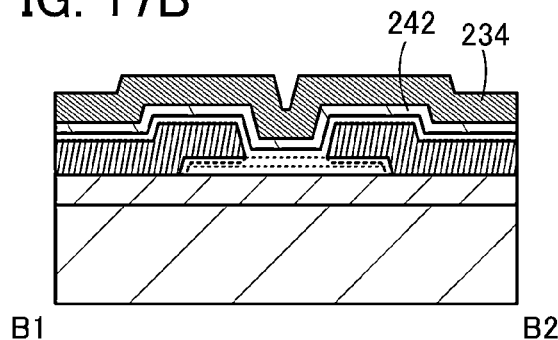

A conductive film 234 is formed next (see FIG. 17B). The formation method of the conductive film serving as the gate electrode 104 can be referred to for the formation method of the conductive film 234.

Figure 17C:
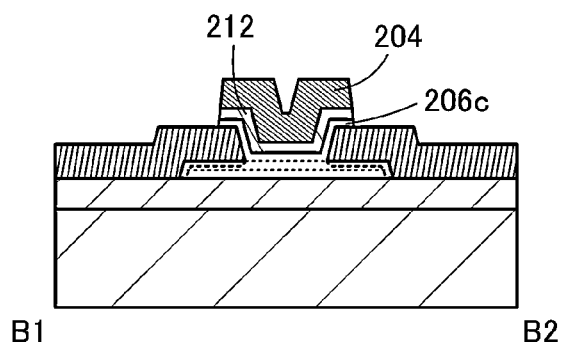

Then, the oxide layer 236c, the insulating film 242, and the conductive film 234 are partially etched to form an oxide layer 206c, a gate insulating film 212, and a gate electrode 204 (see FIG. 17C).

Then, the protective insulating film 218 is formed. For the method for forming the protective insulating film 218, the description of the method for forming the protective insulating film 118 is referred to.

Figure 17D:
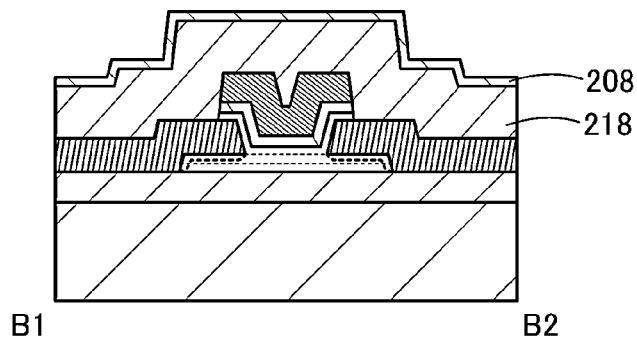

Next, the protective insulating film 208 is formed (see FIG. 17D). For the method for forming the protective insulating film 208, the description of the protective insulating film 108 is referred to.

Next, third heat treatment is preferably performed. For the third heat treatment, the description of the fabrication method of the transistor structure (1) is referred to.

Through the above steps, the transistor illustrated in FIGS. 15A to 15C can be fabricated.

<Transistor Structure (3)>

Next, an example of a bottom-gate and top-contact transistor is described.

Figure 18A:
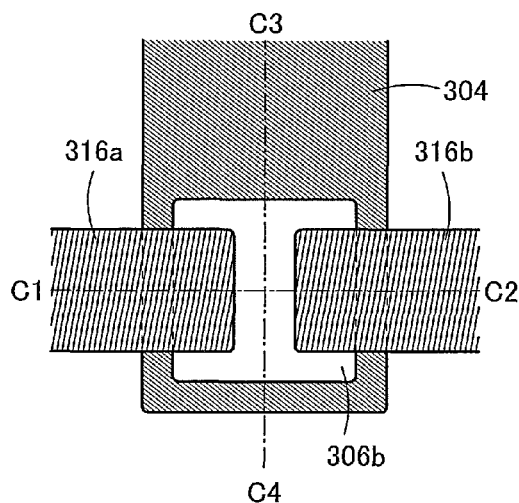
FIGS. 18A to 18D are a top view and cross-sectional views illustrating an example of a transistor of one embodiment of the present invention.
Figure 18C:
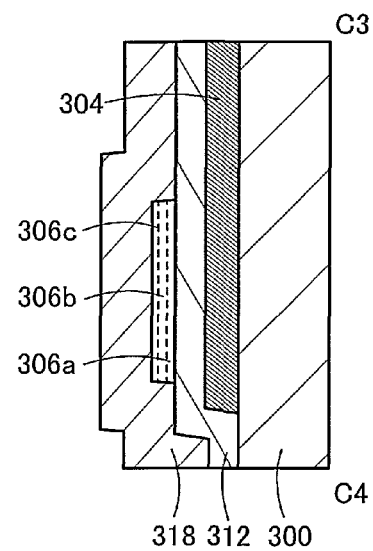
Figure 18B:
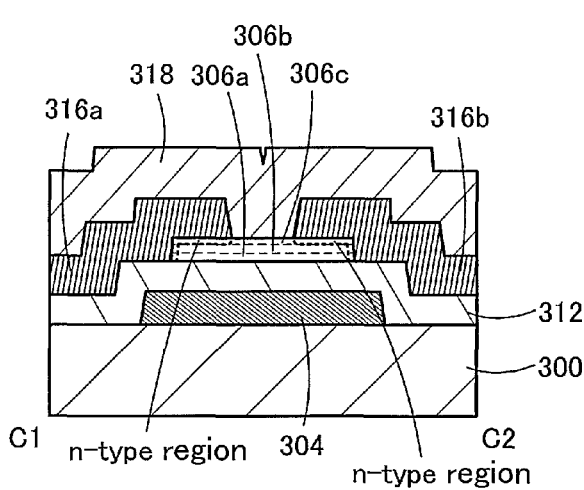

FIGS. 18A to 18D are a top view and cross-sectional views of a transistor. FIG. 18A is a top view of the transistor. FIG. 18B is the cross-sectional view taken along the dashed-dotted line C1-C2 in FIG. 18A. FIG. 18C is a cross-sectional view taken along the dashed-dotted line C3-C4 in FIG. 18A.

The transistor illustrated in FIG. 18B includes a gate electrode 304 over a substrate 300; a gate insulating film 312 over the gate electrode 304; an oxide layer 306a over the gate insulating film 312; an oxide semiconductor layer 306b over the oxide layer 306a; an oxide layer 306c over the oxide semiconductor layer 306b; and a source electrode 316a and a drain electrode 316b in contact with the oxide layer 306c. A protective insulating film 318 is preferably provided over the oxide layer 306c, the source electrode 316a, and the drain electrode 316b.

The protective insulating film 318 of the transistor illustrated in FIGS. 18A to 18C corresponds to, for example, the gate insulating film (bg) of the transistor illustrated in FIG. 9A. The transistor illustrated in FIGS. 18A to 18C may have, for example, the gate electrode (bg) of the transistor in FIG. 9A. The transistor illustrated in FIGS. 18A to 18C may have, for example, a back gate electrode in contact with the top surface of the protective insulating film 318, facing with the gate electrode 304. In addition, in the transistor illustrated in FIGS. 18A to 18C, when a conductive film of a wiring or the like is located above the protective insulating film 318, the conductive film can correspond to the gate insulating film (bg) of the transistor in FIG. 9A.

Depending on the kinds of the conductive film used for the source electrode 316a and the drain electrode 316b, oxygen is released from parts of the oxide semiconductor layer 306b and the oxide layer 306c or a mixed layer is formed, so that the n-type regions (low resistant regions) are formed in the oxide semiconductor layer 306b and the oxide layer 306c in some cases.

Note that as illustrated in FIG. 18A, the gate electrode 304 is provided such that the whole the oxide semiconductor layer 306b is located inside the gate electrode 304 in the top view.

By providing the gate electrode 304 at such a position, when light irradiation is performed from the gate electrode 304 side, generation of carriers in the oxide semiconductor layer 306b due to light can be suppressed. In other words, the gate electrode 304 functions as a light-blocking film. Note that the oxide semiconductor layer 306b may be provided outside the gate electrode 304.

The descriptions of the oxide layer 106c, the oxide semiconductor layer 106b, and the oxide layer 106a can be referred to for the oxide layer 306a, the oxide semiconductor layer 306b, and the oxide layer 306c. In other words, the bottom-gate and top-contact transistor has a reverse stacked structure of the top-gate and top-contact transistor.

The protective insulating film 318 may be formed of a single layer or a stacked layer using an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The protective insulating film 318 may be, for example, a multilayer film including a silicon oxide layer as a first layer and a silicon nitride layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon nitride layer, a silicon nitride layer from which a hydrogen gas and an ammonia gas are less likely to be released is used. The amount of released the hydrogen gas or the ammonia gas may be measured by TDS. Further, as the silicon nitride layer, a silicon nitride layer which does not transmit or hardly transmits hydrogen, water, and oxygen is used.

Figure 18D:
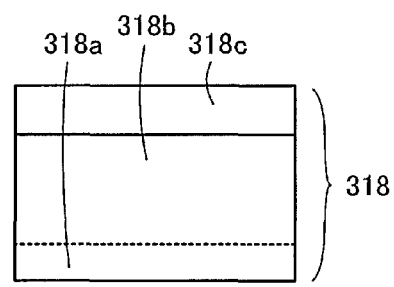

Alternatively, the protective insulating film 318 may be, for example, a multilayer film including a first silicon oxide layer 318a as a first layer, a second silicon oxide layer 318b as a second layer, and a silicon nitride layer 318c as a third layer (see FIG. 18D). In that case, the first silicon oxide layer 318a and/or the second silicon oxide layer 318b may be a silicon oxynitride layer. In addition, the silicon nitride layer may be a silicon nitride oxide layer. As the first silicon oxide layer 318a, a silicon oxide layer whose defect density is low is preferably used. Specifically, a silicon oxide layer whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide layer 318b, a silicon oxide layer containing excess oxygen is used. As the silicon nitride layer 318c, a silicon nitride layer from which a hydrogen gas and an ammonia gas are less likely to be released is used. Further, as the silicon nitride layer, a silicon nitride layer which does not transmit or hardly transmits hydrogen, water, and oxygen is used.

The silicon oxide layer having excess oxygen means a silicon oxide layer from which oxygen can be released by heat treatment or the like. An insulating film having excess oxygen means an insulating film from which oxygen is released by heat treatment.

The insulating film containing excess oxygen is capable of reducing oxygen vacancies in the oxide semiconductor layer 306b. The oxygen vacancies form a DOS in the oxide semiconductor layer 306b, and serve as charge traps. Thus, by reducing the oxygen vacancies in the oxide semiconductor layer 306b, the transistor can have stable electrical characteristics.

The description of the source electrode 116a and the drain electrode 116b is referred to for the description of the source electrode 316a and the drain electrode 316b. The description of the gate insulating film 112 is referred to for the description of the gate insulating film 312. The description of the gate electrode 104 is referred to for the description of the gate electrode 304. The description of the substrate 100 is referred to for the description of the substrate 300.

<Fabrication Method of Transistor Structure (3)>

An example of a method for fabricating a transistor structure (3) is described below.

FIGS. 19A to 19D are cross-sectional views corresponding to FIG. 18B.

First, the substrate 300 is prepared.

Next, a conductive film to serve as the gate electrode 304 is formed. The formation method of the conductive film to serve as the gate electrode 104 can be referred to for the formation method of the conductive film serving as the gate electrode 304.

Next, the conductive film to serve as the gate electrode 304 is partly etched to form the gate electrode 304.

Then the gate insulating film 312 is formed. For the gate insulating film 312, refer to the description of the method for forming the gate insulating film 112.

The gate insulating film 312 can be formed by a plasma CVD method, for example. By the CVD method, a dense insulating film having a lower density of defects can be provided as the substrate temperature is higher. A transistor can have more stable characteristics, as the gate insulating film 312 is denser and has a lower density of defects.

Figure 19A:
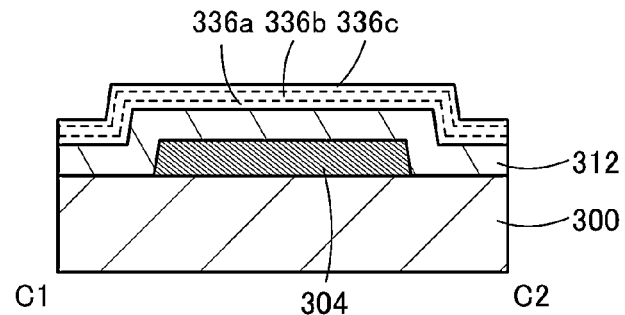
FIGS. 19A to 19D are cross-sectional views illustrating an example of a method for manufacturing a transistor in accordance with an embodiment of the present invention.

Then, an oxide layer 336a, an oxide semiconductor layer 336b, and an oxide layer 336c are formed in this order (see FIG. 19A). The formation methods of the oxide layer 136a, the oxide semiconductor layer 136b, and the oxide layer 136c can be referred to for the formation methods of the oxide layer 336c, the oxide semiconductor layer 336b, and the oxide layer 336a.

Next, first heat treatment is preferably performed. For the first heat treatment, the description of the fabrication method of the transistor structure (1) is referred to.

Figure 19B:
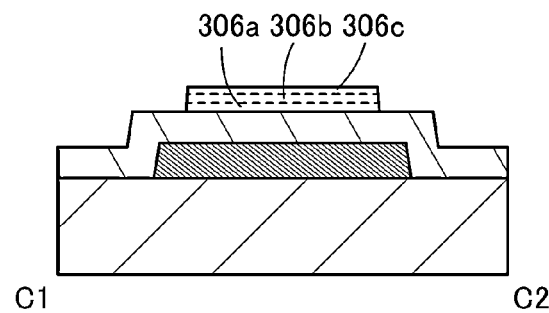
Figure 19C:
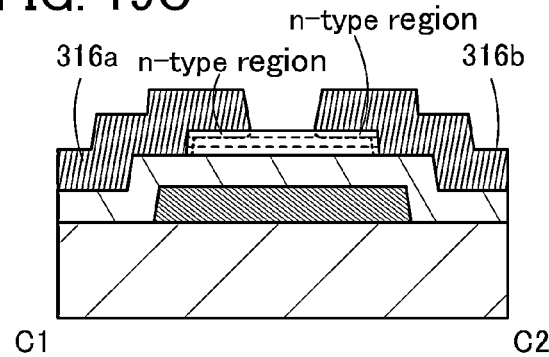

Then, the oxide layer 336a, the oxide semiconductor layer 336b, and the oxide layer 336c are partially etched, so that the oxide layer 306a, the oxide semiconductor layer 306b, and the oxide layer 306c that have an island-shape can be formed (FIG. 19B).

Then, a conductive film to serve as the source electrode 316a and the drain electrode 316b is formed. For the formation method of the conductive film to serve as the source electrode 316a and the drain electrode 316b, refer to the description of the conductive film 116. At this time, n-type regions are formed in regions represented by broken lines in the oxide layer 306c. The n-type regions are formed resulting from generation of oxygen vacancies in the oxide layer 306c due to damages when a conductive film is formed over the oxide layer 306c or action of the conductive film. For example, due to entry of hydrogen into the site of oxygen vacancies, an electron serving as a carrier is generated. Note that the n-type regions are formed up to the vicinity of the boundary between the oxide layer 306c and the oxide semiconductor layer 306b as a non-limiting example. For example, the n-type regions may be formed in the oxide layer 306c and the oxide semiconductor layer 306b, or only in the oxide layer 306c.

Next, the conductive film to serve as the source electrode 316a and the drain electrode 316b is partly etched to form the source electrode 316a and the drain electrode 316b.

Then, second heat treatment is preferably performed. Description made on the fabrication method of the transistor structure (1) can be referred to for the second heat treatment. By the second heat treatment, the n-type regions in the oxide layer 306c and/or the oxide semiconductor layer 306b that are/is exposed can be turned into i-type regions in some cases (see FIG. 19C).

Figure 19D:
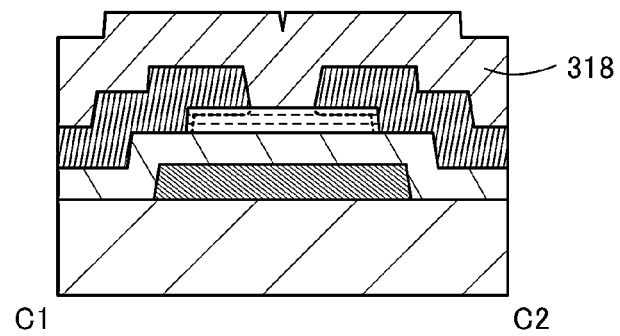

Next, the protective insulating film 318 is formed (see FIG. 19D).

Here, the case where the protective insulating film 318 has a three-layer structure as illustrated in FIG. 18D is described. First, the first silicon oxide layer 318a is formed, and then the second silicon oxide layer 318b is formed. Next, treatment for adding oxygen ions to the second silicon oxide layer 318b may be performed. The treatment for adding oxygen ions may be performed with an ion doping apparatus or a plasma treatment apparatus. As the ion doping apparatus, an ion doping apparatus with a mass separation function may be used. As a source material of oxygen ions, an oxygen gas such as $^{16}O_2$ or $^{18}O_2$, a nitrous oxide gas, an ozone gas, or the like may be used. Then, a silicon nitride layer 318 is formed so that the protective insulating film 318 is formed.

The first silicon oxide layer 318a is preferably formed by a plasma CVD method which is one type of CVD method. Specifically, high-frequency power is supplied to an electrode under the following conditions: the substrate temperature is set to be higher than or equal to 180° C. and lower than or equal to 400° C., preferably higher than or equal to 200° C. and lower than or equal to 370° C.; a deposition gas containing silicon and an oxidizing gas are used; and the pressure is set to be higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidizing gas include oxygen, ozone, nitrous oxide, and nitrogen dioxide.

By setting the flow rate of the oxidizing gas to 100 times or more the flow rate of the deposition gas containing silicon, the hydrogen content in the first silicon oxide layer 318a can be reduced and dangling bonds can be reduced.

In the above manner, the first silicon oxide layer 318a with low defect density is formed. That is, the spin density of the first silicon oxide layer 318a, which originates from a signal with a g factor of 2.001 in ESR, can be lower than or equal to $3 \times 10^{17}$ spins/cm$^3$ or lower than or equal to $5 \times 10^{16}$ spins/cm$^3$.

The second silicon oxide layer 318b is preferably formed by a plasma CVD method. Specifically, high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode under the following conditions: the substrate temperature is set to be higher than or equal to 160° C. and lower than or equal to 350° C., preferably higher than or equal to 180° C. and lower than or equal to 260° C.; a deposition gas containing silicon and an oxidizing gas are used; and the pressure is set to be higher than or equal to 100 Pa and lower than or equal to 250 Pa, preferably higher than or equal to 100 Pa and lower than or equal to 200 Pa.

By the above-described method, the decomposition efficiency of the gas in plasma is enhanced, oxygen radicals are increased, and oxidation of the gas is promoted; thus, the second silicon oxide layer 318b containing excess oxygen can be formed.

The silicon nitride layer 318c is preferably formed by a plasma CVD method. Specifically, high-frequency power is supplied under the following conditions: the substrate temperature is set to be higher than or equal to 180° C. and lower than or equal to 400° C., preferably higher than or equal to 200° C. and lower than or equal to 370° C.; a deposition gas containing silicon, a nitrogen gas, and an ammonia gas are used; and the pressure is set to be higher than or equal to 20 Pa and lower than or equal to 250 Pa, preferably higher than or equal to 40 Pa and lower than or equal to 200 Pa.

Note that the flow rate of the nitrogen gas is 5 to 50 times, preferably 10 to 50 times as high as that of the ammonia gas. The use of the ammonia gas facilitates decomposition of the deposition gas containing silicon and the nitrogen gas. This is because an ammonia gas is dissociated by plasma energy or heat energy, and energy generated by the dissociation contributes to decomposition of a molecular bond of the deposition gas containing silicon and a molecular bond of the nitrogen gas.

Through the above method, the silicon nitride layer 318c from which the hydrogen gas and the ammonia gas are less likely to be released can be formed. The silicon nitride layer 318c has low hydrogen content, and thus is dense and does not transmit or hardly transmit hydrogen, water, and oxygen.

The protective insulating film 318 can be formed in this manner.

Next, third heat treatment is preferably performed. For the third heat treatment, the description of the fabrication method of the transistor structure (1) is referred to.

In this manner, the transistor in FIGS. 18A to 18C can be fabricated.

<Transistor Structure (4)>

Next, an example of a bottom-gate and top-contact transistor that is different from the transistor structure (3) is described.

Figure 20A:
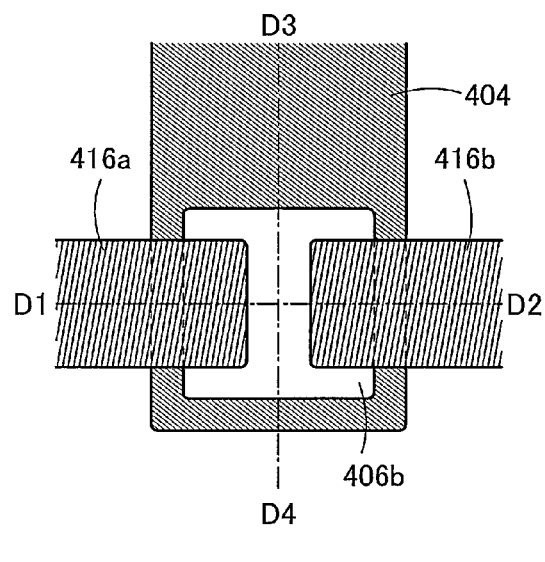
FIGS. 20A to 20C are a top view and cross-sectional views illustrating an example of a transistor of one embodiment of the present invention.
Figure 20C:
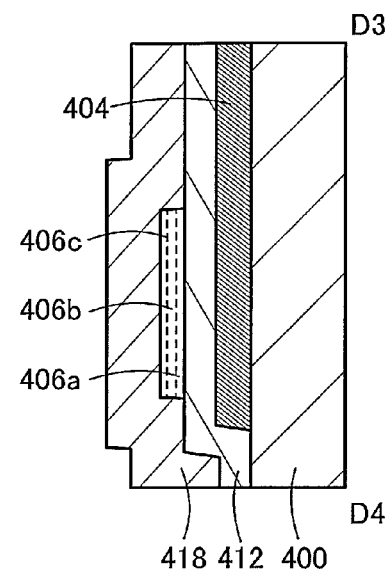

FIGS. 18A to 20C are a top view and cross-sectional views of a transistor. FIG. 20A is a top view of the transistor. FIG. 20B is the cross-sectional view taken along the dashed-dotted line D1-D2 in FIG. 20A. FIG. 20C is a cross-sectional view taken along the dashed-dotted line D3-D4 in FIG. 20A.

Figure 20B:
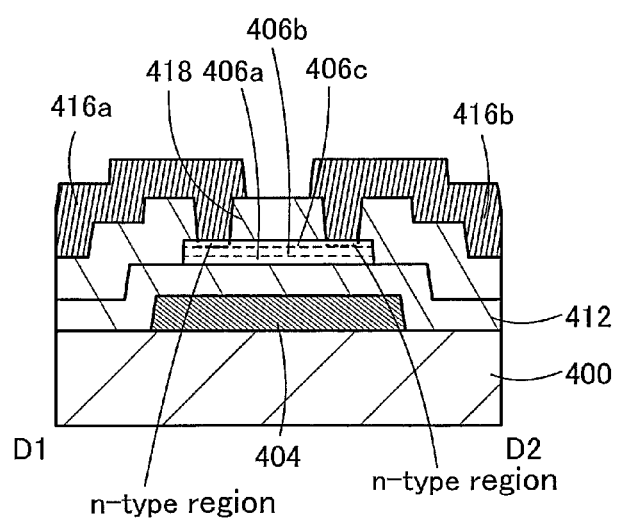

The transistor illustrated in FIG. 20B includes a gate electrode 404 over a substrate 400; a gate insulating film 412 over the gate electrode 404; an oxide layer 406a over the gate insulating film 412; an oxide semiconductor layer 406b over the oxide layer 406a; an oxide layer 406c over the oxide semiconductor layer 406b; a protective insulating film 418 over the gate insulating film 412 and the oxide layer 406c; and a source electrode 416a and a drain electrode 416b in contact with the oxide layer 406c in an opening portion formed in the protective insulating film 418.

The protective insulating film 418 of the transistor illustrated in FIGS. 20A to 20C corresponds to, for example, the gate insulating film (bg) of the transistor illustrated in FIG. 9A. The transistor illustrated in FIGS. 20A to 20C may have, for example, the gate electrode (bg) of the transistor in FIG. 9A. The transistor illustrated in FIGS. 20A to 20C may have, for example, a back gate insulating film over the protective insulating film 418, the source electrode 416a, and the drain electrode 416b, and a back gate electrode that is opposited to the gate electrode 404 and in contact with the top surface of the back gate insulating film.

Depending on the kinds of the conductive film used for the source electrode 416a and the drain electrode 416b, oxygen is released from parts of the oxide semiconductor layer 406b and the oxide layer 406c or a mixed layer is formed, so that the n-type regions (low resistant regions) are formed in the oxide semiconductor layer 406b and the oxide layer 406c.

Note that as illustrated in FIG. 20A, the gate electrode 404 is provided such that the oxide semiconductor layer 406b is located inside the gate electrode 404 in the top view. By providing the gate electrode 404 at such a position, when light irradiation is performed from the gate electrode 404 side, generation of carriers in the oxide semiconductor layer 406b due to light can be suppressed. In other words, the gate electrode 404 functions as a light-blocking film. Note that the oxide semiconductor layer 406b may be provided outside the gate electrode 404.

The descriptions of the oxide layer 106c, the oxide semiconductor layer 106b, and the oxide layer 106a can be referred to as for the oxide layer 406a, the oxide semiconductor layer 406b, and the oxide layer 406c. In other words, the bottom gate and top contact transistor has a reverse stacked structure of the top gate and top contact transistor.

For the protective insulating film 418, the description of the protective insulating film 318 is referred to.

The protective insulating film 418 preferably includes an insulating film containing excess oxygen. The insulating film containing excess oxygen is capable of reducing oxygen vacancies in the oxide semiconductor layer 406b. The oxygen vacancies form DOS in the oxide semiconductor layer 406b, and serve as charge traps. Thus, by reducing the oxygen vacancies in the oxide semiconductor layer 406b, the transistor can have stable electrical characteristics.

The description of the source electrode 116a and the drain electrode 116b are referred to for the source electrode 416a and the drain electrode 416b. The description of the gate insulating film 112 is referred to for the gate insulating film 412. The description of the gate electrode 104 is referred to for the gate electrode 404. The description of the substrate 100 is referred to for the substrate 400.

<Fabrication Method of Transistor Structure (4)>

An example of a method for fabricating a transistor structure (4) is described below.

FIGS. 21A to 21D are cross-sectional views corresponding to FIG. 20B.

First, the substrate 400 is prepared.

Next, a conductive film to serve as the gate electrode 404 is formed. For the method for forming the conductive film to be the gate electrode 404, the description of the method for forming the conductive film to be the gate electrode 104 is referred to.

Next, the conductive film to serve as the gate electrode 404 is partly etched to form the gate electrode 404.

The, the gate insulating film 412 is formed. For the method for forming the gate insulating film 412, the description of the method for forming the gate insulating film 112 is referred to.

The gate insulating film 412 can be formed by a plasma CVD method, for example. By the CVD method, a dense insulating film having a lower density of defects can be provided as the substrate temperature is higher. A transistor can have more stable characteristics, as the gate insulating film 412 is denser and has a lower density of defects.

Figure 21A:
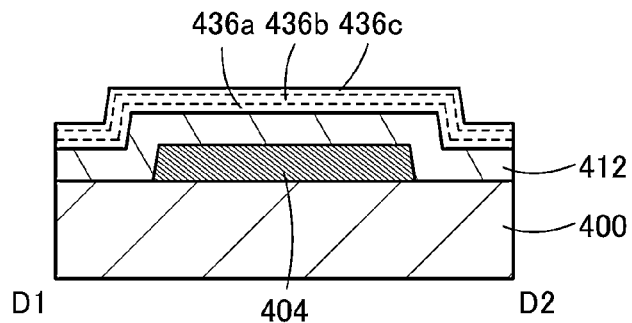
FIGS. 21A to 21D are cross-sectional views illustrating an example of a method for manufacturing a transistor in accordance with an embodiment of the present invention.

Then, an oxide layer 436a, an oxide semiconductor layer 436b, and an oxide layer 436c are formed in this order (see FIG. 21A). The formation methods of the oxide layer 136a, the oxide semiconductor layer 136b, and the oxide layer 136c can be referred to for the formation methods of the oxide layer 436a, the oxide semiconductor layer 436b, and the oxide layer 436c.

Next, first heat treatment is preferably performed. For the first heat treatment, the description of the fabrication method of the transistor structure (1) is referred to.

Figure 21B:
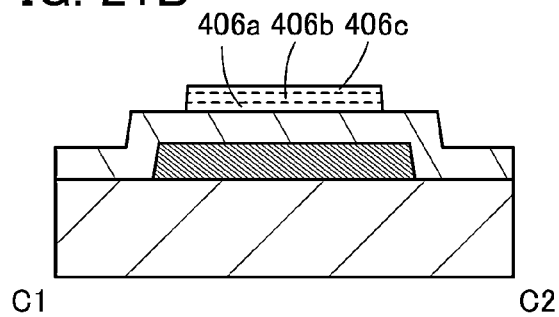

Then, the oxide layer 436a, the oxide semiconductor layer 436b, and the oxide layer 436c are partly etched to form oxide layer 406a, the oxide semiconductor layer 406b, and the oxide layer 406c that have an island shape (see FIG. 21B).

Next, an insulating film to serve as the protective insulating film 418 is formed. For the method for forming the protective insulating film 418, the description of the method for forming the protective insulating film 318 is referred to.

Then, second heat treatment is preferably performed. For the second heat treatment, the description of the fabrication method of the transistor structure (1) is referred to.

Figure 21C:
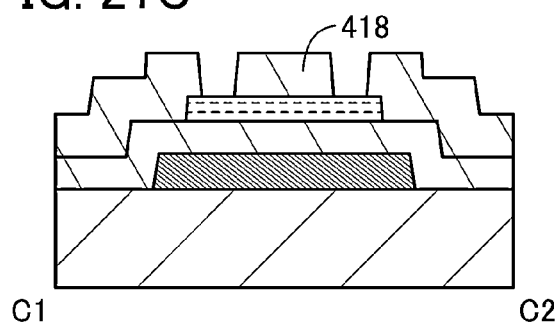

Then, the insulating film serving as the protective insulating film 418 is partially etched to form the protective insulating film 418 (see FIG. 21C).

Then, a conductive film to serve as the source electrode 416a and the drain electrode 416b is formed. For the formation method of the conductive film to serve as the source electrode 416a and the drain electrode 416b, refer to the description of the conductive film 116. At this time, n-type regions are formed in regions represented by broken lines in the oxide layer 406c in some cases. The n-type regions are formed resulting from generation of oxygen vacancies in the oxide layer 406c due to damages when a conductive film is formed over the oxide layer 406c or action of the conductive film. For example, due to entry of hydrogen into the site of oxygen vacancies, an electron serving as a carrier is generated. Note that the n-type regions are formed up to the vicinity of the boundary between the oxide layer 406c and the oxide semiconductor layer 406b as a non-limiting example illustrated. For example, the n-type regions may be formed in the oxide layer 406c and the oxide semiconductor layer 406b, or only in the oxide layer 406c.

Figure 21D:
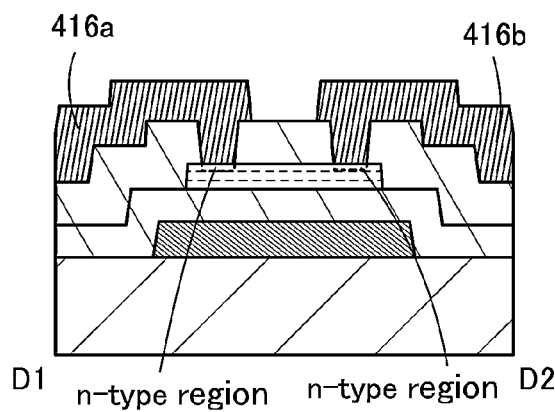

Next, the conductive film to be the source electrode 416a and the drain electrode 416b is partly etched to form the source electrode 416a and the drain electrode 416b (see FIG. 21D).

Next, third heat treatment is preferably performed. For the third heat treatment, the description of the fabrication method of the transistor structure (1) is referred to.

Through the above steps, the transistor illustrated in FIGS. 20A to 20C can be fabricated.

<Application Products>

Application products using the above transistor are described below.

<Microcomputer>

The transistor described above can be applied to microcomputers which are mounted on variety of electronic appliances.

A structure and operation of a fire alarm system that is an example of the electronic appliance using a microcomputer are described with reference to FIG. 33, and FIGS. 34A and 34B.

A fire alarm in this specification refers to any device which raises an alarm over fire occurrence instantly, and for example, a residential fire alarm, an automatic fire alarm system, and a fire detector used for the automatic fire alarm system are included in its category.

Figure 33:
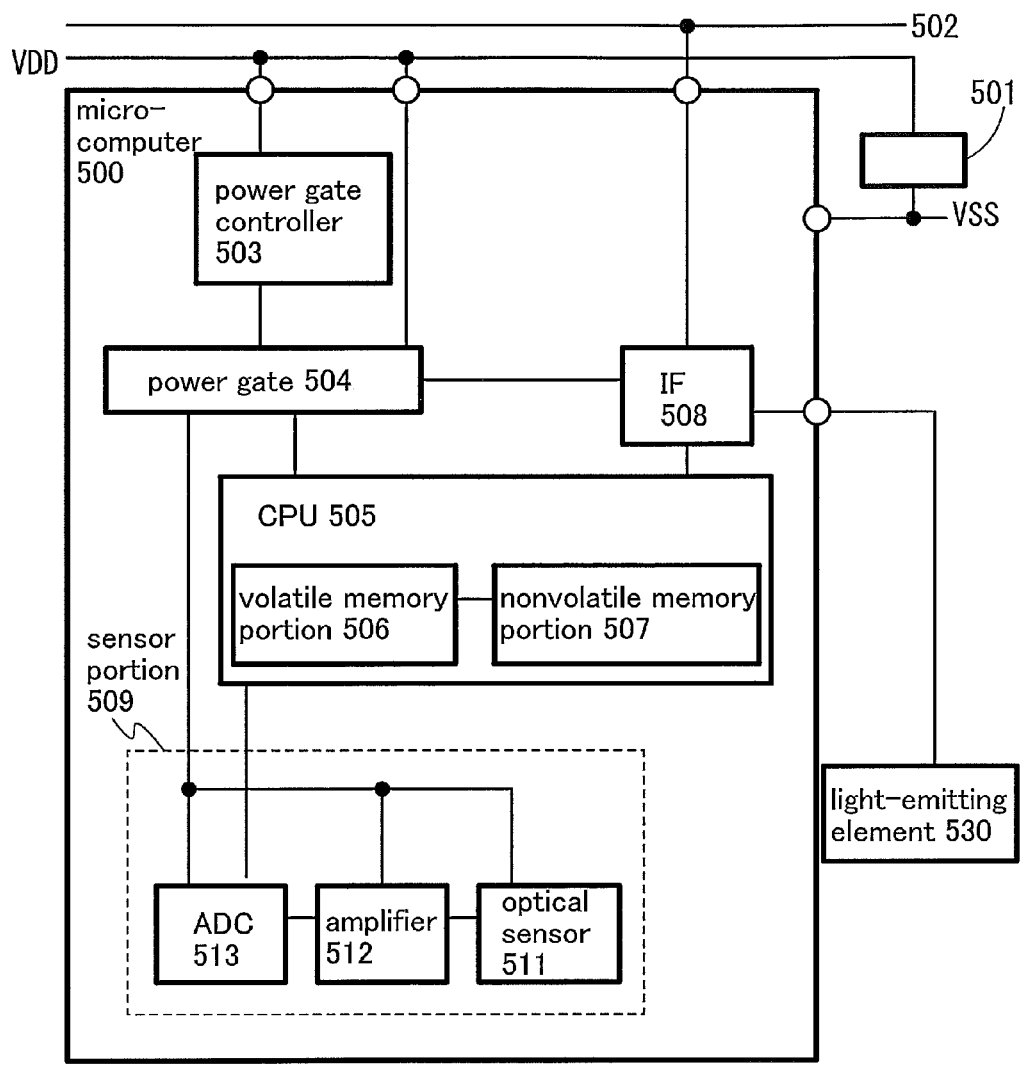
FIG. 33 is a block diagram illustrating an example of a semiconductor device in accordance with one embodiment of the present invention.

An alarm system illustrated in FIG. 33 includes at least a microcomputer 500. Here, the microcomputer 500 is provided in the alarm device. The microcomputer 500 includes a power gate controller 503 electrically connected to a high potential power supply line VDD; a power gate 504 electrically connected to the high potential power supply line VDD and the power gate controller 503; a central processing unit (CPU) 505 electrically connected to the power gate 504; and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 is electrically connected to the power gate 504. As a bus standard of the interface 508, an I²C bus can be used, for example. A light-emitting element 530 electrically connected to the power gate 504 via the interface 508 is provided in the alarm system.

The light-emitting element 530 is preferably an element which emits light with high directivity, and for example, an organic EL element, an inorganic EL element, or an LED can be used.

The power gate controller 503 includes a timer that controls the power gate 504. The power gate 504 allows or stops supply of power from the high potential power supply line VDD to the CPU 505, the sensor portion 509, and the interface 508, by the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby power consumption can be reduced compared with a case where power is continuously supplied to the above structures.

In the case where a transistor is used as the power gate 504, it is preferable to use a transistor that has an extremely low off-state current and is used for the nonvolatile memory portion 507, for example, the above transistor including an oxide semiconductor layer. With the use of such a transistor, leakage current can be reduced when supply of power is stopped by the power gate 504, so that a reduction in power consumption of the alarm device can be achieved.

A direct-current power source 501 may be provided in the alarm system so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, e.g., a ground potential (GND).

When a battery is used as the direct-current power source 501, for example, a battery case including an electrode electrically connected to the high potential power supply line VDD, an electrode electrically connected to the low potential power supply line VSS, and a housing which can hold the battery, is provided in a housing. Note that the alarm system does not necessarily include the direct-current power source 501 and may have, for example, a structure in which power is supplied from an alternate-current power source provided outside the alarm system through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measured value to the CPU 505. The physical quantity relating to an abnormal situation depends on the usage of the alarm device, and in an alarm device functioning as a fire alarm, a physical quantity relating to a fire is measured. Thus, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The light-emitting element 530, the optical sensor 511, the amplifier 512, and the AD converter 513 operate when the power gate 504 allows supply of power to the sensor portion 509.

Figure 34A:
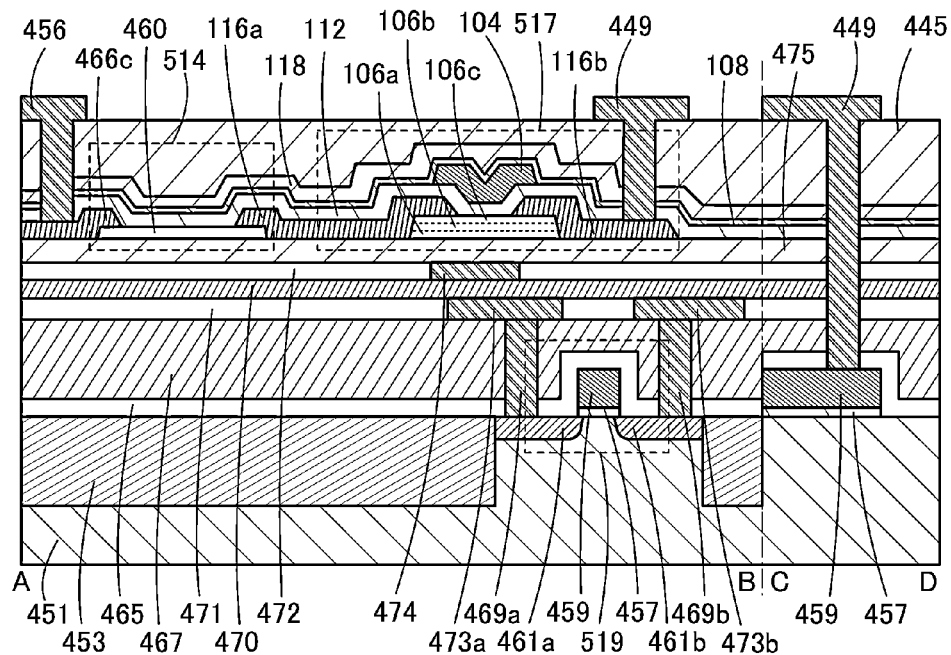
FIGS. 34A and 34B are a cross-sectional view and a circuit diagram illustrating an example of a semiconductor device in accordance with one embodiment of the present invention.

FIG. 34A illustrates part of the cross section of the alarm device. In the cross-sectional view of FIG. 34A, the cross section taken along A-B in the channel length direction and the cross section taken along C-D perpendicular to the channel length direction are illustrated. An n-channel transistor 519 includes element isolation regions 453 in a p-type semiconductor substrate 451, a gate insulating film 457, a gate electrode 459, n-type impurity regions 461a and 461b, an insulating film 465, and an insulating film 467. The transistor 519 is formed using a semiconductor such as single crystal silicon, so that the transistor 519 can operate at high speed. Accordingly, a volatile memory portion of a CPU that can achieve high-speed access can be formed.

In addition, contact plugs 469a and 469b are formed in openings which are formed by partly etching the insulating films 465 and 467, and an insulating film 471 having groove portions is formed over the insulating film 467 and the contact plugs 469a and 469b. Wirings 473a and 473b are formed in the groove portions of the insulating film 471. An insulating film 470 is formed over the insulating film 471 and the wirings 473a and 473b by a sputtering method, a CVD method, or the like, and an insulating film 472 having a groove portion is formed over the insulating film 470. An electrode 474 is formed in the groove portion of the insulating film 472. The electrode 474 functions as a back gate electrode of a transistor 517. By providing the electrode 474, threshold voltage of the transistor 517 can be controlled.

Moreover, an insulating film 475 is formed over the insulating film 472 and the electrode 474 by a sputtering method, a CVD method, or the like.

The transistor 517 and a photoelectric conversion element 514 are provided over the insulating film 475. The transistor 517 includes the oxide layer 106a, the oxide semiconductor layer 106b, the oxide layer 106c, the source electrode 116a, the drain electrode 116b, the gate insulating film 112, the gate electrode 104, the protective insulating film 108, and the protective insulating film 118. Moreover, an insulating film 445 which covers the photoelectric conversion element 514 and the transistor 517 is formed, and a wiring 449 in contact with the drain electrode 116b is formed over the insulating film 445. The wiring 449 electrically connects the drain electrode of the transistor 517 to the gate electrode 459 of the transistor 519.

Figure 34B:
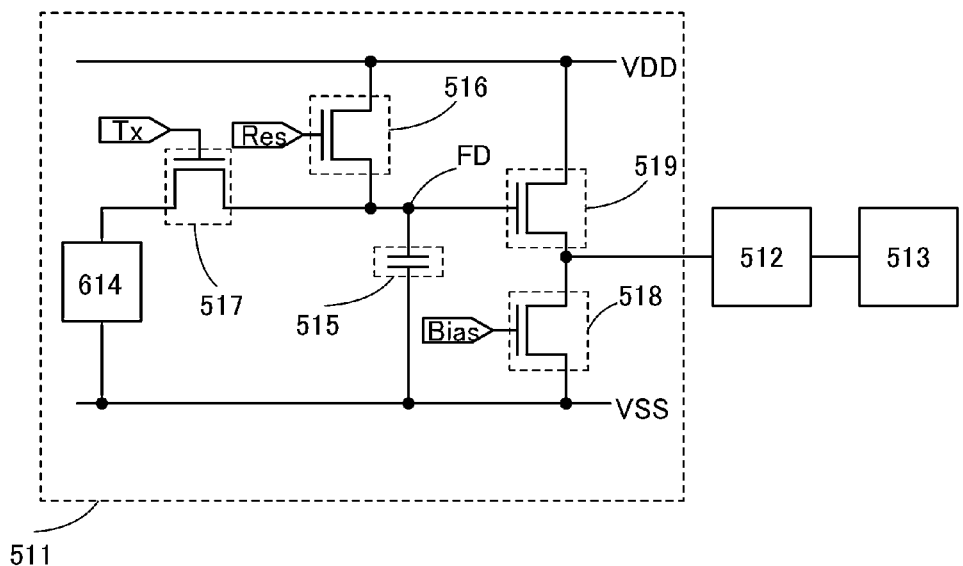

FIG. 34B is a circuit diagram of a detection portion. The detection portion includes the optical sensor 511, the amplifier 512, and the AD converter 513. The optical sensor 511 includes the photoelectric conversion element 514, a capacitor 515, a transistor 516, the transistor 517, a transistor 518, and the transistor 519. As the photoelectric conversion element 514, a photodiode can be used here, for example.

One of terminals of the photoelectric conversion element 514 is electrically connected to the low potential power supply line VSS, and the other of the terminals thereof is electrically connected to one of the source electrode and the drain electrode of the transistor 517. The gate electrode of the transistor 517 is supplied with an electric charge accumulation control signal Tx, and the other of the source electrode and the drain electrode thereof is electrically connected to one of a pair of electrodes of the capacitor 515, one of a source electrode and a drain electrode of the transistor 516, and the gate electrode of the transistor 519 (hereinafter the node is referred to as a node FD in some cases). The other of the pair of electrodes of the capacitor 515 is electrically connected to the low potential power supply line VSS. A gate electrode of the transistor 516 is supplied with a reset signal Res, and the other of the source electrode and the drain electrode thereof is electrically connected to the high potential power supply line VDD. One of a source electrode and a drain electrode of the transistor 519 is electrically connected to one of a source electrode and a drain electrode of the transistor 518 and the amplifier 512. The other of the source electrode and the drain electrode of the transistor 519 is electrically connected to the high potential power supply line VDD. A gate electrode of the transistor 518 is supplied with a bias signal Bias, and the other of the source electrode and the drain electrode thereof is electrically connected to the low potential power supply line VSS.

Note that the capacitor 515 is not necessarily provided. For example, in the case where parasitic capacitance of the transistor 519 or the like is sufficiently large, a structure without the capacitor may be employed.

Further, as each of the transistor 516 and the transistor 517, the transistor with an extremely low off-state current is preferably used. As the transistor with extremely low off-state current, the above-described transistor is preferably is used. With such a structure, the potential of the node FD can be held for a long time.

In the structure in FIG. 34A, the photoelectric conversion element 514 is electrically connected to the transistor 517 and is provided over the insulating film 457.

The photoelectric conversion element 514 includes a semiconductor layer 460 over the insulating film 475, and the source electrode 116a and an electrode 466c which are in contact with the top surface of the semiconductor layer 460. The source electrode 116a is an electrode functioning as the source electrode or the drain electrode of the transistor 517 and electrically connects the photoelectric conversion element 514 to the transistor 517.

Over the semiconductor layer 460, the source electrode 116a, and the electrode 466c, the gate insulating film 112, the protective insulating film 118, and the insulating film 445 are provided. Further, a wiring 456 is formed over the insulating film 445 and is in contact with the electrode 466c through an opening provided in the gate insulating film 112, the protective insulating film 108, the protective insulating film 118, and the insulating film 445.

The electrode 466c can be formed in steps similar to those of the source electrode 116a and the drain electrode 116b, and the wiring 456 can be formed in steps similar to those of the wiring 449.

As the semiconductor film 460, a semiconductor film which can perform photoelectric conversion is provided, and for example, silicon, germanium, or the like can be used. In the case of using silicon for the semiconductor film 460, an optical sensor which senses visible light can be obtained. Further, there is a difference between silicon and germanium in wavelengths of absorbed electromagnetic waves. In the case of using germanium for the semiconductor film 460, a sensor which senses infrared rays can be obtained.

In the above manner, the sensor portion 509 including the optical sensor 511 can be incorporated into the microcomputer 500, so that the number of components can be reduced and the housing of the alarm device can be reduced.

In the fire alarm including the above-described IC chip, the CPU 505 in which a plurality of circuits each including any of the above transistors are combined and mounted on one IC chip is used.

<CPU>

Figure 35A:
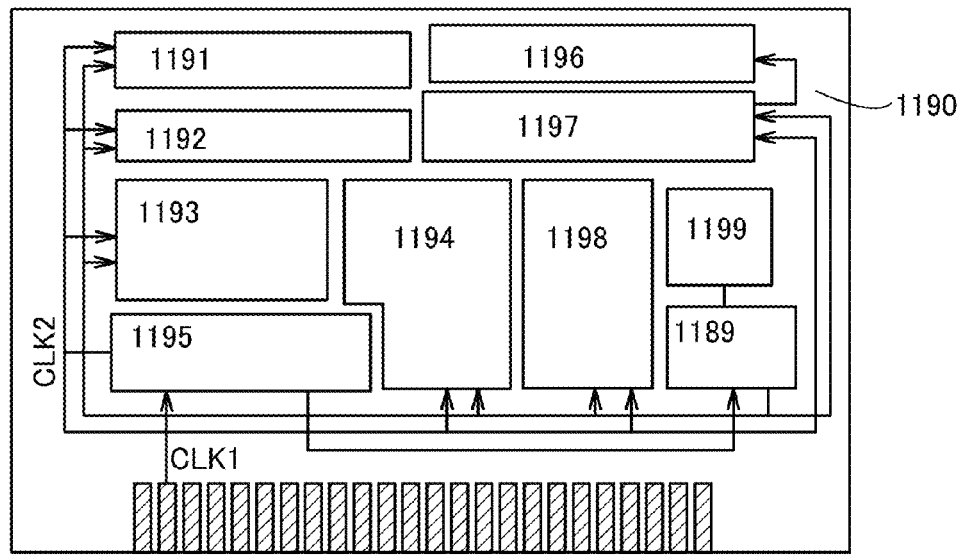
FIGS. 35A to 35C are block diagrams illustrating an example of a CPU in accordance with one embodiment of the present invention.
Figure 35B:
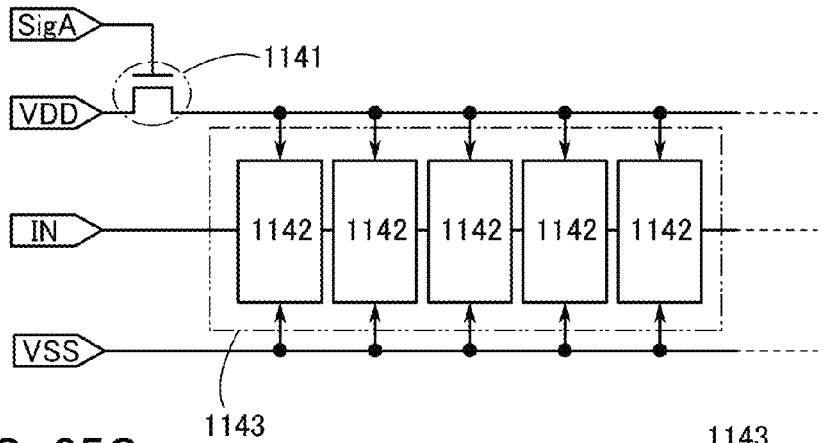
Figure 35C:
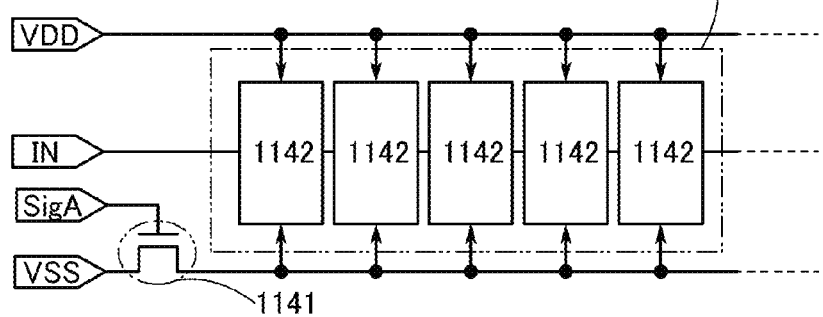

FIGS. 35A to 35C are block diagrams illustrating a specific structure of a CPU at least partly including any of the above transistors.

The CPU illustrated in FIG. 35A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 35A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 35A, a memory cell is provided in the register 1196. As the memory cell of the register 1196, the above transistor can be used.

In the CPU illustrated in FIG. 35A, the register controller 1197 selects an operation of holding data in the register 1196, in response to an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 35B or FIG. 35C. Circuits illustrated in FIGS. 35B and 35C will be described below.

FIGS. 35B and 35C each illustrate a memory device in which any of the above transistors is used as a switching element which controls supply of a power supply potential to a memory cell.

The memory device illustrated in FIG. 35B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 35B, any of the above transistors is used as the switching element 1141, and the switching of the transistor is controlled by a signal SigA supplied to a gate electrode layer thereof.

Note that FIG. 35B illustrates the structure in which the switching element 1141 includes only one transistor; however, without particular limitation thereon, the switching element 1141 may include a plurality of transistors. The switching element 1141 may include a plurality of transistors. In the case where the switching element 1141 includes a plurality of transistors which serves as switching elements, the plurality of transistors may be connected to each other in parallel, in series, or in combination of parallel connection and serial connection.

Although the switching element 1141 controls the supply of the high-level power supply potential VDD to each of the memory cells 1142 included in the memory cell group 1143 in FIG. 35B, the switching element 1141 may control the supply of the low-level power supply potential VSS.

In FIG. 35C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even when an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

<Display Device>

In this section, a display device including the above transistor is described.

As a display element provided in the display device, a liquid crystal element (also referred to as a liquid crystal display element), a light-emitting element (also referred to as a light-emitting display element), or the like can be used. The light-emitting element includes, in its category, an element whose luminance is controlled by current or voltage, specifically an inorganic electroluminescent (EL) element, an organic EL element, and the like. Furthermore, a display medium whose contrast is changed by an electric effect, such as electronic ink or an electrophoretic element, can be used as the display element. A display device including an EL element and a display device including a liquid crystal element are described below as examples of the display device.

Note that the display device described below includes in its category a panel in which a display element is sealed and a module in which an IC such as a controller is mounted on the panel.

Further, the display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

<EL Display Device>

First, a display device using an EL element (also referred to as an EL display device) is described.

Figure 37A:
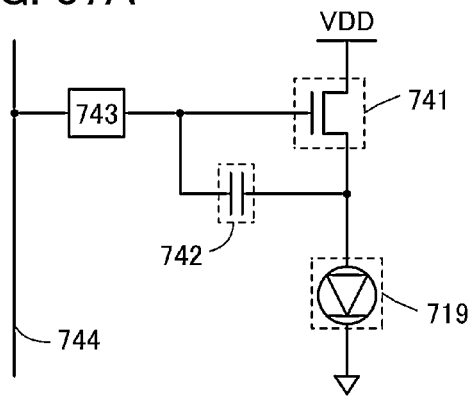
FIGS. 37A, 37B, and 37C are a circuit diagram, a top view, a cross-sectional view, respectively, illustrating an example of an EL display device in accordance with one embodiment of the present invention.

FIG. 37A is an example of a circuit diagram of a pixel in the EL display device.

Note that in this specification and the like, it is possible for those skilled in the art to constitute one embodiment of the present invention even when portions to which all the terminals of an active element (e.g., a transistor or a diode), a passive element (e.g., a capacitor or a resistor), or the like are connected are not specified. In other words, one embodiment of the present invention can be clear even when connection portions are not specified. Further, in the case where a connection portion is disclosed in this specification and the like, it can be determined that one embodiment of the present invention in which a connection portion is not specified is disclosed in this specification and the like, in some cases. In particular, in the case where the number of portions to which a terminal is connected might be plural, it is not necessary to specify the portions to which the terminal is connected. Therefore, it is possible to constitute one embodiment of the present invention by specifying only portions to which some of terminals of an active element (e.g., a transistor or a diode), a passive element (e.g., a capacitor or a resistor), or the like are connected.

Note that in this specification and the like, it is possible for those skilled in the art to specify the present invention when at least the connection portion of a circuit is specified. Alternatively, it is possible for those skilled in the art to specify the present invention when at least a function of a circuit is specified. In other words, when a function of a circuit is specified, one embodiment of the present invention can be clear and it can be determined that one embodiment of the present invention is disclosed in this specification and the like in some cases. Therefore, when a connection portion of a circuit is specified, the circuit is disclosed as one embodiment of the present invention even when a function of the circuit is not specified, and one embodiment of the present invention can be constructed. Alternatively, when a function of a circuit is specified, the circuit is disclosed as one embodiment of the present invention even when a connection portion is not specified, and one embodiment of the present invention can be constituted.

Figure 37B:
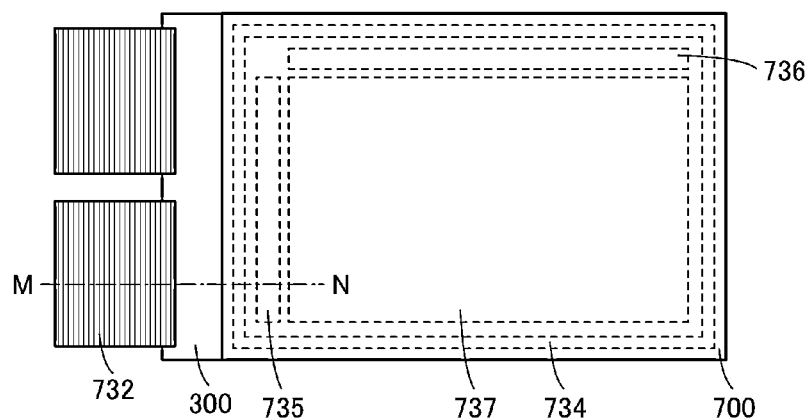
Figure 37C:
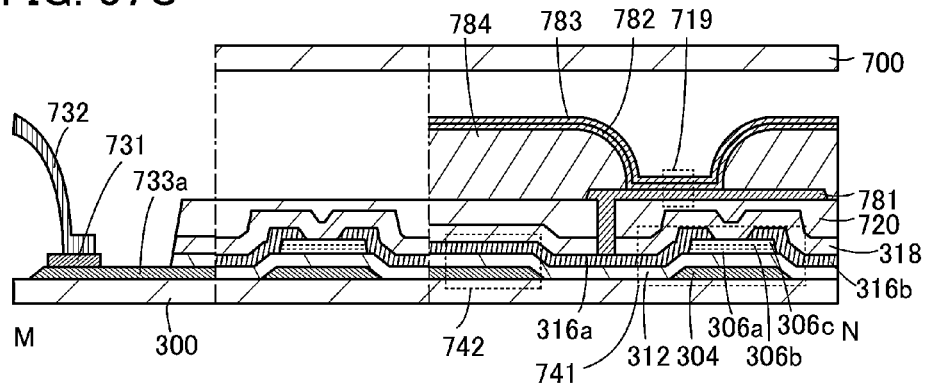

The EL display device illustrated in FIGS. 37A to 37C includes a switching element 743, a transistor 741, a capacitor 742, and a light-emitting element 719.

FIG. 37A is an example of a circuit diagram; thus, a transistor can be additionally provided. In each node in FIG. 37A, it is also possible to provide no additional transistors, switches, passive elements, and the like. For example, it is possible not to increase the number of transistors directly connected to the node A, the node B, the node C, the node D, the node E, the node F, and/or the node G. Accordingly, for example, the following structure can be used: only the transistor 741 is directly connected to the node C and the other transistors are not directly connected to the node C.

A gate of the transistor 741 is electrically connected to one electrode of the switching element 743 and one electrode of the capacitor 742. A source of the transistor 741 is electrically connected to the other electrode of the capacitor 742 and one terminal of the light-emitting element 719. A drain of the transistor 741 is supplied with a power source potential VDD. The other electrode of the switching element 743 is electrically connected to a signal line 744. A constant potential is supplied to the other terminal of the light-emitting element 719. The constant potential is a ground potential GND or a potential lower than the ground potential GND.

The transistor using the oxide semiconductor layer, which is described in the above embodiment, is used as the transistor 741. The transistor has stable electrical characteristics. Accordingly, an EL display device having high display quality can be provided.

It is preferable to use a transistor as the switch element 743. When the transistor is used as the switching element, the area of a pixel can be reduced, so that the EL display device can have high resolution. Alternatively, the transistor having an oxide semiconductor layer described above may be used as the switching element 743. When the above transistor is used as the switching element 743, the switching element 743 can be formed in the same process as the transistor 741, so that the productivity of the EL display device can be improved.

FIG. 37B is a top view of the EL display device. The EL display device includes the substrate 300, a substrate 700, a sealant 734, a driver circuit 735, a driver circuit 736, a pixel 737, and an FPC 732. The sealant 734 is provided between the substrate 300 and the substrate 700 so as to surround the pixel 737, the driver circuit 735, and the driver circuit 736. The driver circuit 735 and/or the driver circuit 736 may be provided outside the sealant 734.

FIG. 37C is a cross-sectional view of the display device including an EL element taken along the dashed-dotted line M-N in FIG. 37B. The FPC 732 is connected to a wiring 733a through a terminal 731. Note that the wiring 733a is formed in the same layer as the gate electrode 304.

Note that FIG. 37C illustrates an example in which the transistor 741 and the capacitor 742 are provided in the same plane. With such a structure, the capacitor 742 can be fabricated in the same planes as the gate electrode, the gate insulating film, and the source (drain) electrode of the transistor 741. Such provision of the transistor 741 and the capacitor 742 in the same plane leads to shortening of the manufacturing process of the EL display device and an improvement of the productivity.

As the transistor 741 in FIG. 37C, a transistor having a structure similar to the transistor illustrated in FIGS. 18A to 18D is applied.

The transistor illustrated in FIGS. 18A to 18D is a transistor the threshold voltage of which is hardly shifted. Accordingly, the transistor is preferred for EL display devices where gray scales are varied even with the small shift of the threshold voltage.

An insulating film 720 is provided over the transistor 741 and the capacitor 742. Here, an opening reaching the source electrode 316a of the transistor 741 is provided in the insulating film 720 and the protective insulating film 318.

An electrode 781 is provided over the insulating film 720. The electrode 781 is connected to the source electrode 316a of the transistor 741 through the opening provided in the insulating film 720 and the protective insulating film 318.

Over the electrode 781, a partition 784 having an opening reaching the electrode 781 is provided. Over the partition 784, a light-emitting layer 782 is provided which is in contact with the electrode 781 in the opening provided in the partition 784. An electrode 783 is provided over the light-emitting layer 782. A region where the electrode 781, the light-emitting layer 782, and the electrode 783 overlap with one another serves as the light-emitting element 719.

<Liquid Crystal Display>

Next, a display device including a liquid crystal element (also referred to as a liquid crystal display device) is described.

Figure 38A:
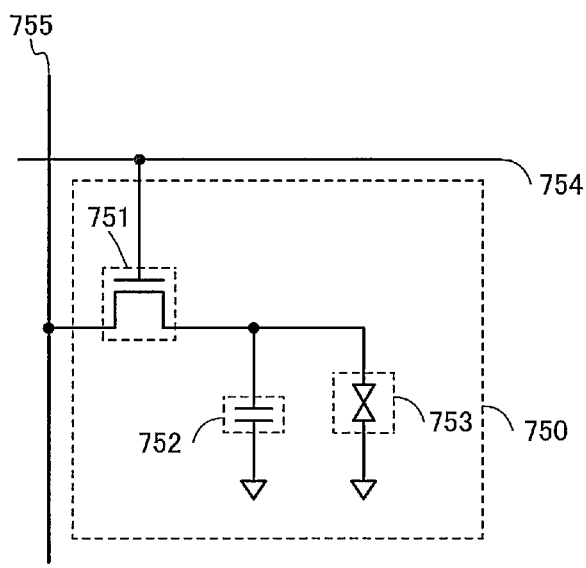
FIGS. 38A and 38B are a circuit diagram and a cross-sectional view, respectively, illustrating an example of a liquid crystal display device in accordance with one embodiment of the present invention.

FIG. 38A is a circuit diagram illustrating a configuration example of the pixel of a liquid crystal display device. A pixel 750 in FIG. 38A includes a transistor 751, a capacitor 752, and an element in which a liquid crystal is sealed between a pair of electrodes (hereinafter also referred to as a liquid crystal element) 753.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring to which a common potential is supplied.

One electrode of the liquid crystal element 753 is electrically connected to the other of the source and the drain of the transistor 751, and the other electrode of the liquid crystal element 753 is electrically connected to a wiring to which a common potential is supplied. Note that the common potential supplied to the wiring electrically connected to the other electrode of the capacitor 752 and the common potential supplied to the wiring electrically connected to the other electrode of the liquid crystal element 753 may be different potentials.

Figure 38B:
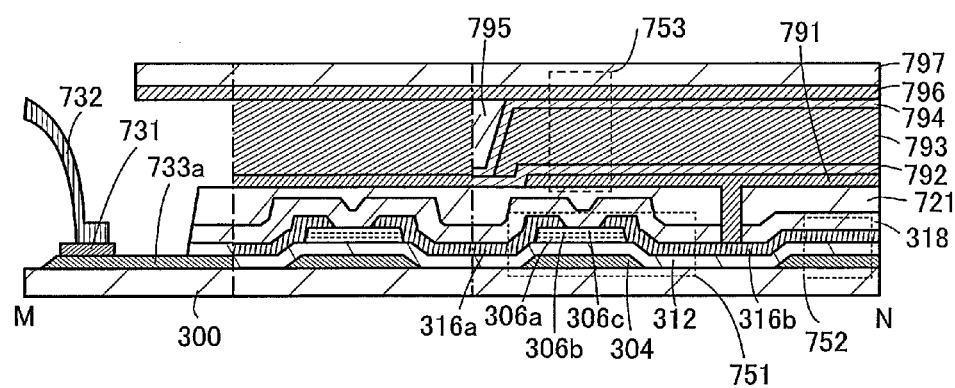

The top view of the liquid crystal display device is similar to that of the EL display device. A cross-sectional view of the liquid crystal display device taken along dashed-dotted line M-N in FIG. 37A is illustrated in FIG. 38B. In FIG. 38B, the FPC 732 is connected to the wiring 733a through the terminal 731. Note that the wiring 733a is formed in the same layer as the gate electrode 304.

FIG. 38B illustrates the example in which the transistor 751 and the capacitor 752 are provided in the same plane. With such a structure, the capacitor 752 can be fabricated in the same planes as the gate electrode, the gate insulating film, and the source (drain) electrode of the transistor 751. Such provision of the transistor 751 and the capacitor 752 in the same plane leads to shortening of the manufacturing process of the liquid crystal display device and an improvement of the productivity.

The transistor described in the above embodiment can be applied to the transistor 751. In FIG. 38B, a transistor having a structure similar to that of the transistor illustrated in FIGS. 18A to 18D is exemplified.

The off-state current of the transistor 751 can be made extremely small. Therefore, charge retained in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided.

An insulating film 721 is provided over the transistor 751 and the capacitor 752. Here, an opening reaching the drain electrode 316b of the transistor 751 is provided in the insulating film 721 and the protective insulating film 318.

An electrode 791 is provided over the insulating film 721. The electrode 791 is in contact with the drain electrode 316b of the transistor 751 through the opening provided in the insulating film 721 and the protective insulating film 318.

An insulating film 792 which functions as an alignment film is provided over the electrode 791. A liquid crystal layer 793 is provided over the insulating film 792. An insulating film 794 which functions as an alignment film is provided over the liquid crystal layer 793. A spacer 795 is provided over the insulating film 794. An electrode 796 is provided over the spacer 795 and the insulating film 794. A substrate 797 is provided over the electrode 796.

<Installation Example>

Figure 36A:
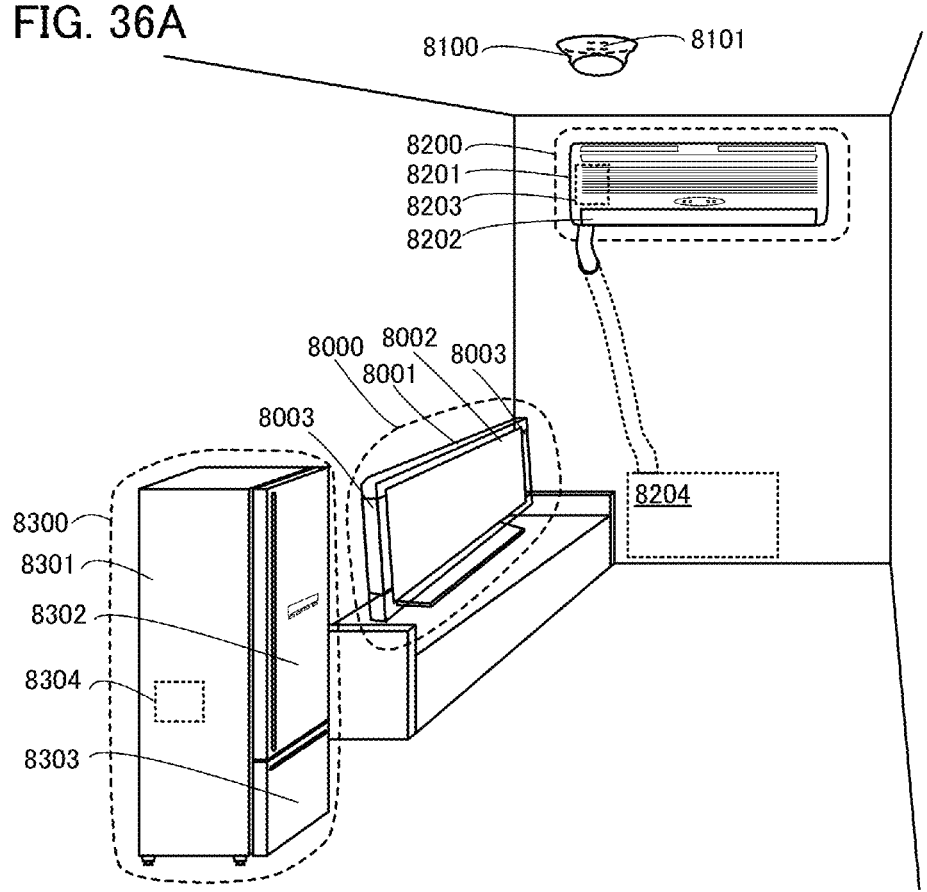
FIGS. 36A to 36C illustrate examples of electronic devices in accordance with one embodiment of the present invention.

In a television set 8000 in FIG. 36A, a display portion 8002 is incorporated in a housing 8001. The display portion 8002 displays an image and a speaker portion 8003 can output sound. The display device as described above can be used for the display portion 8002.

The television set 8000 may be provided with a receiver, a modem, and the like. With the receiver, the television device 8000 can receive general television broadcasting. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The memory or the CPU described in the above embodiment can be used for the television set 8000.

In FIG. 36A, an alarm device 8100 is a residential fire alarm, which includes a sensor portion and a microcomputer 8101. The microcomputer 8101 includes a CPU in which any of the above transistors is used.

In FIG. 36A, a CPU that uses the above-described transistor is included in an air conditioner which includes an indoor unit 8200 and an outdoor unit 8204. Specifically, the indoor unit 8200 includes a housing 8201, an air outlet 8202, a CPU 8203, and the like. Although the CPU 8203 is provided in the indoor unit 8200 in FIG. 36A, the CPU 8203 may be provided in the outdoor unit 8204. Alternatively, the CPU 8203 may be provided in both the indoor unit 8200 and the outdoor unit 8204. A CPU that uses any of the above transistors can contribute to the power-saving of the air conditioner.

In FIG. 36A, a CPU that uses any of the above transistors is included in an electric refrigerator-freezer 8300. Specifically, the electric refrigerator-freezer 8300 includes a housing 8301, a door for a refrigerator 8302, a door for a freezer 8303, a CPU 8304, and the like. The CPU 8304 is provided in the housing 8301 in FIG. 36A. A CPU that uses any of the above transistors can save contribute to the power-saving of the electric refrigerator-freezer 8300.

Figure 36B:
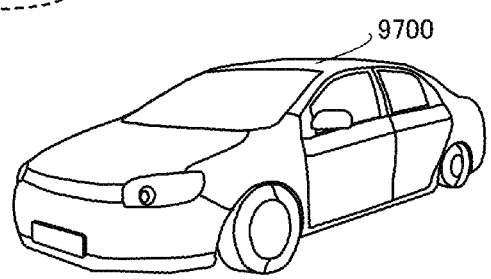
Figure 36C:
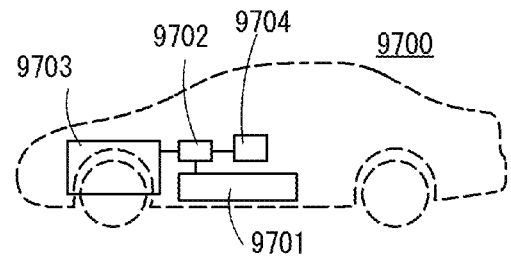

FIGS. 36B and 36C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. A CPU that uses any of the above transistors can contribute to the power-saving of the electric vehicle 9700.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment shows an example of a basic principle. Thus, part of this embodiment can be freely combined with, applied to, or replaced with other parts of this embodiment.

This application is based on Japanese Patent Application Serial No. 2013-016245 filed with Japan Patent Office on Jan. 30, 2013, and Japanese Patent Application Serial No. 2013-128584 filed with Japan Patent Office on Jun. 19, 2013, the entire contents of which are hereby incorporated by reference.

What is claimed is:

1. A method for processing an oxide semiconductor layer containing indium, wherein the oxide semiconductor layer comprises a plurality of excess oxygen, a first oxygen vacancy that is adjacent to a first indium and captures a first hydrogen, and a second oxygen vacancy that is adjacent to a second indium and captures a second hydrogen, the method comprising:
making the first hydrogen captured by the first oxygen vacancy into a hydroxyl by bonding one of the plurality of excess oxygen to the first hydrogen;
releasing the second hydrogen captured by the second oxygen vacancy as water by bonding the hydroxyl to the second hydrogen; and
after releasing the second hydrogen captured by the second oxygen vacancy as water, bonding one of the plurality of excess oxygen to the first indium and bonding one of the plurality of excess oxygen to the second indium,
wherein the oxide semiconductor layer comprises nanocrystal.

2. A method for manufacturing a semiconductor device, comprising:
forming an oxide semiconductor layer containing indium processed by the method for processing an oxide semiconductor layer containing indium according to claim 1; and
forming a gate electrode overlapping with the oxide semiconductor layer.

3. The method for processing an oxide semiconductor layer containing indium, according to claim 1, wherein the plurality of excess oxygen is capable of moving inside the oxide semiconductor layer.

4. The method for processing an oxide semiconductor layer containing indium, according to claim 1, wherein the plurality of excess oxygen is capable of moving between atoms in the oxide semiconductor layer.

5. The method for processing an oxide semiconductor layer containing indium, according to claim 1, wherein the plurality of excess oxygen is capable of replacing oxygen that is a constituent of the oxide semiconductor layer and moving like a billiard ball.

6. The method for processing an oxide semiconductor layer containing indium, according to claim 1, wherein a concentration of hydrogen in the oxide semiconductor layer, which is measured by secondary ion mass spectrometry, is lower than or equal to $2 \times 10^{20}$ atoms/cm$^3$.

7. The method for processing an oxide semiconductor layer containing indium, according to claim 1, wherein the oxide semiconductor layer contains gallium and zinc.

8. A semiconductor device comprising:
a transistor, wherein the transistor comprises:
an oxide semiconductor layer containing indium processed by the method for processing an oxide semiconductor layer containing indium according to claim 1; and
a gate electrode overlapping with the oxide semiconductor layer,
wherein a concentration of hydrogen in the oxide semiconductor layer, which is measured by secondary ion mass spectrometry, is lower than or equal to $2\times10^{20}$ atoms/cm$^3$.

9. The semiconductor device according to claim 8, wherein the oxide semiconductor layer contains gallium and zinc.

10. The semiconductor device according to claim 8, wherein the transistor comprises:
an oxide layer over the oxide semiconductor layer,
wherein the oxide layer contains one or more kinds of elements other than oxygen constituting the oxide semiconductor layer,
wherein the gate electrode is provided over the oxide layer, and
wherein the gate electrode extends in a channel width direction of the transistor so that the gate electrode faces to a side surface of the oxide semiconductor layer.

11. A method for processing an oxide semiconductor layer containing indium, wherein an insulating film comprising a plurality of excess oxygen is provided in the vicinity of the oxide semiconductor layer, wherein the oxide semiconductor layer comprises a first oxygen vacancy that is adjacent to a first indium and captures a first hydrogen, and a second oxygen vacancy that is adjacent to a second indium and captures a second hydrogen, the method comprising:
moving the plurality of excess oxygen to the oxide semiconductor layer from the insulating film;
making the first hydrogen captured by the first oxygen vacancy into a hydroxyl by bonding one of, the plurality of excess oxygen to the first hydrogen;
releasing the second hydrogen captured by the second oxygen vacancy as water by bonding the hydroxyl to the second hydrogen; and
after releasing the second hydrogen captured by the second oxygen vacancy as water, bonding one of the plurality of excess oxygen to the first indium and bonding one of the plurality of excess oxygen to the second indium,
wherein the oxide semiconductor layer comprises nanocrystal.

12. A method for manufacturing a semiconductor device, comprising:
forming an oxide semiconductor layer containing indium processed by the method for processing an oxide semiconductor layer containing indium according to claim 11; and
forming a gate electrode overlapping with the oxide semiconductor layer.

13. The method for processing an oxide semiconductor layer containing indium, according to claim 11, wherein the plurality of excess oxygen is capable of moving inside the oxide semiconductor layer.

14. The method for processing an oxide semiconductor layer containing indium, according to claim 11, wherein the plurality of excess oxygen is capable of moving between atoms in the oxide semiconductor layer.

15. The method for processing an oxide semiconductor layer containing indium, according to claim 11, wherein the plurality of excess oxygen is capable of replacing oxygen that is a constituent of the oxide semiconductor layer and moving like a billiard ball.

16. The method for processing an oxide semiconductor layer containing indium, according to claim 11, wherein a concentration of hydrogen in the oxide semiconductor layer, which is measured by secondary ion mass spectrometry, is lower than or equal to $2\times10^{20}$ atoms/cm$^3$.

17. The method for processing an oxide semiconductor layer containing indium, according to claim 11, wherein the oxide semiconductor layer contains gallium and zinc.

18. A semiconductor device comprising:
a transistor, wherein the transistor comprises:
an oxide semiconductor layer containing indium processed by the method for processing an oxide semiconductor layer containing indium according to claim 11; and
a gate electrode overlapping with the oxide semiconductor layer,
wherein a concentration of hydrogen in the oxide semiconductor layer, which is measured by secondary ion mass spectrometry, is lower than or equal to $2\times10^{20}$ atoms/cm$^3$.

19. The semiconductor device according to claim 18, wherein the oxide semiconductor layer contains gallium and zinc.

20. The semiconductor device according to claim 18, wherein the transistor comprises:
an oxide layer over the oxide semiconductor layer,
wherein the oxide layer contains one or more kinds of elements other than oxygen constituting the oxide semiconductor layer,
wherein the gate electrode is provided over the oxide layer, and
wherein the gate electrode extends in a channel width direction of the transistor so that the gate electrode faces to a side surface of the oxide semiconductor layer.

* * * * *